United States Patent [19]
Trimberger et al.

[11] Patent Number: 5,978,260
[45] Date of Patent: Nov. 2, 1999

[54] METHOD OF TIME MULTIPLEXING A PROGRAMMABLE LOGIC DEVICE

[75] Inventors: Stephen M. Trimberger, San Jose; Richard A. Carberry, Los Gatos; Robert Anders Johnson, San Jose; Jennifer Wong, Fremont, all of Calif.

[73] Assignee: Xilinx, Inc., San Jose, Calif.

[21] Appl. No.: 09/119,534

[22] Filed: Jul. 20, 1998

Related U.S. Application Data

[63] Continuation of application No. 08/516,808, Aug. 18, 1995, Pat. No. 5,784,313.

[51] Int. Cl.$^6$ .................................................... G11C 13/00
[52] U.S. Cl. ..................................... 365/182; 365/189.01
[58] Field of Search ............................ 365/182, 189.01, 365/230.01

[56] References Cited

U.S. PATENT DOCUMENTS

| | | | |
|---|---|---|---|
| 3,775,756 | 11/1973 | Balser | 340/172.5 |
| 4,189,782 | 2/1980 | Dingwezc | 365/156 |

(List continued on next page.)

FOREIGN PATENT DOCUMENTS

| | | |
|---|---|---|
| 0410759 A2 | 7/1990 | European Pat. Off. . |
| 53-121537 | 10/1978 | Japan . |
| WO94/28475 | 5/1994 | WIPO . |
| WO95/22205 | 2/1995 | WIPO . |

OTHER PUBLICATIONS

"The Programmable Logic Data Book" copyright 1994, Xilinx, Inc., 2100 Logic Drive, San Jose, CA 95124.

"Principles of CMOS VSLI Design, A Systems Perspective", N. Weste & K. Eshraghian, Addison–Wesley Publishing Company, 1988, pp. 160–164.

Paper presented at IEEE Workshop on FPGA's for Custom Computing Machines, FCCM '93, Apr. 1993 entitled "Virtual Wires: Overcoming Pin Limitations In FPGA–based Logic Emulators", Jonathan Babb, et al. Jan. 26, 1993, pp 1–15.

Narasimha B. Bhat, Kamal Chaudhary, and Ernest S. Kuh, "Performance–Oriented Fully Routable Dynamic Architecture for a Field Programmable Logic Device", Electronic Research Laboratory, College of Engineering, University of California, Berkeley, Jun. 1, 1993.

Andre DeHon, "DPGA–Coupled Microprocessors: Commodity ICs for the Early 21st Century", NE43–791, 545 Technology Square, Cambridge, MA 02139, 10 pages, Jan. 6, 1994.

(List continued on next page.)

*Primary Examiner*—Terrell W. Fears
*Attorney, Agent, or Firm*—E. Eric Hoffman; Bever & Hoffman; Jeanette S. Harms

[57] ABSTRACT

A programmable logic device (PLD) comprises at least one configurable element, and a plurality of programmable logic elements for configuring the configurable element(s). Alternatively, a PLD comprises an interconnect structure and a plurality of programmable logic elements for configuring the interconnect structure. In either embodiment, at least one of the programmable logic elements includes N memory cells. A predetermined one of the N memory cells forms part of a memory slice, wherein at least a portion of each slice of the programmable logic device is allocated to either configuration data or user data memory. Typically, one memory slice provides one configuration of the programmable logic device. In accordance with one embodiment, a memory access port is coupled between at least one of the N memory cells and either one configurable element or the interconnect, thereby facilitating loading of new configuration data into other memory slices during the one configuration. The new configuration data may include off-chip or on-chip data. The present invention typically allocates at least one slice to user data memory and includes means for disabling access to at least one of the N memory cells.

56 Claims, 61 Drawing Sheets

U.S. PATENT DOCUMENTS

| | | | |
|---|---|---|---|
| 4,237,545 | 12/1980 | Deglin et al. | 364/900 |
| 4,288,658 | 9/1981 | Bieber et al. | 178/3 |
| 4,434,461 | 2/1984 | Puhl | 364/200 |
| 4,594,661 | 6/1986 | Moore et al. | 364/200 |
| 4,661,901 | 4/1987 | Veneski | 364/200 |
| 4,706,216 | 11/1987 | Carter | 365/94 |
| 4,750,155 | 6/1988 | Hsieh | 365/203 |
| 4,821,233 | 4/1989 | Hsieh | 365/203 |
| 5,019,996 | 5/1991 | Lee | 364/483 |
| 5,042,004 | 8/1991 | Agrawal et al. | 364/900 |
| 5,081,375 | 1/1992 | Pickett et al. | 326/41 |
| 5,144,242 | 9/1992 | Zeilenga et al. | 324/312 |
| 5,155,389 | 10/1992 | Furtek | 307/465 |
| 5,155,390 | 10/1992 | Hickman et al. | 326/30 X |
| 5,185,706 | 2/1993 | Agrawal et al. | 364/489 |
| 5,224,056 | 6/1993 | Chene et al. | 364/490 |
| 5,245,227 | 9/1993 | Furtek et al. | 307/465 |
| 5,280,202 | 1/1994 | Chan et al. | 365/94 |
| 5,349,248 | 9/1994 | Parlour et al. | 326/38 |
| 5,377,331 | 12/1994 | Drerup et al. | 395/325 |
| 5,426,378 | 6/1995 | Ong | 326/39 |
| 5,426,738 | 6/1995 | Hsieh et al. | 395/275 |
| 5,426,744 | 6/1995 | Sawase et al. | 395/375 |
| 5,432,388 | 7/1995 | Crafts et al. | 326/40 |
| 5,469,368 | 11/1995 | Agrawal et al. | 326/39 |
| 5,469,577 | 11/1995 | Eng et al. | 325/290 |
| 5,513,124 | 4/1996 | Trimberger et al. | 364/491 |
| 5,521,835 | 5/1996 | Trimberger | 364/489 |
| 5,526,276 | 6/1996 | Cox et al. | 364/489 |
| 5,530,654 | 6/1996 | Takahashi | 364/488 |
| 5,553,002 | 9/1996 | Dangelo et al. | 364/489 |
| 5,583,450 | 12/1996 | Trimberger et al. | 326/41 |
| 5,600,263 | 2/1997 | Trimberger et al. | 326/39 |
| 5,629,637 | 5/1997 | Trimberger et al. | 326/93 |
| 5,646,545 | 7/1997 | Trimberger et al. | 326/38 |
| 5,701,441 | 12/1997 | Trimberger et al. | 395/500 |
| 5,784,313 | 7/1998 | Trimberger et al. | 365/182 |

OTHER PUBLICATIONS

Chi–Yuan Chin, et al., "A Dynamically Reconfigurable Interconnection Chip" Session XX: Special Purpose Accelerators; IEEE International Solid State Circuits Conference, pp. 276–277, 425, Feb. 27, 1987.

Laung–Terng Wang, et al. "SSIM: A Software Levelized Compiled–Code Simulator", 24th ACM/IEEE Design Automation Conference, 1987, Paper 2.1, pp 2–8.

Randal E. Bryant, et al. "COSMOS: A Compiled Simulator for MOS Ciruits", 24th ACM/IEEE Design Automation Conference, 1987, Paper 2.2, pp 9–16.

Peter M. Maurer, "Scheduling Blocks of Hierarchical Compiled Simulation of Combinational Circuits", IEEE Transactions on Computer–Aided Design, vol. 10, No. 2, Feb. 1991, pp 184–192.

David M. Lewis, "Hierarchical Compiled Event–Driven Logic Simulation", Department of Electrical Engineering, University of Toronto, IEEE, 1989, pp 498–501.

Trimberger, Stephan M., "A Reprogrammable Gate Array and Applications," Proceedings of the IEEE, vol. 81, No. 7, Jul. 1993, pp. 1030–1041.

Trimberger, Stephen M. and Chene, Mon–Ren, "Placement–Based Partitiioning for Lookup–Table–Based FPGAs," IEEE, Computer Design–ICCD '92, 1992 International Conference, pp. 91–94.

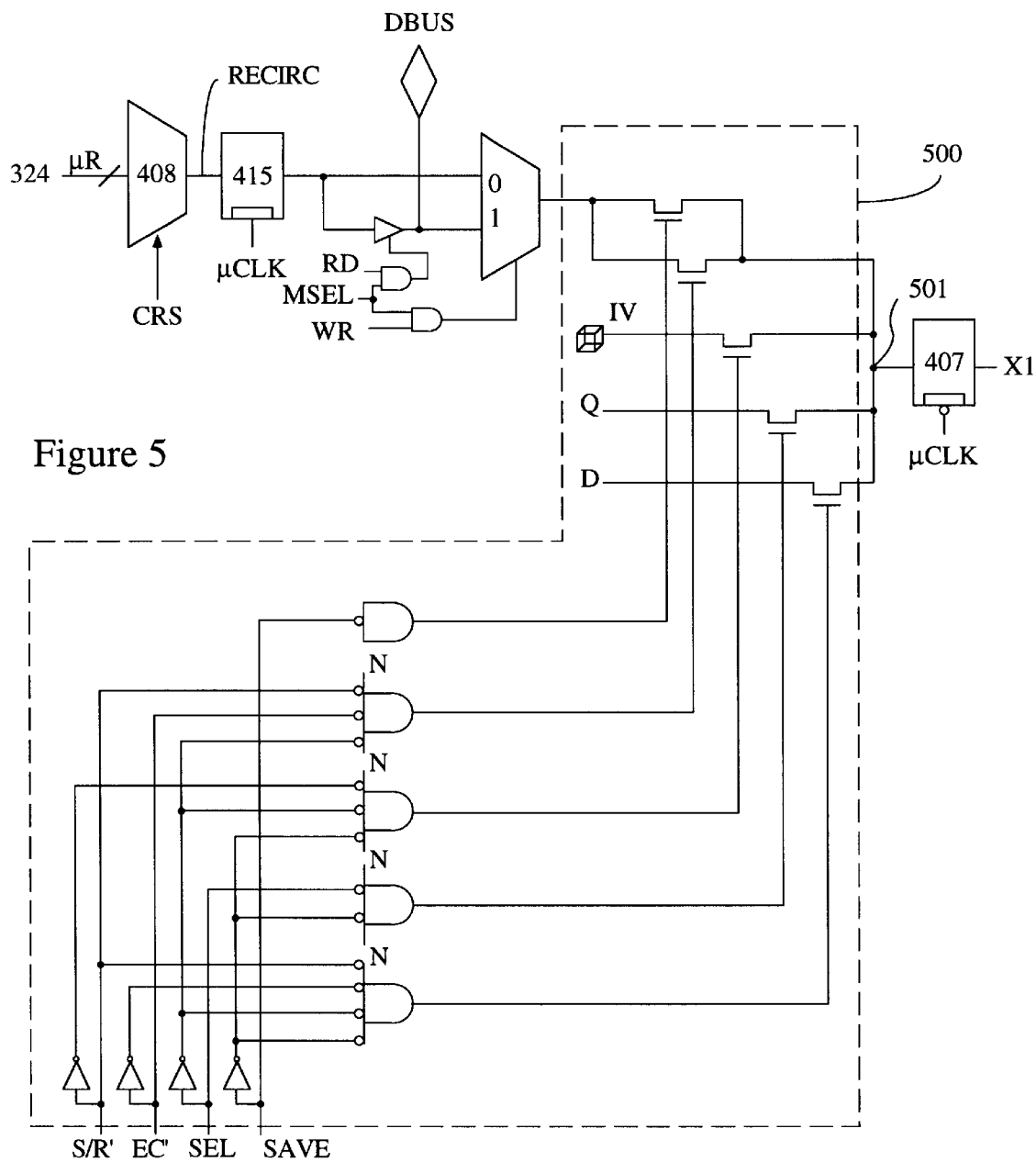

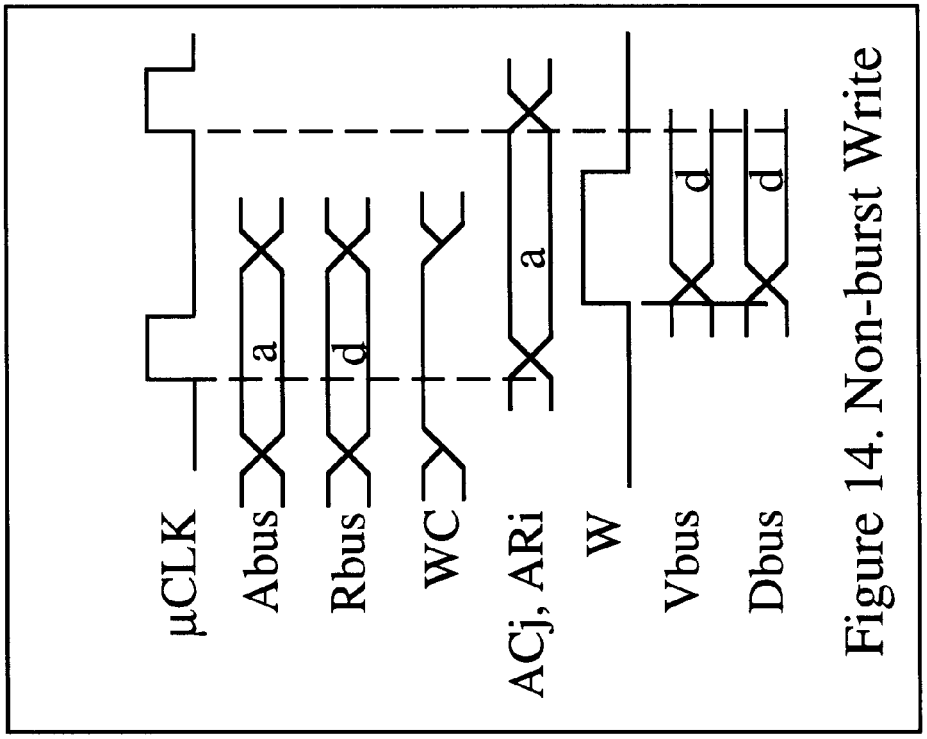
Figure 14. Non-burst Write
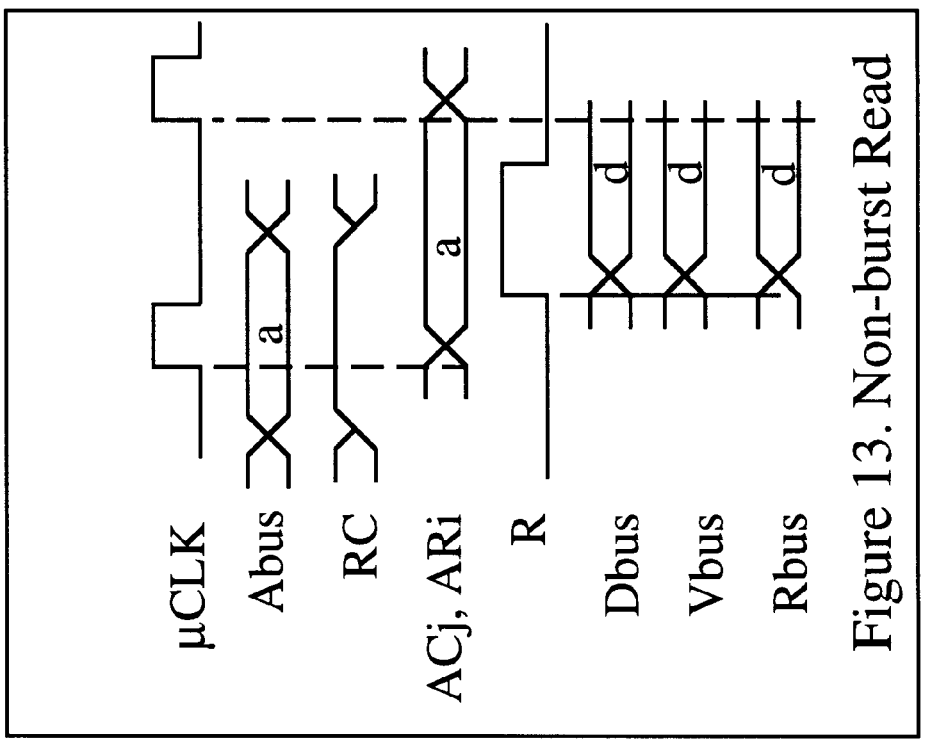
Figure 13. Non-burst Read

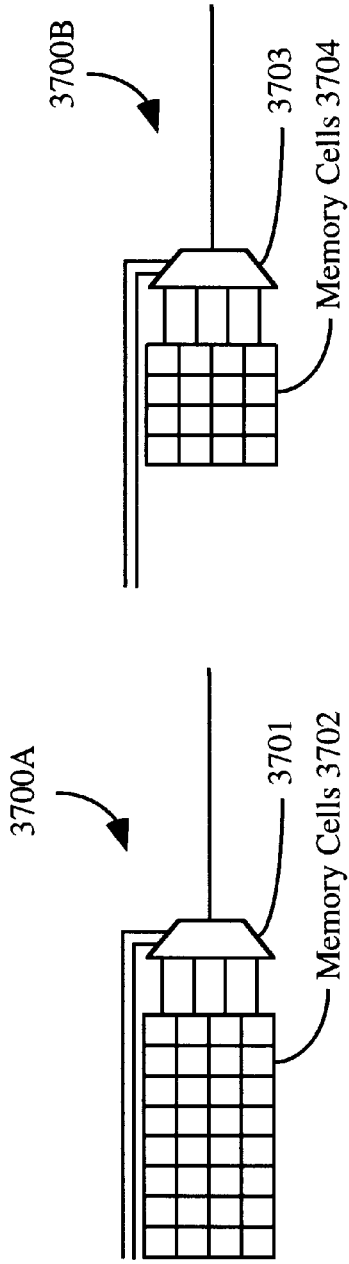
Figure 37A
Figure 37B
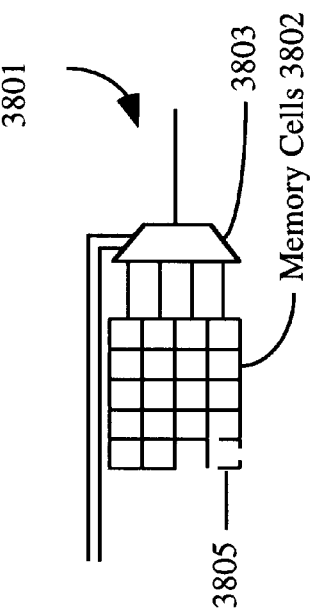
Figure 38

```
PROCESS 1(5):

loop {
    wait (posedge Ca);
    sample (i2:=I2 & i3:=I3);
    01:=4212 & 4213:=f1(i2,I1) & 4211:=f2(i3, 4212);
    4212:=f3(4211,4213) & 4214:=f4(4213,o2);
}

PROCESS 2(5):

loop {
    wait (posedge Cb);
    4214:=f4(4213,o2) & 02:=4214 & o2:=02);
}

PROCESS 3(5):

loop {
    wait(change I1);
    4213:=f1(i2,I1);
    4214:=f4(4213,o2) & 4212:=f3(4211,4213).
}
```

```
PROCESS 1(5) :  4211<4212; 4213<4212; 4213<4214;
        i3<4211; i2<4213; 4212≥4211; and 4212≥O1.

PROCESS 2(5) :  4214≥O2; and o2≥4214.

PROCESS 3(5) :  4213<4214;
        4213<4212.
```

```
PROCESS 1(6):

loop {
      wait(posedge Ca);
      sample(i1a:=I1 & i2:=I2 & i3:=I3);
      4213a:=f1(i2a,i1a) & i2a:=i2;
      4212=f3(4211,4213a)
      O1:=4212 & 4211:=f2(i3,4212);
}

PROCESS 2(6):

loop {
      wait(posedge Cb);
      sample(i1b:=I1)
      4213B:=f1(i2,i1b) & i2b:=i2;
      4214:=f4(4213B,o2) & o2:=4214;
      O2:=4214
}
```

PROCESS 1(6) :  4212<4211; 4213A<4212; i2a≥4213A;

i3<4211; i2<i2a; i1a<4213A; and 4212<O1.

PROCESS 2(6) :  i2b≥4213B; i1b<4213B; 4213B<4214;
   4214<O2; o2≥4214; and 4214≥o2.

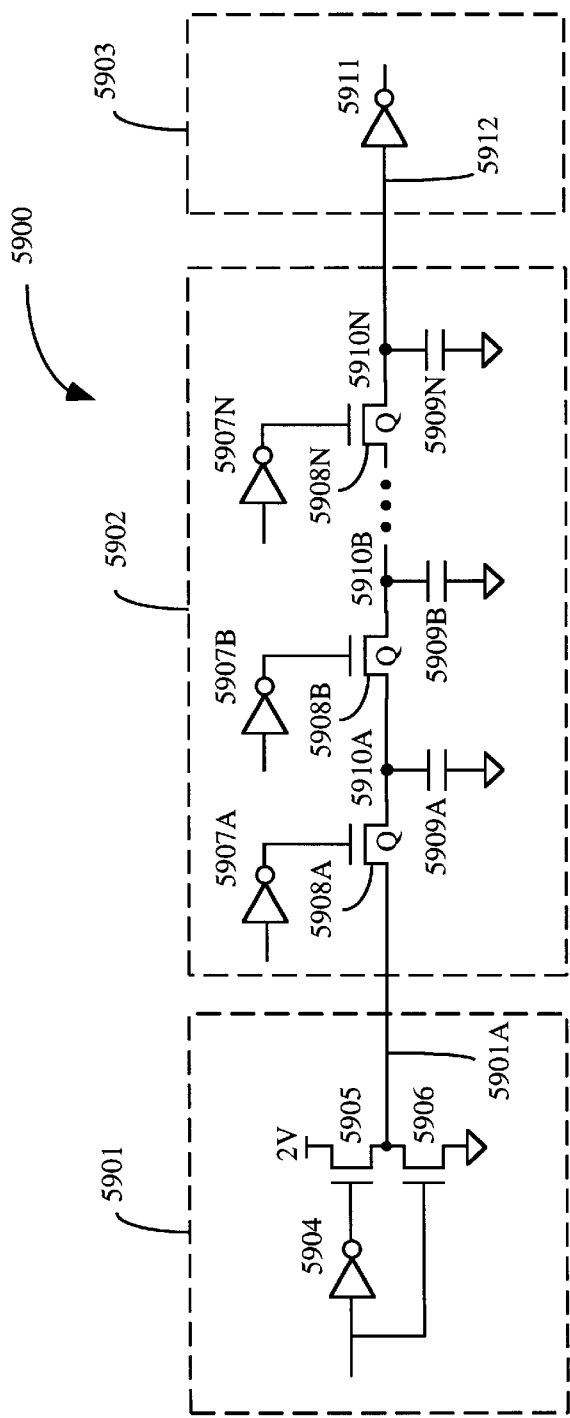
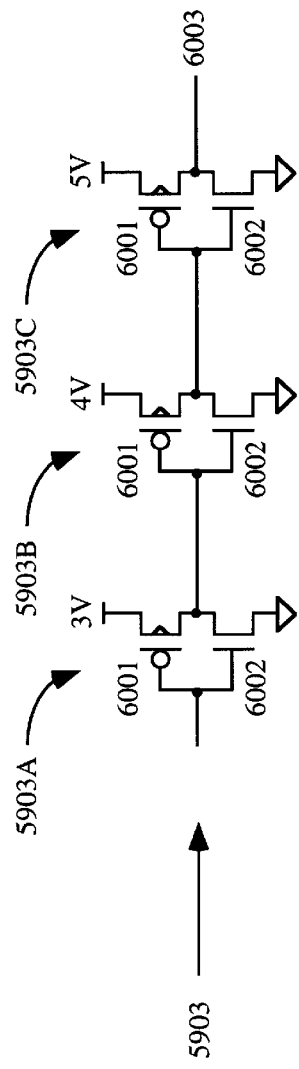
Figure 59
Figure 60

| | OUTPUT MUX | | | | | | | |
|---|---|---|---|---|---|---|---|---|
| MUX INPUT | 313 | 314 | 315 | 316 | 317 | 318 | 319 | 320 |
| SBYP0 | F | F | Q1 | Q1 | G | G | Q2 | Q2 |
| SBYP1 | H | H | DIN | DIN | H | H | ENCK | ENCK |
| IN | X1 | X1 | X1 | X1 | X2 | X2 | X2 | X2 |

| A[3:0] | OUT |
|---|---|
| 1rrr | uR[r] (latched) |
| 01xx | RBYP (latched) |
| 001x | SBYP1 |
| 000x | SBYP0 |

METHOD OF TIME MULTIPLEXING A PROGRAMMABLE LOGIC DEVICE

RELATED APPLICATION

This application is a continuation of U.S. Ser. No. 8,516,808, filed Aug. 18, 1995, now U.S. Pat. No. 5,784,313 entitled "A Programmable Logic Device Including Configuration Data of User Data Memory Slices" issued Jul. 21, 1998, which is incorporated herein by reference.

BACKGROUND OF THE INVENTION

1. Field of the Invention

This invention relates generally to a programmable logic device, and in particular to a field programmable gate array in which the configurable logic blocks and the programmable routing matrices are reconfigured dynamically.

2. Description of Related Art

Programmable logic devices such as field programmable gate arrays ("FPGAs") are a well known type of integrated circuit and are of wide applicability due to the flexibility provided by their reprogrammable nature. An FPGA typically includes an array of configurable logic blocks (CLBs) that are programmably interconnected to each other to provide logic functions desired by a user (a circuit designer). An FPGA typically includes a regular array of identical CLBs, wherein each CLB is individually programmed to perform any one of a number of different logic functions. The FPGA has a configurable routing structure for interconnecting the CLBs according to the desired user circuit design. The FPGA also includes a number of configuration memory cells which are coupled to the CLBs to specify the function to be performed by each CLB, as well as to the configurable routing structure to specify the coupling of the input and output lines of each CLB. The FPGA may also include data storage memory cells accessible by a user during operation of the FPGA. However, unless specified otherwise, the term memory cells refers to the configuration memory cells. The Xilinx, Inc. 1994 publication entitled "The Programmable Logic Data Book" describes several FPGA products and is herein incorporated by reference in its entirety.

One approach available in the prior art to increase the complexity and size of logic circuits has been coupling multiple FPGAs (i.e. multiple chips) by external connections. However, due to the limited number of input/output connections, i.e. pins, between the FPGAs, not all circuits can be implemented using this approach. Moreover, using more than one FPGA undesirably increases power consumption, cost, and space to implement the user circuit design.

Another known solution has been increasing the number of CLBs and interconnect structures in the FPGA. However, for any given semiconductor fabrication technology, there are limitations to the number of CLBs that can be fabricated on an integrated circuit chip of practical size. Thus, there continues to be a need to increase the number of logic gates or CLB densities for FPGAs.

Reconfiguring an FPGA to perform different logic functions at different times is known in the art. However, this reconfiguration requires the time consuming step of reloading a configuration bit stream for each reconfiguration. Moreover, reconfiguration of a prior art FPGA generally requires suspending the implementation of the logic functions, saving the current state of the logic functions in a memory device external to the FPGA, reloading the entire array of memory configurations cells, and inputting the states of the logic functions which have been saved off chip along with any other needed inputs. Each of these steps requires a significant amount of time, thereby rendering reconfiguration impractical for implementing typical circuits.

SUMMARY OF THE INVENTION

In accordance with the present invention, a programmable logic device (PLD) comprises at least one configurable element, and a plurality of programmable logic elements for configuring the configurable element(s), wherein at least one of the programmable logic elements includes N memory cells. A predetermined one of the N memory cells forms part of a memory slice, wherein at least a portion of each slice of the programmable logic device is allocated to either configuration data or user data memory. Typically, one memory slice provides one configuration of the programmable logic device.

The PLD switches between configurations sequentially, by random access, or on command from an external or internal signal. This switching is called "flash reconfiguration". Flash reconfiguration allows the PLD to function in one of N configurations. In this manner, a PLD with a number M of actual configurable elements, such as configurable logic blocks (CLBs), functions as if it includes M times N effective CLBs. Thus, assuming eight configurations, the PLD implements eight times the amount of logic that it actually contains by including the additional configuration memory. By using flash reconfiguration, the CLBs of the present invention are advantageously reused dynamically, thereby reducing the number of physical CLBs needed to implement a given number of logic functions in a particular user's circuit design by the factor of the number of configurations.

In accordance with another embodiment of the present invention, a programmable logic device comprises an interconnect structure and a plurality of programmable logic elements for configuring the interconnect structure, wherein at least one of the programmable logic elements includes N memory cells. A predetermined one of the N memory cells forms part of a memory slice, wherein at least a portion of each slice is allocated to either configuration data or user data memory.

In accordance with one embodiment of the present invention, a memory access port is coupled between at least one of the N memory cells and either one configurable element or the interconnect, thereby facilitating loading of new configuration data into other memory slices during the one configuration. The new configuration data may include off-chip or on-chip data. In one embodiment, the device further includes a storage device for storing a plurality of intermediate states of one configurable element. The present invention typically allocates at least one slice to user data memory and includes means for disabling access to at least one of the N memory cells.

BRIEF DESCRIPTION OF THE DRAWINGS

FIG. 5 illustrates a more detailed diagram of a portion of the CLB of FIG. 4.

FIG. 6 shows a truth table for the circuitry of FIG. 5.

FIG. 13 illustrates word READ timing for the shared memory.

FIG. 14 shows word WRITE timing for the shared memory.

FIG. 35 shows all CLBs having a different configuration for each memory cycle.

FIG. 36 shows some CLBs not having a configuration for certain micro cycles.

FIGS. 37A and 37B illustrates two variable depth time multiplexed CLBs.

FIG. 38 shows a CLB with different numbers of micro cycles for different inputs.

FIGS. 46 and 47 illustrate pseudo-code translations of the circuits of FIGS. 42 and 45, respectively.

FIG. 48 and 49 show scheduling constraints used in conjunction with the pseudo-code translations of FIGS. 46 and 47, respectively.

FIG. 59 shows a portion of a PLD including interconnect.

FIG. 60 illustrates an inverter for use in the PLD of FIG. 59.

DETAILED DESCRIPTION OF THE DRAWINGS

The detailed description is divided into topical sections which are organized according to the following Table of Contents.

Table Of Contents Of Detailed Description

| | |
|---|---|
| 1.0 | Terminology |
| 2.0 | Logic Array Architecture |
| 2.1 | Micro Registers |
| 2.1a | Micro Register Location |
| 2.2 | Bus Hierarchy |
| 3.0 | Power Conservation |
| 4.0 | Shared Memory |
| 5.0 | Chip Layout |
| 6.0 | Reconfiguration |
| 7.0 | Single clock sequencer |
| 7.1 | Configuration Sequencing |
| 7.2 | Configuration Duration |
| 7.3 | Micro cycle Generation for a Synchronous FPGA |
| 8.0 | Modes of Operation |
| 8.1 | Time-Share Mode |
| 8.2 | Logic Engine Mode |
| 8.2a | Synchronous/ Asynchronous Clocking |
| 8.2b | Controller for Logic Engine Mode |
| 8.2c | The Scheduler |
| 8.2d | Scheduling Compression |
| 8.2e | Simultaneous Scheduling and Placement |
| 8.2f | Logic Engine Input and Output Signals |
| 8.3 | Static Mode |
| 8.4 | Mixed Mode |
| 9.0 | Miscellaneous |
| 9.1 | Variable Depth CLBs |
| 9.2 | Micro cycle Interrupt Simulation |
| 9.3 | Micro Register Alternatives |
| 9.4 | Alternatives for Deeper Logic |
| 9.5 | Per-CLB Memory Access Config Bit |
| 9.6 | Micro Register Selector Options |
| 9.7 | Low Power Interconnect Circuitry |
| 9.8 | Multiple Access for Configuration |
| 9.9 | Pipelining Features Mode |
| 9.10 | Incorporation of ROM Cells |

1.0 Terminology

Three types of data (implying three types of memory or storage) are discussed herein: configuration data, user data, and state data. Configuration data determines the configuration of the logic blocks or interconnect when the data is provided to those logic blocks or interconnect. User data is data typically generated by the user logic and stored/retrieved in memory that could otherwise be used for configuration data storage. State data is data defining the logical values of nodes in user logic at any specific time. Typically, state data is stored if the values at the nodes are needed at a later time. The term "state" is used to refer to either all of the node values at a particular time, or a subset of those values.

2.0 Logic Array Architecture

Figure 1:
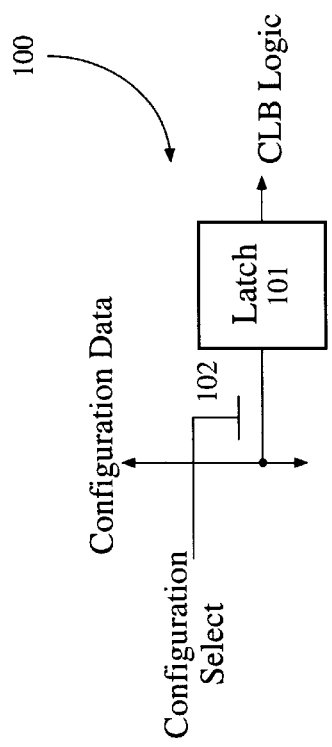
FIG. 1 illustrates a prior art FPGA configuration bit.

One prior art FPGA, for example one device of the Xilinx XC4000™ family of FPGAs which is commercially available from Xilinx, Inc., includes one configuration memory cell to control each programming point. As shown in FIG. 1, a conventional latch 101 (i.e. a four transistor device) plus a select transistor 102 compromise a five transistor (5T) memory cell 100 which forms the basic unit of control for all logic functions on the FPGA chip. U.S. Pat. No. 4,821,233 which issued on Apr. 11, 1989, and U.S. Pat. No. 4,750,155, which issued on Jun. 7, 1988, discuss the configuration of this 5T memory cell in detail and are incorporated by reference herein.

Figure 2:
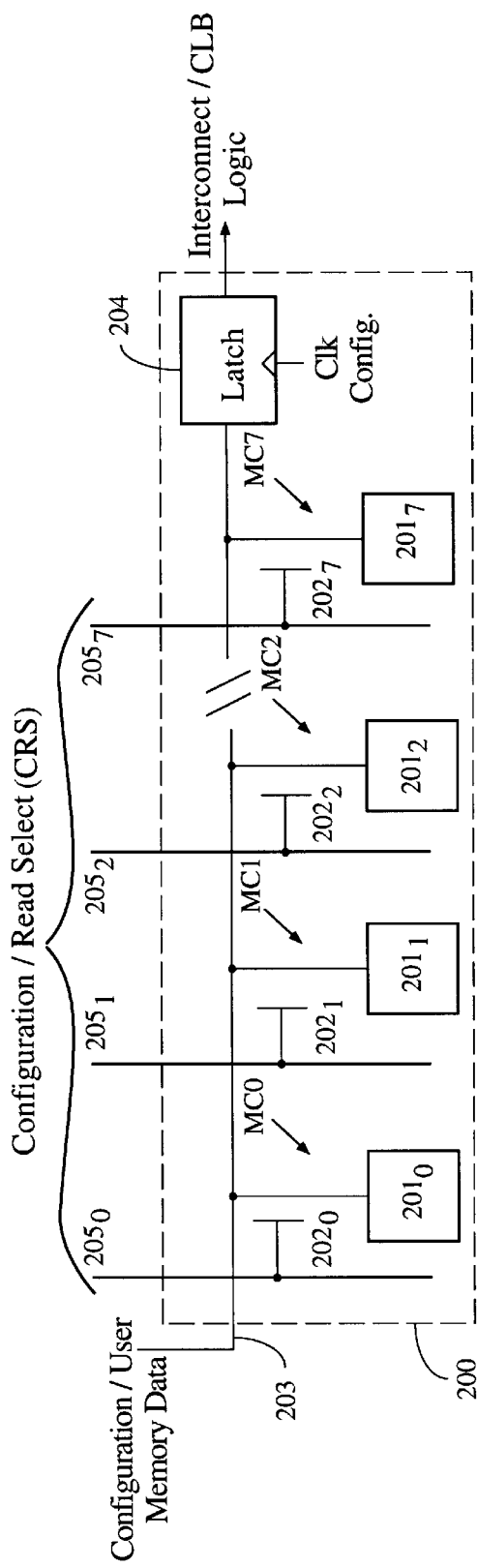
FIG. 2 shows a configuration bit-slice in accordance with the invention.

In accordance with the present invention and referring to FIG. 2, each memory cell 100 (FIG. 1) is replaced with a random access memory (RAM) bit set 200. Bit set 200 includes eight memory cells MC0–MC7. Each memory cell MC has a latch 201 and an associated select transistor 202. Memory cells MC0–MC7 are coupled to a common bit line 203 which provides signals to a clocked latch 204. In another embodiment, memory cells MC0–MC7 are conventional six transistor (6T) memory cells which are well known in the art and therefore, not described in detail herein. All configuration bits at the same location, (for example, the third configuration bit stored by latch $201_2$ by memory cell MC2) in different bit sets are considered to be in a single "slice" of memory, corresponding to a single configuration of the array.

The additional configuration memory cells increase logic density by dynamic re-use of the FPGA circuitry. Specifically, CLBs and interconnect are configured to perform some defined task at one instant and are reconfigured to perform another task at another instant. Thus, by providing a bit set for each prior FPGA programming point, an FPGA in the present invention "holds" eight times the amount of logic of the prior art FPGA. By reconfiguring the CLBs, the number of function generators in the CLB, typically conventional look up tables ("real LUTs"), needed to implement a given number of LUTs in a user circuit ("virtual LUTs") are reduced by a factor of the number of configurations.

Figure 3:
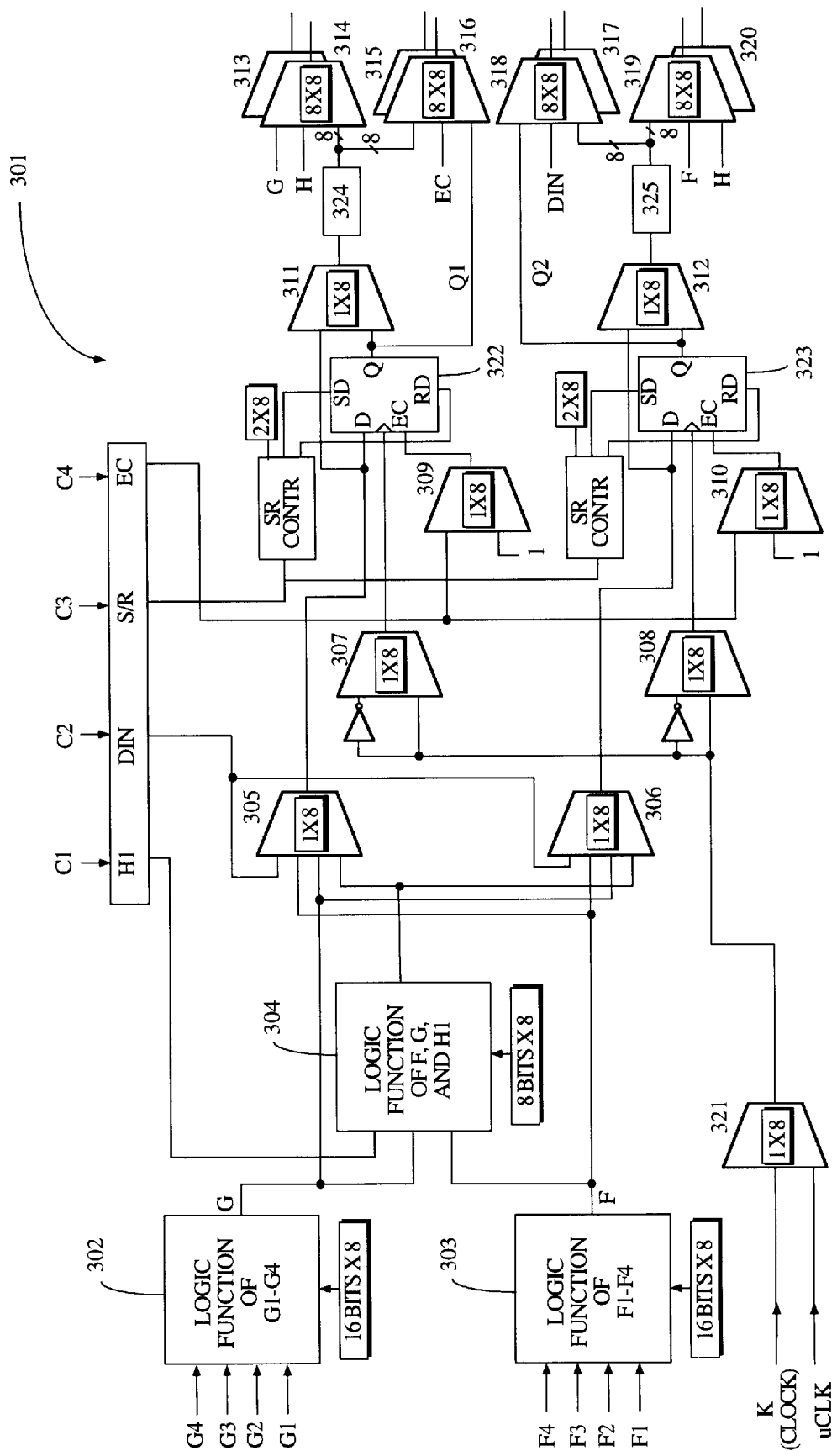
FIG. 3 illustrates a block diagram of a time-multiplexed CLB.

FIG. 3 illustrates a block diagram of one embodiment of a CLB 301 in accordance with the present invention. In this embodiment, CLB 301 includes 320 programming points, each point requiring one bit of configuration data, wherein each bit includes an 8-bit memory. For example, G logic function generator 302 is configured by 128 bits (16 bits×8). The configuration bits which control logic function generators 302, 303, and 304, the plurality of multiplexers 305–321, and SR Control are shown as shadowed boxes which represent the eight bit memory set "behind" each of the bits within the configuration word. For clarity, FIG. 3 does not show the switch box and the connection boxes and their associated configuration bits, wherein each programming point in these boxes also includes an 8 bit memory.

During operation, all values in the same slice are read out simultaneously to update the configuration of the CLBs and interconnect on the chip, thereby causing the CLBs to perform different logical functions and the interconnect to make different connections.

2.1 Micro Registers

FIG. 3 shows micro registers 324 and 325 coupled to the output terminals of multiplexers 311 and 312. Each micro register, which stores intermediate logic states, includes eight micro register bits, wherein each micro register bit corresponds to one of the previously described eight memory slices (although in one embodiment, not all bits of all micro registers are present). Just prior to a change of configuration, the micro register bits corresponding to the current memory slice are clocked so as to capture the state of all CLBs (and in some embodiments IOBs). In accordance with the present invention, the contents of micro registers 324 and 325 can be used in any configuration. During each configuration, signals propagate through the FPGA in a conventional manner, with the addition of paths from the micro registers through the programmed interconnect to input terminals of look-up tables (LUTs) or CLBs.

In one embodiment, multiple selectors for each micro register are provided, so a single configuration can either access values produced by multiple other configurations of the CLB, or access current CLB values which bypass micro registers 324 and 325. For example, micro register 324 is coupled to a plurality of output selectors, i.e. multiplexers 313, 314, 315, and 316. In a similar manner, micro register 325 is coupled to multiplexers 317, 318, 319, and 320. Note that each of the above-mentioned multiplexers (selectors) receives signals from function generators 302, 303, 304, or signals external to CLB 301 (i.e. signals H1 or DIN). The number of multiplexers limits the number of signals from the micro register that can be used at one time. For example, because there are four output multiplexers for each micro register (i.e. multiplexers 313–316 for micro register 324 and multiplexers 317–328 for micro register 325), a single configuration cannot access more than four signals stored in the same micro register in other configurations.

Figure 3A:
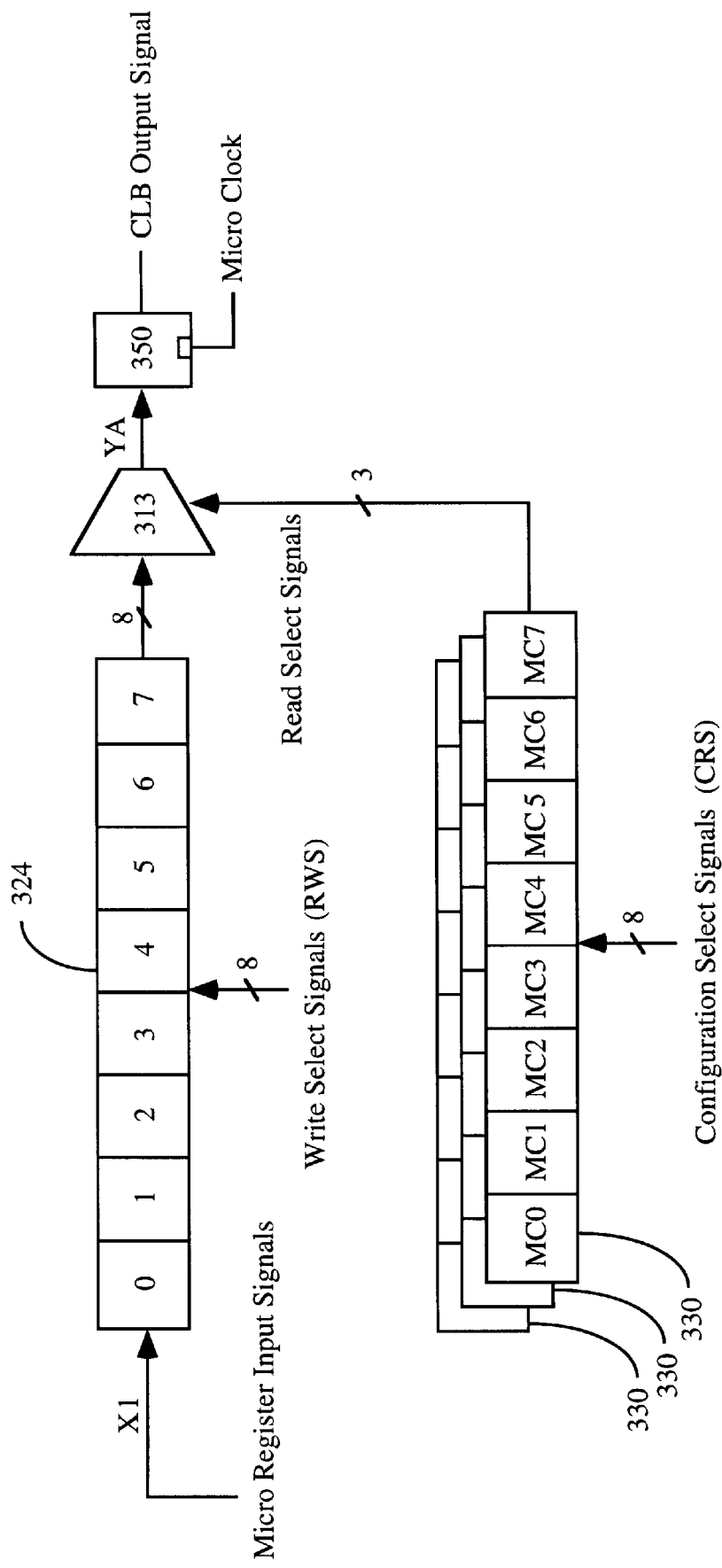
FIG. 3A shows the configuration select signals, the read select signals, and the write select signals of the present invention provided to a plurality of memory cell blocks, an output multiplexer, and a micro register, respectively.

Referring to FIG. 3A, register write select (RWS) signals determine which micro register bit, i.e. bits 0–7, to write. Read select signals control, for example, output multiplexer 313 which in turn determines which micro register bit to read. Configuration select (CRS) signals determine which read select signals to use from blocks 330, wherein each block includes 8 memory cells MC0–MC7. Note that the RWS signal is provided by a memory controller (explained in further detail in reference to FIGS. 11 and 12) for memory write operations only and by a sequencer (explained in further detail in reference to FIGS. 22A and 52) for other operations. In contrast, the CRS signal is provided by the sequencer for configuration read operations and by the memory controller for other operations.

In the simplest embodiment, the RWS signal is simply the CRS signal delayed by one μcycle (also referenced as "ucycle" and "micro cycle"). That is, the CRS signal specifies the computation at the beginning of the μcycle, and the RWS stores the result at the end of the μcycle.

Because the output signal, for example output signal YA, is latched into a pipeline latch 350 with a μCLK signal, there is no need to latch the read select signals or the CRS signals, thereby minimizing silicon area and allowing multiplexer 313 to operate in parallel with the configuration read process.

Figure 4:
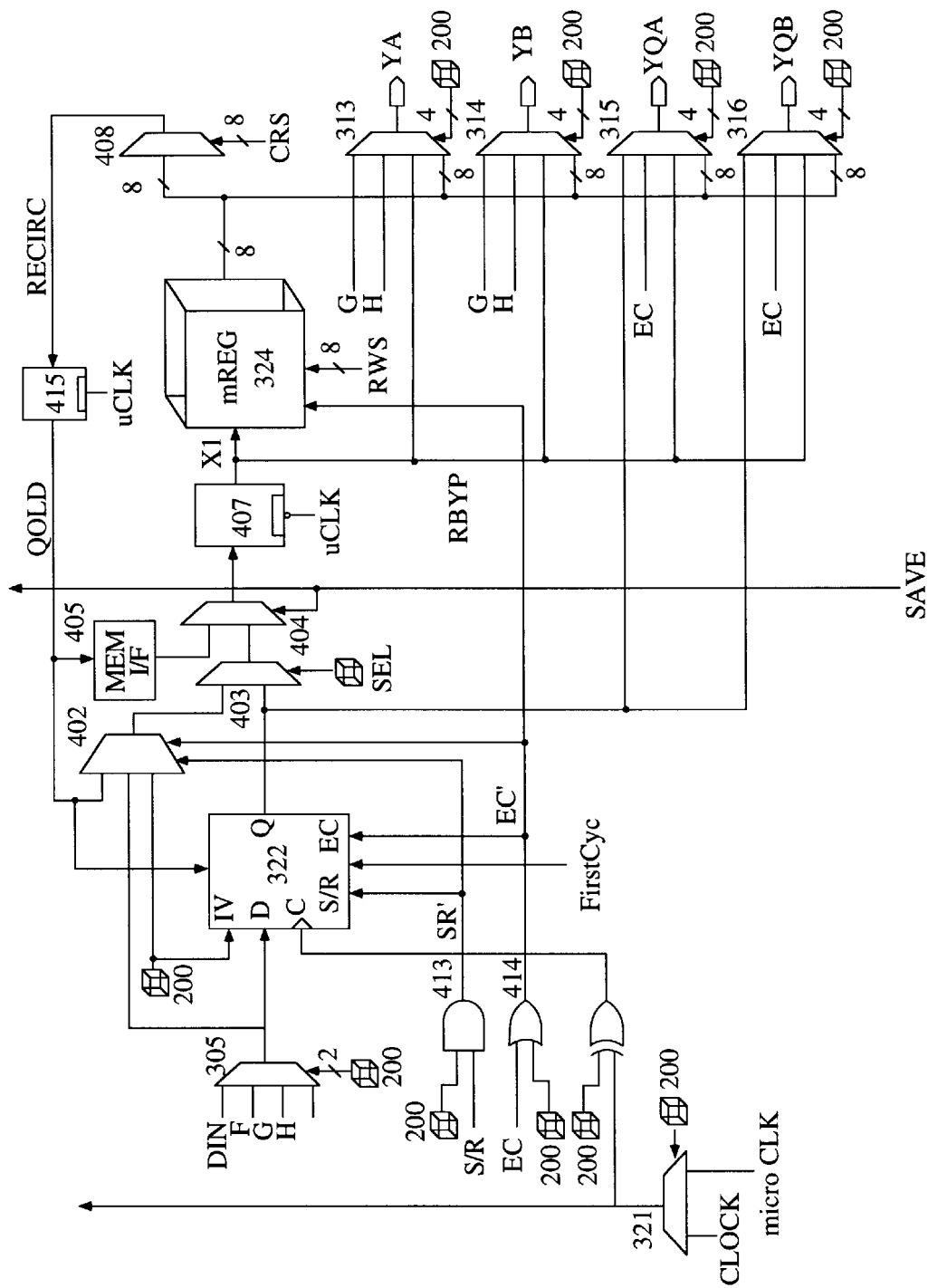
FIG. 4 shows a more detailed block diagram of a portion of the time-multiplexed CLB illustrated in FIG. 3.

FIG. 4 shows a more detailed embodiment of a portion of CLB 301 (FIG. 3) which includes micro register 324, multiplexers 305, 321, and 313–316, and D flip-flop 322. Note that the structure shown in FIG. 4 is replicated twice in CLB 301 because there are two sets of micro registers (i.e. micro registers 324 and 325). In this embodiment, multiplexer 311 (FIG. 3) comprises three multiplexers 402, 403 and 404. Multiplexers 313, 314, 315, and 316 provide buffered output signals YA, YB, YQA, and YQB, respectively.

The functioning of the RECIRC path is controlled by a clock enable signal. Specifically, when a clock enable signal EC is a logic zero the previous value of the current micro register bit may be obtained in the following manner. First, an output signal from micro register 324 is selected with a CRS signal and transferred via multiplexer 408 into a latch 415 with a μCLK signal. As explained previously in reference FIG. 3A, the CRS signal is the address or location in the bitset of the currently-active configuration. Second, the latched signal QOLD is then fed back into the current micro register bit via multiplexer 402 (controlled by signal EC'), multiplexer 403 (controlled by signal SEL (provided by a configuration bit)), and multiplexer 404 (controlled by signal SAVE (provided by the sequencer)).

The input signals shown in FIG. 4 generally conform to those signals provided in the commercially available Xilinx XC4000 family of FPGAs. For example, signal K is the clock input signal; and signal IV is the initial value of flip-flop 322 upon power-up or reset and is a value provided by a bit set 200 (FIG. 2).

Signal X1 is the input signal to micro register 324 (wherein signal X2 (not shown) is the input signal to micro register 325). Note that bit set 200 (FIG. 2) controls various elements of FIG. 4. The output signal of multiplexer 408 is also provided to (MEM I/F) Memory Interface 405 which provides values to multiplexer 404 for preloading of micro register 324, for power up operations, or for debugging operations, for example. In one embodiment, micro register 324 is addressed such that each bit of the register resides in the same address space as the configuration which generated it, thereby dramatically reducing complexity of accessing a state. Note that the signals (SR' and EC') provided to the set/reset (S/R) and enable clock (EC) terminals of D flip-flop 322 also control the operation of multiplexer 402 via lines 413 and 414.

Figure 63A:
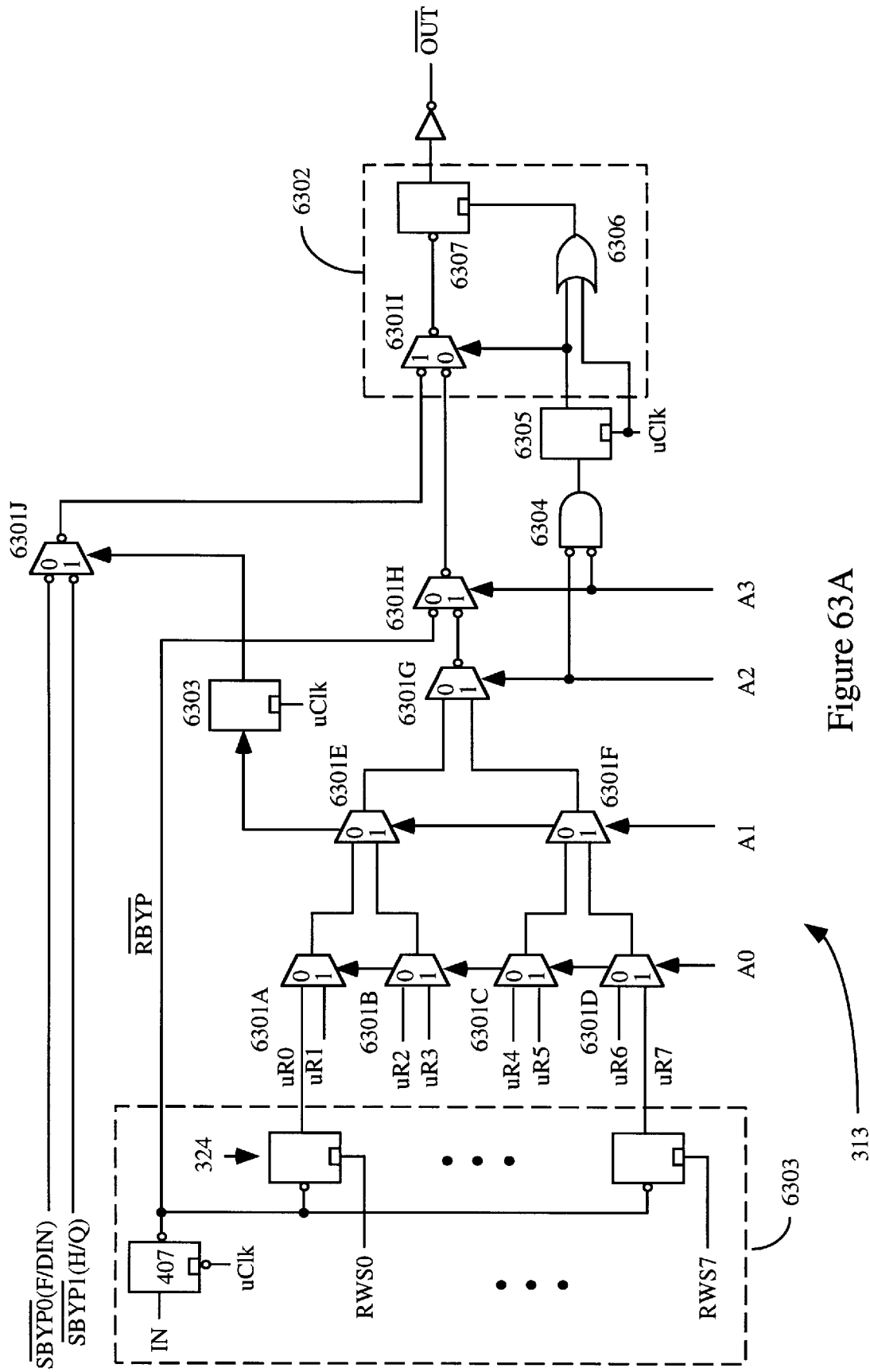
FIG. 63A illustrates write select signals provided to the micro register and configuration select signals provided to the configuration memory which in turn controls one output multiplexer.
Figure 63B:
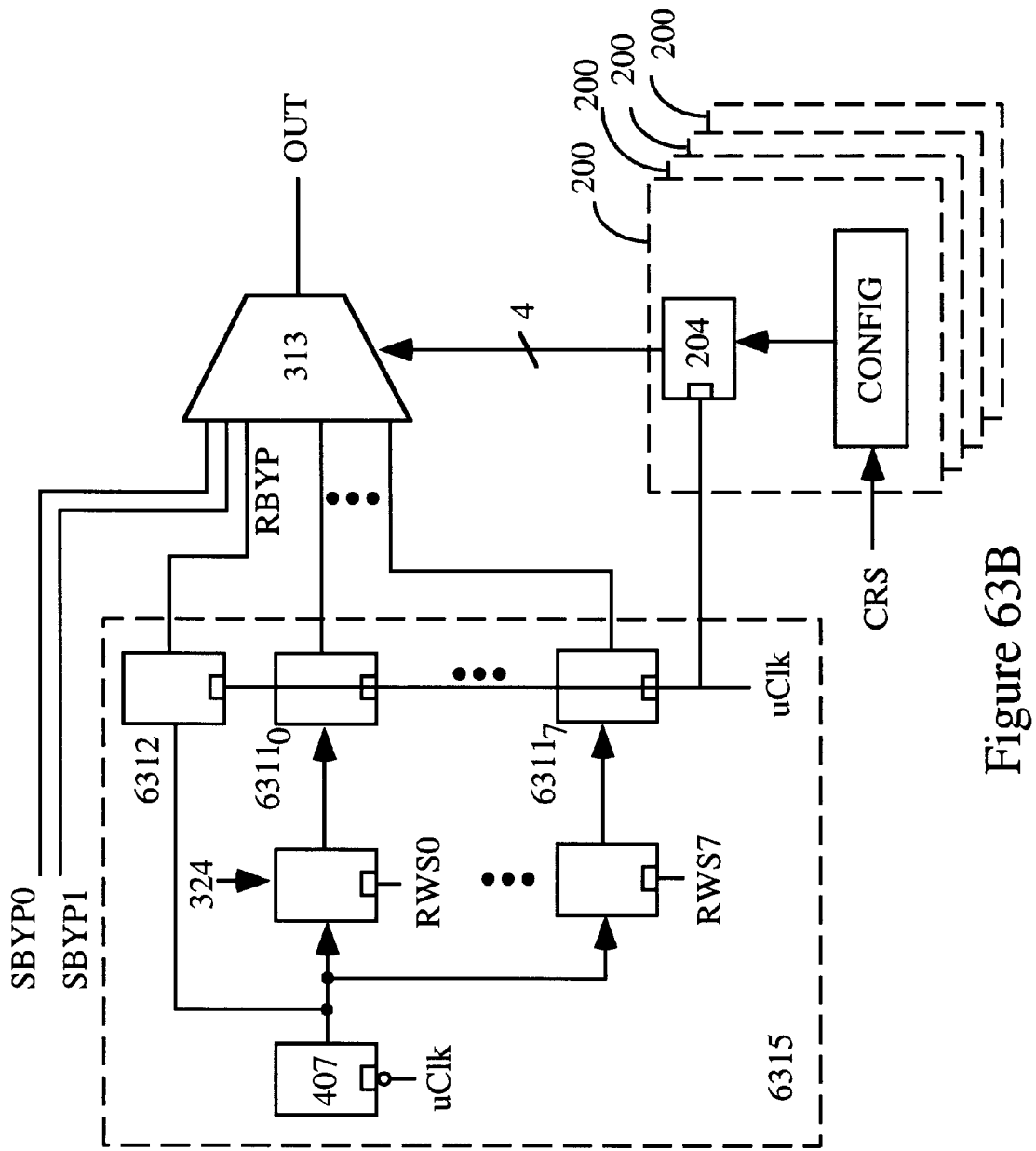
FIG. 63B shows another embodiment of an output multiplexer.
Figure 63C:
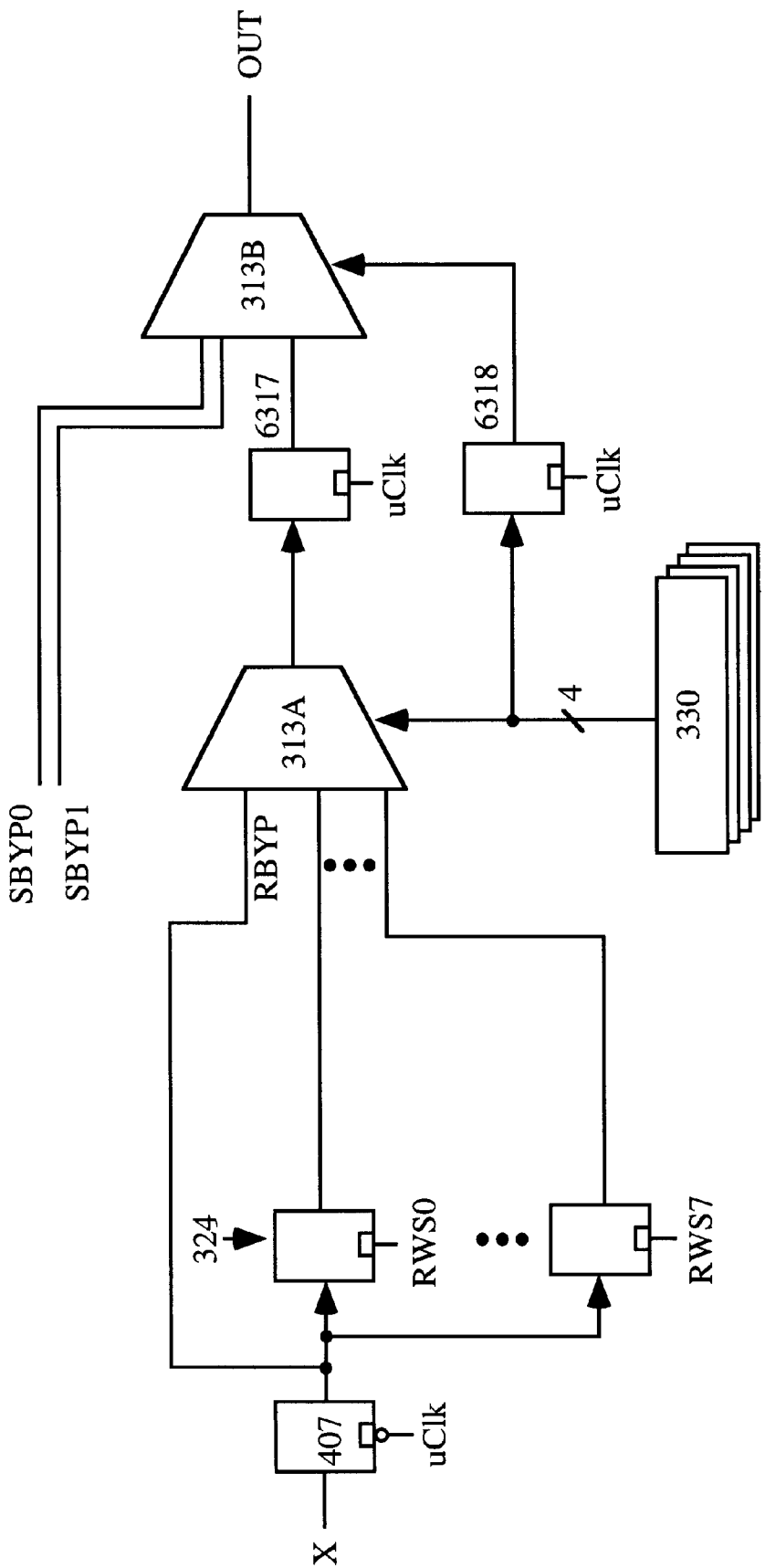
FIG. 63C illustrates yet another embodiment of an output multiplexer which reduces the number of latches in comparison to the output multiplexer of FIG. 63B.

Multiplexer 403 determines whether a signal from D flip-flop 322 or a signal from multiplexer 402 (in one configuration, a feedback signal RECIRC from micro register 324) is provided to multiplexer 404. Latch 407 captures the output signal from multiplexer 404 and transfers this value to micro register 324 upon the appropriate micro cycle clock signal μCLK. FIGS. 63A, 63B AND 63C illustrate various embodiments for multiplexers 313–320 (FIG. 3).

FIG. 63A illustrates one embodiment of an output multiplexer, in this example, multiplexer 313 (FIG. 4), in accordance with the present invention which provides a CLB output signal OUT(bar) to the interconnect structure. Note that latch 407 and register 324 are shared by multiplexers 314–316 (see FIG. 4). Register 324, receiving register write signals RWS0–RWS7, provides signals uR0–uR7 to multiplexers 6301A–6301D. Address bit A0 determines which of two signals to each multiplexer is then transferred to multiplexers 6301E and 6301F. In a similar manner, address bit A1 determines which of two signals to those multiplexers is transferred to multiplexer 6301G. Address bit A2 determines which input signal is inverted and transferred to multiplexer 6301H. Multiplexer 6301H also receives an inverted register bypass signal RBYP from latch 407 and provides (determined by select signal A3) an output signal to circuit 6302. Address bit A3 determines whether the output signal from multiplexer 6301G or a register bypass signal RBYP is subsequently provided to multiplexer 6301I. Note that if signal RBYP is selected then multiplexer 6301H has provided the value written in the register in the previous micro cycle. Although the RBYP signal eliminates the latency of tree multiplexer 6301, the signal may create some ambiguity as to the value in the previous micro cycle in other than the logic engine mode.

Figures 63D, 63E, 63F:
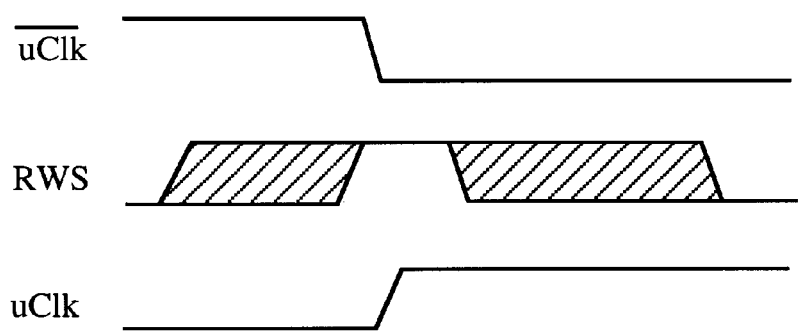
FIG. 63D shows a table indicating the input signals for an output multiplexer of the present invention.
FIG. 63E illustrates a truth table for a circuit included in the output multiplexer shown in FIG. 63A.
FIG. 63F shows a timing diagram for the output multiplexer illustrated in FIG. 63B.

The table illustrated in FIG. 63D indicates the input signals for each multiplexer 313–320, wherein signal X1 is the output signal of latch 407 (i.e. the register bypass signal associated with micro register 324), and signal X2 is the register bypass signal associated with micro register 325. Input signals SBYP0 and SBYP1 refer to sequential bypass signals that are typically generated in the configuration logic blocks of the Xilinx XC4000 family of devices (i.e. signals F, H, DIN, or Q).

Note that signals SBYP0 and SBYP1 are selected by address bits A1–A3. Specifically, address bit A1 is stored in a latch 6303 which controls multiplexer 6301J (i.e. selects between input signals SBYP0 and SBYP1), whereas address bits A2 and A3 are provided to AND gate 6304. If both address bits A2 and A3 are low, then a high signal is stored in latch 6305, otherwise a low signal is stored in latch 6305. The output signal of latch 6305 controls whether multiplexer 6301I selects the output signal of multiplexer 6301H or multiplexer 6301J (as explained in detail below).

FIG. 63B illustrates another embodiment in which latch 407 is connected to micro register 324 which in turn is connected to latches $6311_0$–$6311_7$, as well as to latch 6312. Because all the above-referenced latches are clocked by micro clock signal uClk, circuit 6315 functions as a plurality of flip-flops with signals RWS0–RWS7 serving as the enable signals to those flip-flops. Moreover, because the micro clock signal uClk is distributed with low skew throughout the chip, signals RWS0–RWS7 can have considerable slop as shown in FIG. 63F by the cross-hatched section which indicates a "don't care" period for signal RWS. Note that to eliminate race problems in circuit 6315, some non-overlap is provided between micro clock signal uClk and uClk(bar) (otherwise, data may pass through the latches during the overlap period). Note that in this embodiment, signals SBYP0 and SBYP1, if chosen, are transferred by multiplexer 313 irrespective of micro cycle clock uClk, whereas if a signal from micro register 324 is chosen then such signal is sampled on the edge of the micro cycle clock uClk.

FIG. 63C illustrates yet another embodiment in which latch 407 is connected to micro register 324 which in turn is connected to multiplexer 313A. As shown, this embodiment provides a multiplexer 313A for the input signals that are latched and another multiplexer 313B for those input signals that are not latched. Thus, latches 6311 (FIG. 63B) have been "pushed" through multiplexer 313, thereby advantageously decreasing the number of latches to one, i.e. latch 6317, from nine latches, i.e. latches $6311_0$–$6311_7$ in FIG. 63B. Multiplexer 313A is controlled by 4 blocks 330 (see FIG. 3A), whereas multiplexer 313B is controlled by blocks 330 via latch 6318. In this embodiment, a latch 6317 is provided for the output signals from multiplexer 313A. Therefore, once a reconfiguration is complete, the embodiment of FIG. 63C need not wait for a value to ripple through multiplexer 313A.

FIG. 63E illustrates the truth table for circuit 6302 (FIG. 63A). For example, if either signal SBYP0 or signal SBYP1 is selected, then address bits A2 and A3 are zero. Thus, the output signal of gate 6304 (effectively a NOR gate because of its inverted input terminals) is high. After a uClk signal is detected by latch 6305, it outputs a high signal, thereby forcing the output signal of OR gate 6306 high. That high signal effectively makes latch 6307 transparent, thereby allowing either signal SBYP0 or SBYP1 to ripple directly to the CLB output line. In other words, circuit 6302 functions as a multiplexer. Note that the structures shown in FIGS. 63B and 63C also perform the same function, but the function is implemented in a different manner.

On the other hand, if the output signal of micro register 324 is desired, then the output signal of latch 6305 is low and the output signal of OR gate 6306 is the same as the micro clock. In this manner, latch 6307 performs the same function as latch 6317 (FIG. 63C). Thus, in this configuration, circuit 6302 functions as a multiplexer coupled to a latch.

Figure 63G:
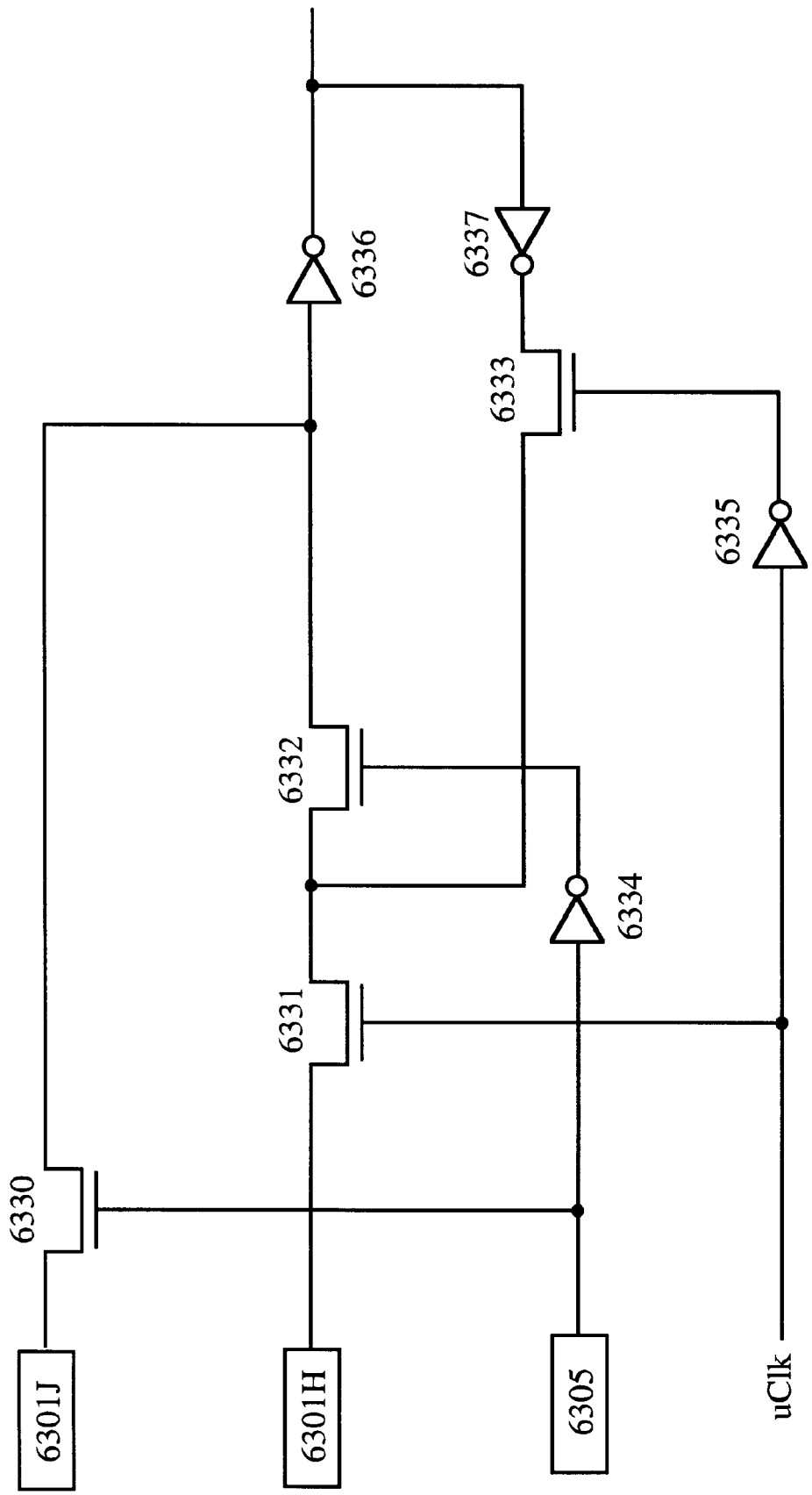
FIG. 63G illustrates a detailed implementation of the circuit identified in FIG. 63A.

FIG. 63G shows one detailed implementation for circuit 6302 which includes transistors 6330–6333 and inverters 6334–6337.

FIG. 5 illustrates multiplexers 402, 403, and 404 and MEM I/F 405 which, in this embodiment, are consolidated into effectively a single multiplexer circuit 500 which reduces the delay by reducing the number of series pass-transistors. Note that the read signal RD, write signal WR, and memory select signal MSEL are provided by a memory controller (described in detail in reference to FIG. 11), whereas a SAVE signal is provided by a sequencer (described in further detail in reference to FIGS. 22A and 52) and a select signal SEL is provided by a configuration bit. FIG. 6 is a truth table 601 for the various input signals resulting in a particular signal at node 501 (FIG. 5).

2.1a Micro Register Location

Micro registers 324 and 325 (FIG. 3) are located in alternative places. In one embodiment (shown in FIG. 3), micro registers 324, 325 are coupled to the input terminals of output multiplexers 313–320. In a second embodiment, the micro registers are coupled to the input terminals of logic function generators 302 and 303. If, for example, micro register 324 is coupled to the input terminals of logic function generator 302, then multiplexers 313–316 are simplified. Note that if two signals are generated in the same configuration and those signals are needed on the same pin of logic function generators on different configurations, a conflict arises. Specifically, if the micro registers are coupled to the input terminals of the logic function generators, two signals provided to those micro registers cannot be provided on the same configuration.

In a third embodiment, the micro registers are located in the interconnect, wherein signals are routed to the micro registers when available and routed from the micro registers when needed. In one instance, the micro registers are assigned independently of the logic function generators doing the calculation. In this manner, a placement program can automatically select only those micro registers having no conflict. This embodiment provides maximum flexibility as to data storage location.

In a fourth embodiment, the micro registers are located in a storage location independent of the configuration. The address or part of the address may be configuration bits or placement location. In this manner, only those values to be kept are stored and only locations that have no conflict are selected.

2.2 Bus Hierarchy

As described above in the Description of the Related Art, each configuration operation in a prior art FPGA is controlled by a set of configuration memory bits. The busses used to load these configuration bits typically form a single level of hierarchy, with vertical address lines spanning the full height of the CLB array, and horizontal data lines (referred to as a global bus) spanning the full array width.

Figure 7:
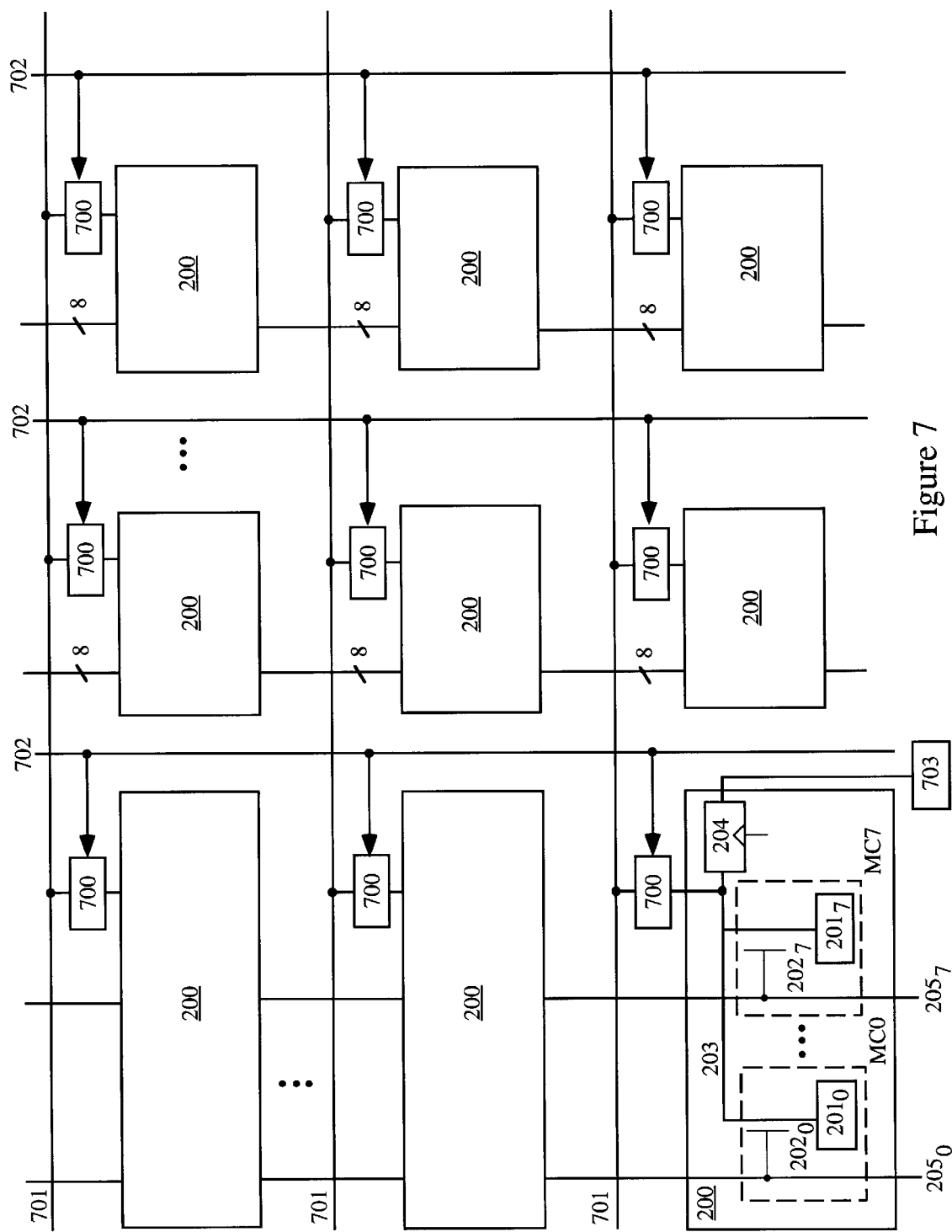
FIG. 7 illustrates a two level memory hierarchy.

In accordance with the present invention, each of the prior art configuration memory bits is replaced by N bits. Those N bits, i.e. the bits stored in memory cells MC0–MC7, are connected via their local busses 203 through switches 700 to a global bus 701 as shown in FIG. 7. Local buses 203 may randomly or sequentially access memory cells MC0–MC7 to drive a memory function device 703 (i.e. a programmable point in a CLB or interconnect structure). In one embodiment, switch 700 is a transistor, whereas in other embodiments, switch 700 is a conventional buffered switch. In one embodiment, each memory cell MC is implemented using a 5-transistor memory cell 100 (FIG. 1). Other memory cell implementations are described below in detail.

Local busses 203 are more active because they carry bits for each configuration (to latch 204), while global bus 701 is only active for reconfiguring a plane (also referred to as a slice) or performing a user memory operation. The capacitance of local busses 203 is minimized by compact layout and small transistor sizes for power and speed reasons. Busses 205 provide configuration select (CRS) signals to transistors 202, wherein address busses 702 provide address signals to switches 700.

Figure 7A:
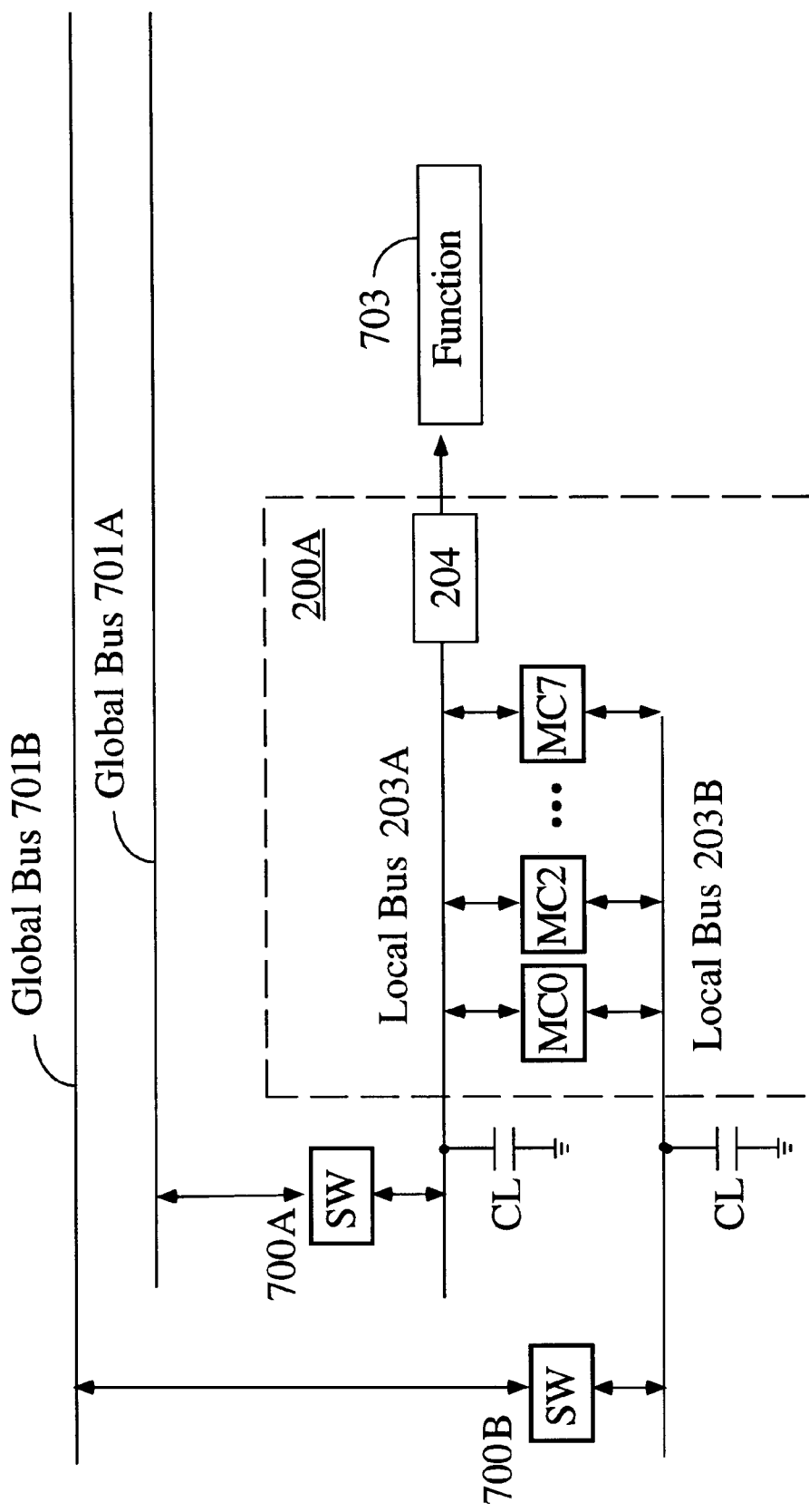
FIG. 7A shows an embodiment in which two local busses and two global busses carry true and complement versions of signals to a bit set.

In one embodiment, local bus 203 and global bus 701 carry true and complement versions of signals if desired. For example, if a memory cell MC is implemented with a conventional six-transistor (6T) memory cell (which is well known in the art and therefore not explained in detail herein), two local busses 203A and 203B, two switches 700A and 700B, and two global busses 701A and 701B are typically used as shown in FIG. 7A, thereby increasing transistor count for each bit set 200A.

In a local bus to global bus transfer, there is only one memory cell MC per global bus 701 taking part in the transfer (thus a column of MC cells for the CLB array). In an illustrative CLB having four columns, and eighty bit sets per column, in accordance with the present invention, a 16×16 CLB array forms an array of 64 columns with 1280 bit sets per column.

Figure 17:
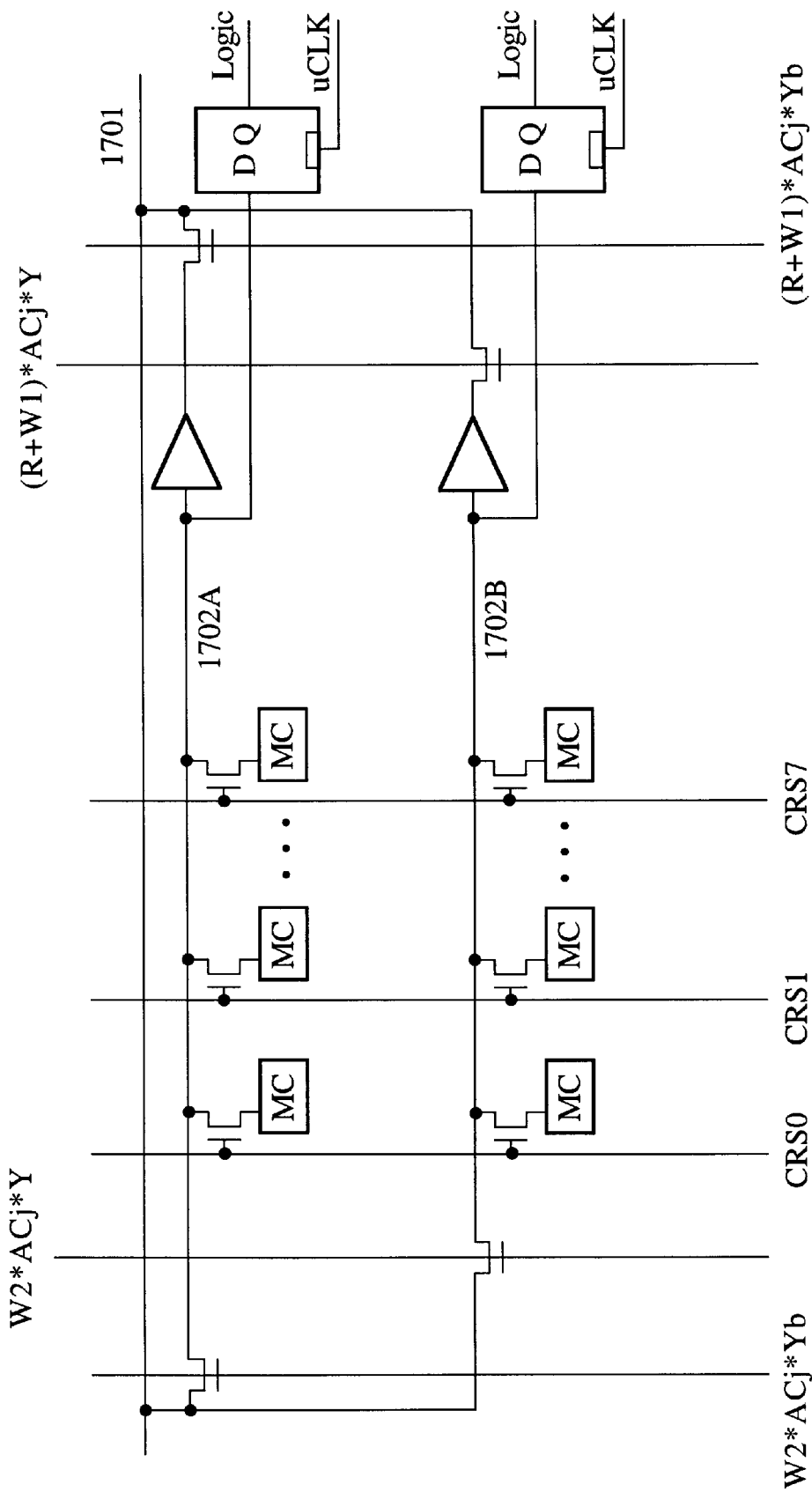
FIG. 17 illustrates a plurality of configuration bits for the shared memory.

A refinement of the two level hierarchy is shown in FIG. 17, wherein two local busses 1702A and 1702B are multiplexed onto a single global bus 1701. The advantage of this refinement is a reduction of global bus lines. Note that in other embodiments (not shown), more than two local busses are multiplexed onto a single global bus.

3.0 Power Conservation

Figure 8:
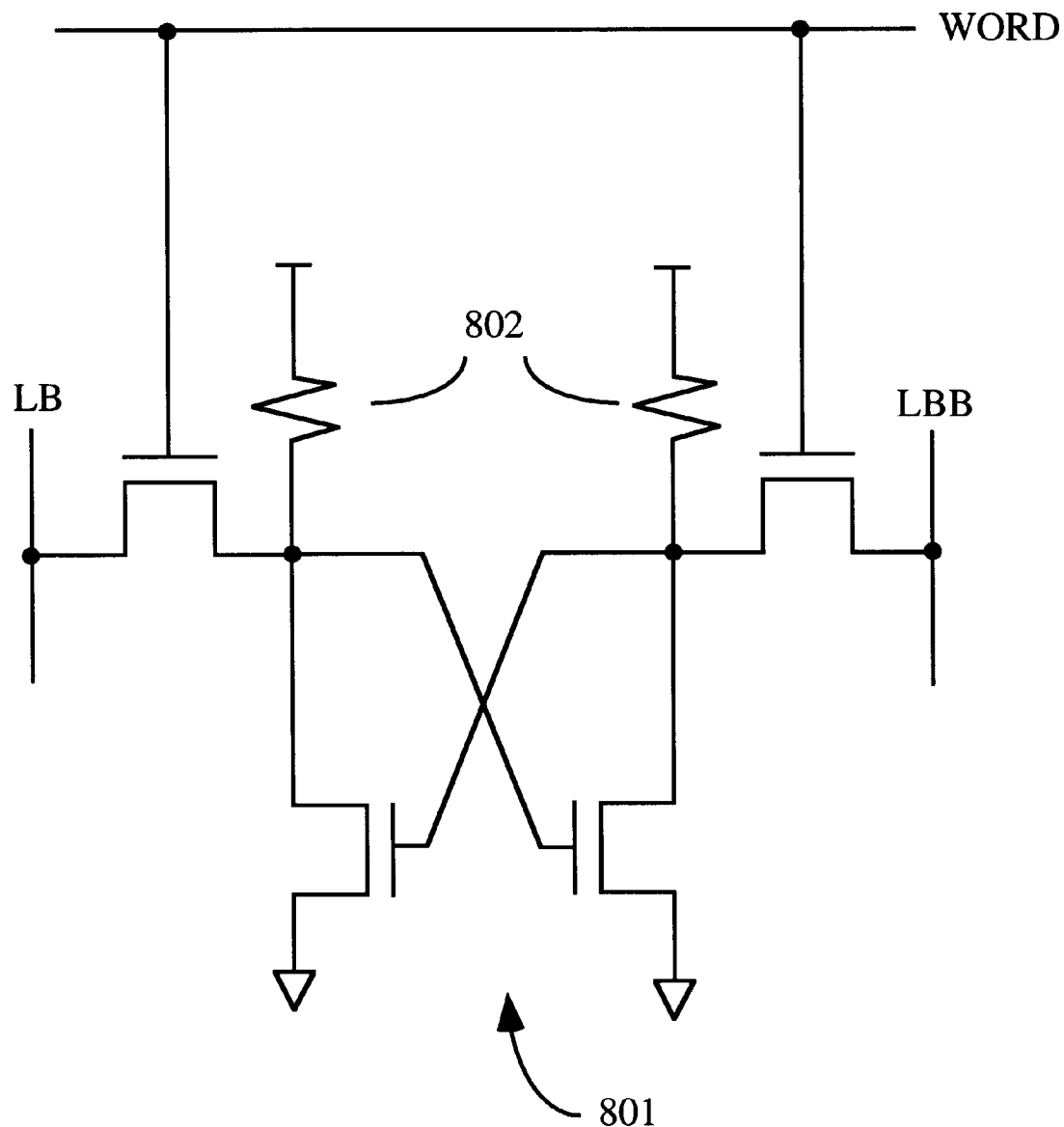
FIG. 8 shows a known four transistor memory cell.
Figure 9:
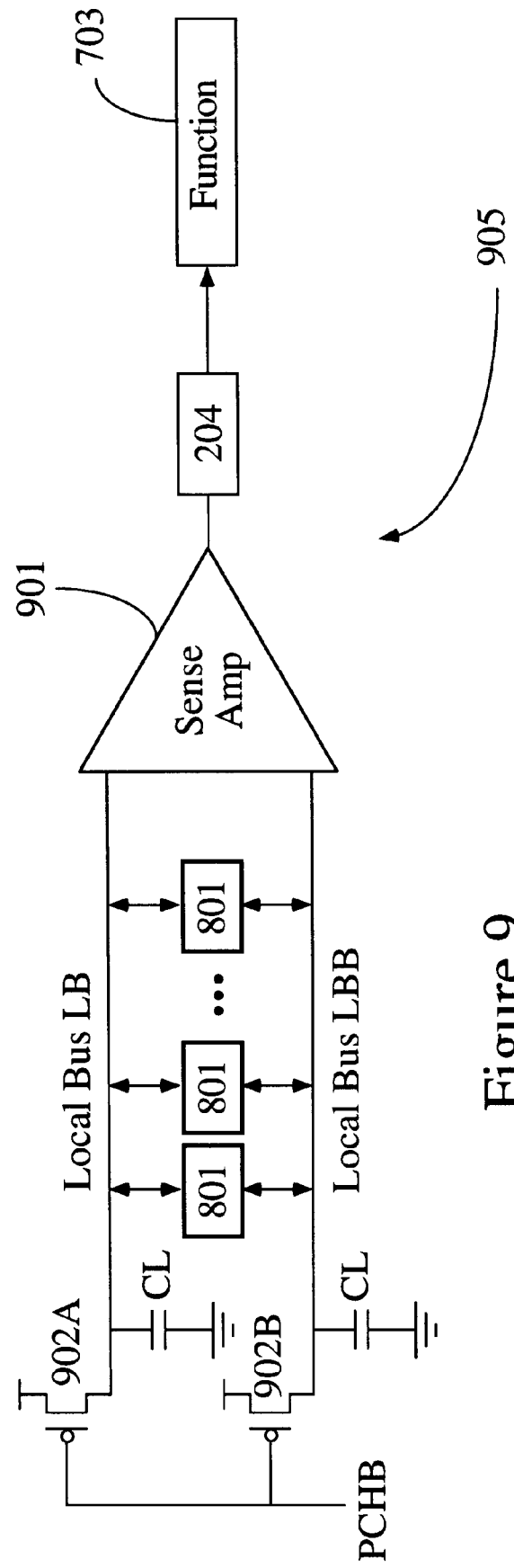
FIG. 9 illustrates a four transistor cell memory configuration in a PLD.

Because a large number of bit sets 200, i.e. on the order of 160,000, are provided on one chip, dynamic power consumption is significant. Note that the bit line capacitances, voltage swings and clock cycle times of the 4T, 5T, and 6T memory cells are different. Moreover, the frequency of the voltage swing of their respective bus lines differs. Specifically, referring to FIGS. 8 and 9, 4T cell 801 cannot drive the signals on local buses LB and LBB high because resistors 802 have too high a resistance. Thus, local buses LB and LBB must be precharged (via a low precharge signal PCHB provided to the gates of transistors 902A and 902B) each time a configuration is read. The signal on local bus LBB is the inverse of signal on local bus LB so that on every cycle, either local bus LB or local bus LBB is discharged by one of memory cells 801. Therefore, there is one high and one low transition per cycle which is detected by sense amplifier 901 which in turn drives memory function device 703.

In contrast, referring back to FIG. 7, a 5T memory cell can drive local bus 203 high and low, thereby eliminating the necessity of precharge. (Note that a 6T cell also need not be precharged.) Because sequential accesses are as likely to have the same as have different data, the average bus transition for the 5T case is every other cycle. Note that because the 6T cell has two busses, the average bus transition for that cell is between that of the 4T and 5T cells. Therefore, the 5T memory cell has one-fourth the number of transitions as does the 4T cell, whereas the 6T memory cell has one-half the number of transitions as does the 4T cell. Because each bus transition corresponds to a power usage, the 5T cell reduces power consumption by 75%, whereas the 6T cell reduces power consumption by 50%. Assuming, for example, a power supply of 5 volts, a voltage swing of 2 volts, 160K local buses 203, CL=0.06 pf, and a 100 MHz clock frequency, the chip power consumption using 4T cell configuration 905 (FIG. 9) is 10 watts. Using identical parameters, the chip power consumption drops to 2.5 watts using bit set 200 (FIG. 7).

Figure 7B:
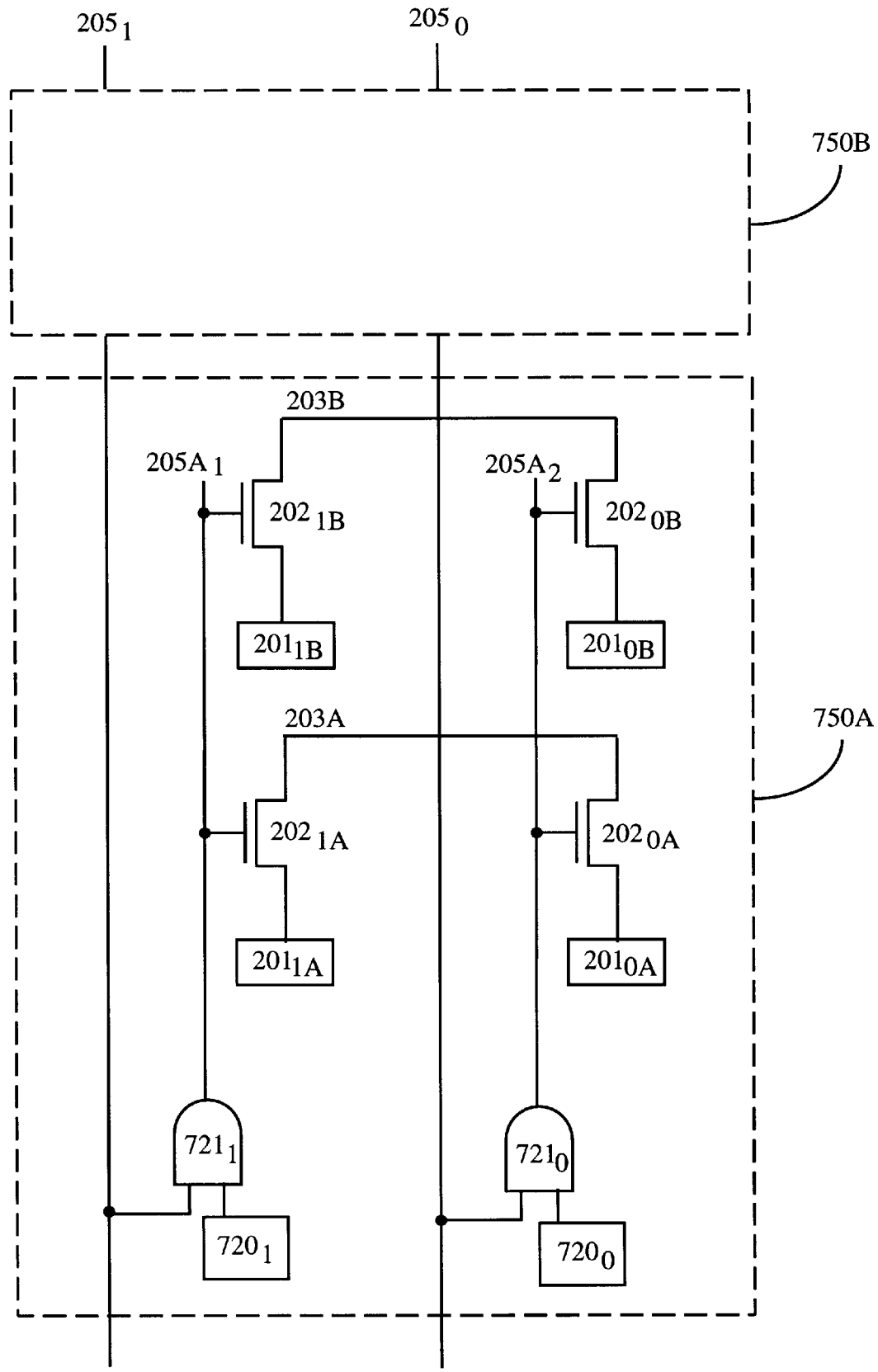
FIG. 7B illustrates a register configuration for providing access to the memory cells on a CLB-by-CLB basis.

Power is consumed when the chip memory is accessed. To conserve power in one embodiment, access to the memory cells is limited on a CLB-by-CLB basis for each configuration by adding a register having one bit per configuration to the CLB. Referring to FIG. 7B which shows CLBs 750A and 750B, registers 7200 and 7201 are memory cells 101 (FIG. 1). The stored values of those memory cells control select transistors 202 for memory cells 201 for the configurations of the present invention (for simplicity, only two configurations, i.e. the "0" and "1" configurations, and only two bit sets, i.e. the A and B bit sets, are assumed for FIG. 7B). Specifically, if the value of register 7200 is low, then AND gate 7210 provides a logic zero output signal. In this manner, access transistors 2020A and 2020B are not turned on, thereby ensuring the memory cells 2010A and 2010B in CLB 750A are not read, and resultingly saving power. Note that the CRS signals (FIG. 2) on lines 205A are generated locally in each CLB from a global set 205 and are not asserted if the control register bit 720 is not set.

Because a configuration data bit is stored in latch 204 after being read, the FPGA continues to perform its function 703 after an initial read of the configuration memory. An additional means to limit power dissipation during user data references, allows only local bus lines 203 in the addressed column to be activated. Typically, this is 1/60th of the local bus lines.

4.0 Shared Memory

The present invention provides a type of user data memory that is different from the prior art LUT memory. Specifically, each of the memory slices is allocated to either configuration data or read/write (also referred to as user data) memory. All eight memory slices may be used for read/write memory, but at least one memory slice stores configuration data initially. Once this configuration data has been stored in latches 204, the configuration memory may be reused for user data.

A portion of a configuration memory slice may be used for user data if the logic controlled by that part of the configuration does not interfere with the operation of the remainder of the configuration that is performing logic. Because allocating portions of a configuration can be cumbersome, one embodiment allocates each memory slice entirely to configuration or to user data memory. In other words, if a memory slice is allocated to user data memory, all bits within the slice are usable as read/write storage, i.e. the entire configuration word for all CLBs. Thus, the present invention makes available abundant storage for the user. For example, for a 20×20 array of CLBs, approximately 16,000 bytes of RAM are available per memory slice.

Figure 11:
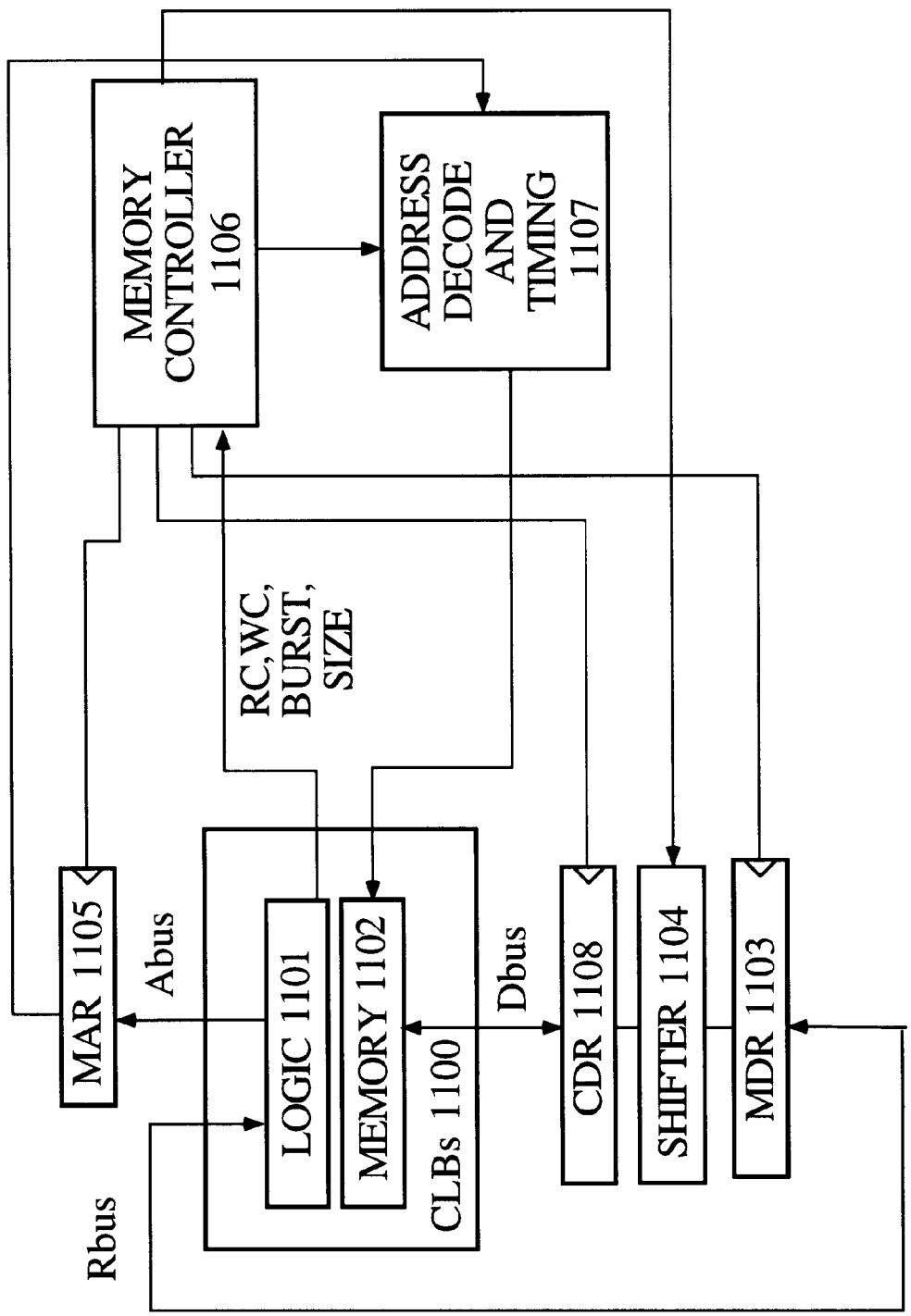
FIG. 11 shows a block diagram of a shared memory.

FIG. 11 shows a block diagram of the memory of one embodiment of the present invention, wherein data bus Dbus, memory 1102, and logic 1101 are equivalent to global busses 701, memory cells MC0–MC7, and function device 703, respectively, in FIG. 7. Address bus Abus and register bus Rbus are configured in CLBs 1100 using general logic and interconnect. The general interconnect lines route to dedicated registers which are located peripherally to CLBs 1100. Memory address registers MAR 1105 hold the memory address, whereas memory data registers MDR 1103 hold the memory data. Because general logic and interconnect are used for Abus/Rbus, dedicated memory hardware is not needed in CLBs 1100 to support user memory.

The width of MDR 1103 is programmable, with typical values being 1, 2, or 4 bytes. Column data register CDR 1108 has as many bits as Dbus width, typically 256 bits wide for a 16×16 CLB array. Use of CDR 1108 allows multiple transfers of MDR 1103 for every transfer of CDR 1108, thereby enhancing performance and reducing row decode in CLBs 1100. Shifter 1104 shifts the data in MDR 1103 to the proper bytes in CDR 1108. A memory controller 1106, also located peripherally to CLBs 1100, receives input signals RC (Read Command), WC (Write Command), and BURST (Burst command) from user logic in CLBs 1100.

The BURST signal, a control signal to support the burst read (BR) and burst write (BW) operations described below in reference to FIGS. 15 and 16 triggers multiple MDR transfers per CDR transfer. Burst accesses are limited to contiguous addresses because this is the data that transfers between memory 1102 and CDR 1108 via data bus Dbus.

User logic 1101 generates the memory address, data size identifier (the SIZE signal generated by logic 1101 in FIG. 11), and data, and then transfers these parameters (with no memory specific logic) to and from MAR 1105, MDR 1103, and CLBs 1100. Note that MAR 1105, MDR 1103, CDR 1108, shifter 1104, memory controller 1106, and address decode and timing block 1107 are all dedicated memory hardware in the periphery of the chip.

Figure 12:
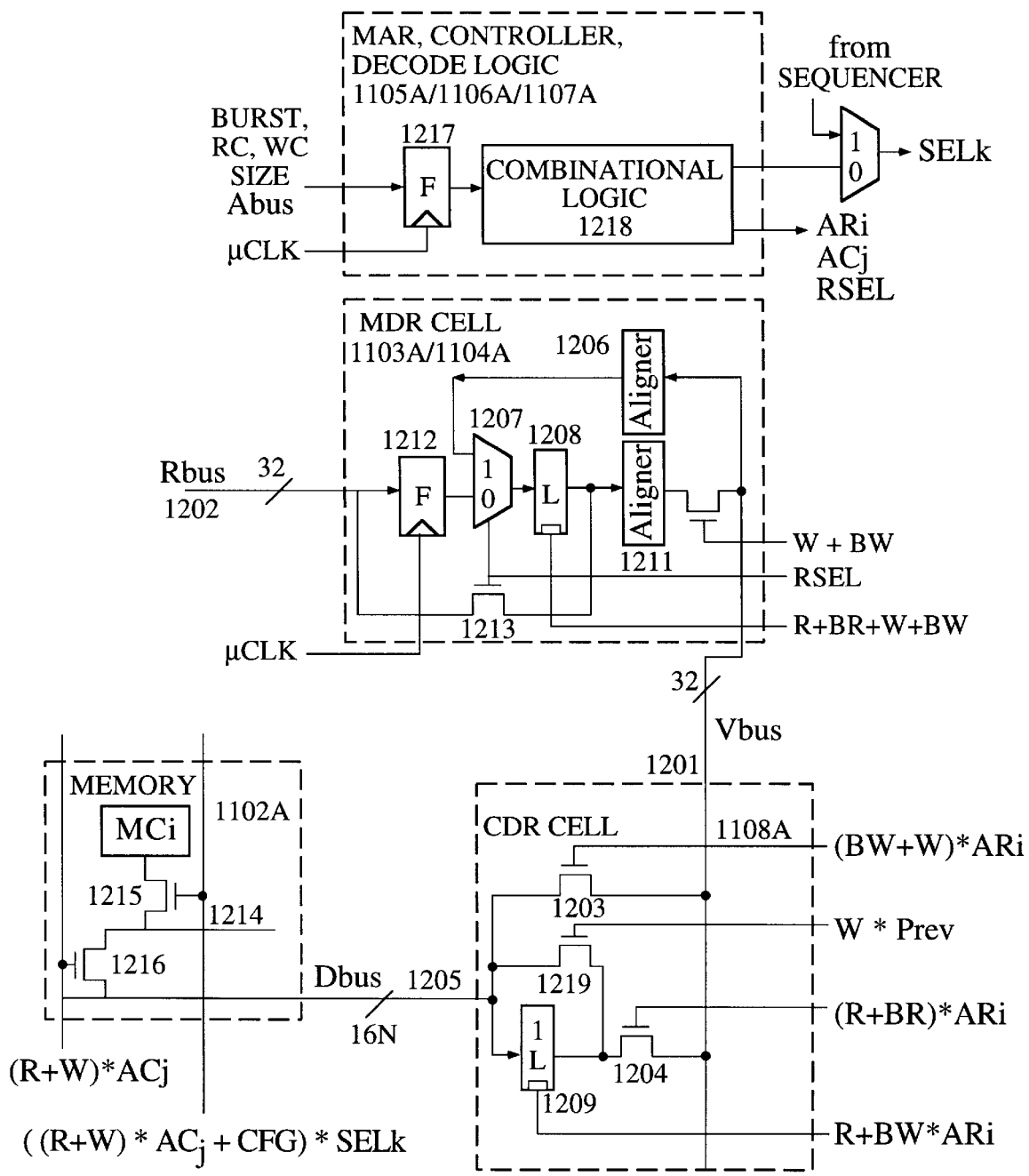
FIG. 12 shows detail of the shared memory of FIG. 11.

FIG. 12 shows portions of MAR 1105, memory controller 1106, address decode 1107, MDR 1103, memory 1102 and CDR 1108 in greater detail (all indicated by an "A"). Shifter 1104 is implied in FIG. 12 by which CDR cells along Vbus 1201 are activated. Data less than 32 bits (namely one or two bytes) is right aligned on Rbus 1202, flip-flop 1212, and latch 1208. Aligners 1206 and 1211 convert data to/from right aligned to address aligned on Vbus 1201.

The clock signal $\mu$CLK is a high frequency, low-skew clock distributed across the chip. As such, $\mu$CLK (or an enabled version of it) is used to clock dedicated hardware such as MDR cell 1103A, a single clock sequencer (explained in detail in reference to FIG. 22A), configuration latches 204 (FIG. 2), configurable hardware such as CLB resident flip-flops 322 and 323 and local memory (not shown in FIG. 12, but described in detail in the 1994 Xilinx Data Book, page 2–13, which is incorporated by reference).

When the device is used in the logic engine mode (described in detail below), all memory slice signals include a predetermined number of $\mu$CLK cycles. When a device is used in a time share mode (also described in detail below), a single configuration is active for an arbitrary number of $\mu$CLK cycles, but configuration switching is still synchronized to the $\mu$CLK. Thus, the $\mu$CLK is the clock for memory references whether in the logic engine or the time share mode.

User generated signals RC, WC, SIZE (i.e. a multiple bit value indicating the number of bytes to be transferred), BURST, and Abus are captured on the rising edge of $\mu$CLK in flip-flops 1217. A write signal W is provided by memory controller 1106. Combinational logic 1218 converts address (Abus) and SIZE signals to address row (ARi) and address column (ACj, SELk) select signals. Signals ARi, ACj, and SELk enable read R, write W, burst read BR, burst write BW, and configure CFG (provided by a sequencer described in further detail in FIGS. 22A and 52) signal pulses which occur within a $\mu$CLK cycle. Signal SELk, a multiplexer output signal, is used for data memory and configuration references. Specifically, signal SELk selects the memory slice. Note that signal PREV is a decoded address signal.

Read Operation

For a memory Read operation, read command signal RC=1 causes read select signal RSEL=1 (note that read select signal RSEL is provided by combinational logic 1218), thereby turning on transistor 1213 and selecting Vbus 1201 in multiplexer 1207. In this manner, the signals on Vbus are latched into latch 1208 and driven onto Rbus 1202 (via conducting transistor 1213). During this Read operation, transistors 1215 and 1216 are turned on, thereby transferring data from memory cell MCi to local bus 1214 and to Dbus 1205. This data is then latched into latch 1209. Transistor 1204, in its conducting state, drives the signal stored in latch 1209 onto Vbus 1201.

Write Operation

For a memory Write operation, RC=0 which turns off transistor 1213 and selects flip-flop 1212 in multiplexer 1207 such that data on Rbus 1202 (stored in flip-flop 1212) is transferred to Vbus 1201 for the Write operation. During this Write operation, transistors 1203, 1216 and 1215 transfer data from Vbus 1201 to Dbus 1205, from Dbus 1205 to local bus 1214, and from local bus 1214 to memory cell MCi. Note that this drive is strong enough to overcome the attempted drive of memory cell MCi. Only selected memory cells MCi within a column are written, wherein such selection is controlled by transistor 1203. Specifically, if transistor 1203 is off for address Ari, then the only drive on Dbus 1205 is that provided by memory cell MCi, and thus the value in memory cell MCi remains unchanged.

Non-Burst Read Operation (Single Cycle)

FIG. 13 shows a non-burst Read operation timing diagram. The signal on address bus Abus is sampled on a $\mu$CLK rising edge, thereby generating stable ACj, Ari signals for one $\mu$CLK cycle. Stable signals ACj, Ari enable the R pulse, which in turn initiates data propagation from memory cell MCi to local bus 1214 (FIG. 12) to Dbus 1205 and then to Vbus 1201. This data is then aligned by aligner 1206, transferred via multiplexer 1207, latched into latch 1208, transferred by conducting transistor 1213, and finally provided on Rbus 1202. The data is then sampled on the second rising edge of $\mu$CLK as shown in FIG. 13. Thus, for a Read operation, an address signal on Abus in one $\mu$CLK cycle produces data on Rbus 1202 on the next $\mu$CLK cycle. This data can be pipelined to produce data at a $\mu$CLK rate.

(i) The uCLK signal loads MAR 1105 with the signals on address bus Abus and READ control signal RC is latched with the uCLK signal. Signals Ari and Acj, (row & column addresses, respectively) at this time reflect the signals of MAR 1105. A latched signal RSEL controls multiplexer 1207 in MDR 1103 such that memory 1102 rather than register bus Rbus loads latch 1208.[i.e. reading memory data into CLB logic].

(ii) The stored data memory 1102 is transferred to latch 1209 after receiving a signal R*ACj=1. Latch 1209 is coupled to vertical bus 1201 if signals R*Ari=1. Vertical bus 1201 is coupled to latch 1208 with a signal R=1.

Non-Burst Write Operation

FIG. 14 shows a timing diagram of a non-burst Write operation. The signal on Abus is sampled on a rising edge of μCLK, thereby generating a stable ACj, ARi (a column and row address respectively) for one μCLK cycle. Stable signals ACj, ARi enable the W pulse, which in turn initiates data propagation from latch 1208 through aligner 1211 to Vbus 1201 through conducting transistor 1203 to Dbus 1205 through conducting transistor 1216 to local bus 1214 through transistor 1215 to memory cell MCi.

(i) The uCLK signal loads MAR 1105 with signals on address bus Abus contents and signal RC is latched in flip-flops 1217 with the uCLK signal. Signals Ari, ACj at this time reflect the signals of MAR 1105. A latched signal of RC=0 controls multiplexer 1207 in MDR 1103 such that register bus Rbus rather than memory 1102 loads into latch 1208. If signal WC=1, that signal initiates the sequence which generates signal W.

(ii) The signal stored in latch 1208 is transferred to vertical bus 1201 if the signal W=1. The signal on vertical bus 1201 is transferred to data bus Dbus if signal W*ARi=1.

Burst Read Operation

Burst Read (BR=1) is defined by reading CDR multiple times per CDR load, with Ari changing with each Read operation. The BR signal improves performance since it is faster than the same number of Reads from memory cells MCi.

Figure 15:
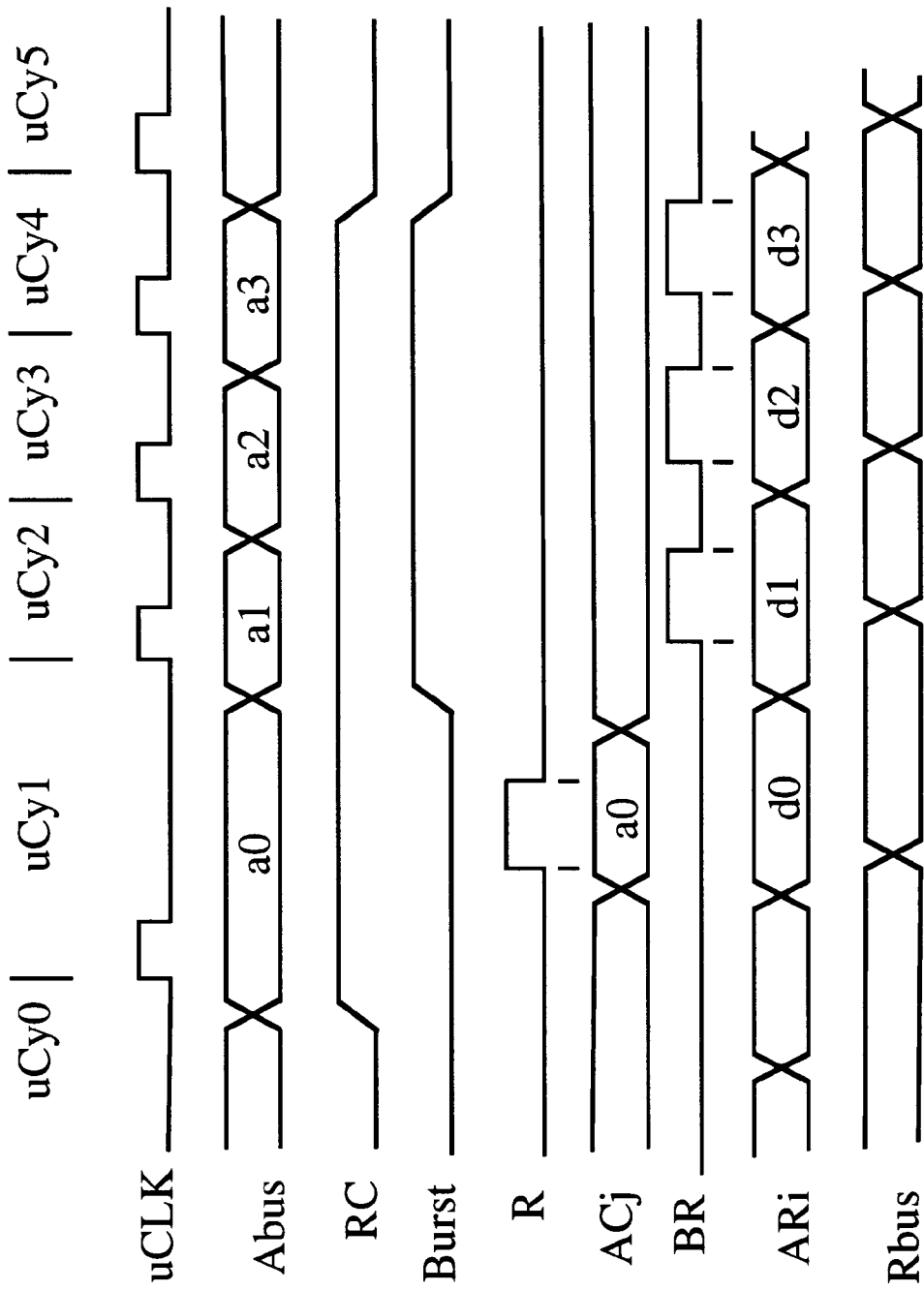
FIG. 15 illustrates burst READ timing for the shared memory.

FIG. 15 shows a timing diagram of a burst Read operation. During μCy1, a Read pulse R accesses memory cell MCi (see FIG. 12 in which R pulse controls the gate of transistor 1215).

In one embodiment, the Read access loads 16 bits per CLB from a CLB column into CDR 1108A. Because CDR 1108 (FIG. 11) contains multiple CDR cells 1108A, if subsequent Reads are to those CDR cells, the Read operation can be easily performed from CDR 1108 rather than from memory cell Mci. Thus, memory cell MCi need not be accessed twice for μCy2 through μCy4, thereby shortening these cycles. Referring back to FIG. 15, signal BR accesses data bits d1,d2,d3 (note that signal BR controls transistor 1204 and latch 1208 of FIG. 12).

A burst READ process includes the following steps.

(i) During micro cycle 0 (uCy0), the user begins to assert address signals a0–a3 on address bus Abus and provides a signal RC=1. The signal BURST=0 signifies a non-burst READ. These signals are sampled on the rising edge of the next uCLK.

(ii) During uCy1, the signal RC that was asserted in uCy0 is now executed. The entire memory column, including data bits d0/d1/d2/d3, (wherein each data "bit" includes multiple bits) is latched in temporary register CDR 1108 that is now accessible instead of memory 1102 to obtain data bits d1/d2/d3. Data bits d0 are also provided to MDR 1103. Both signals RC=1=Burst asserted in uCy1 accesses CDR 1108 in micro cycle uCy2.

(iii) During uCy2 and uCy3, the data bits continue to increment on address Ari and assert signals RC=1=Burst. Additionally, the user must read out MDR 1103 each cycle (on Rbus 1202) before it is written over.

(iv) During micro cycle uCy4, the last cycle, signals RC=0=Burst (or another reference).

Burst Write Operation

Burst Write (BW=1) is defined by writing multiple times into CDR per CDR write to memory cell Mci,thereby eliminating the need to write to memory cell MCi on every Write.

Figure 16:
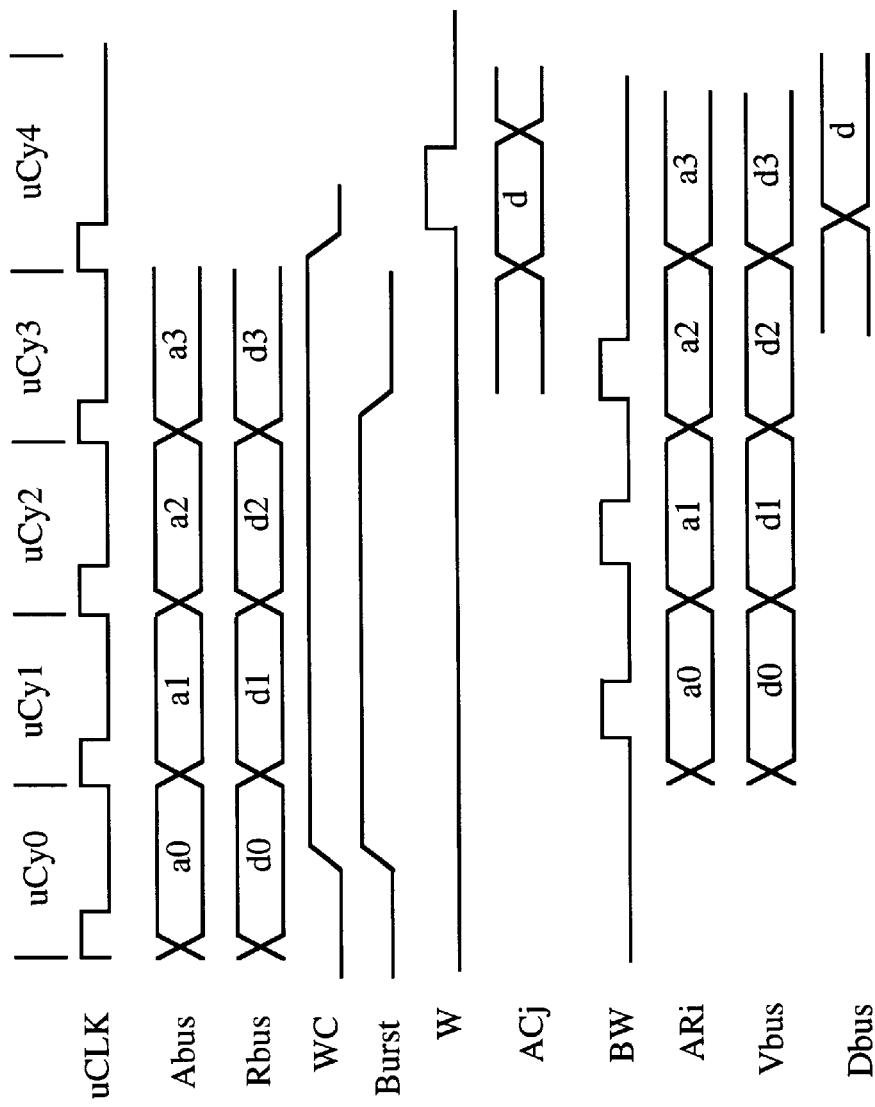
FIG. 16 shows burst WRITE timing for the shared memory.

FIG. 16 shows a timing diagram burst Write operation. During this operation, multiple cycles of data from Rbus 1202 through flip-flop 1212, multiplexer 1207, latch 1208, aligner 1211, and finally transistor 1203 are loaded into latch 1209 (FIG. 12). Signal ARi is sequenced as shown in FIG. 16 to address multiple data elements in latch 1209. In micro cycle 4, the last data element ripples through transistor 1203 to DBus 1205 into memory cell Mci, in parallel with previously loaded CDR data driving Dbus 1205 in memory cell MCi via transistor 1219. In the signal that controls transistor, signal W*Prev, Prev equals "1" for those addresses which have been loaded in previous burst cycles. In FIG. 16, Prev=a0+a1+a2.

The BURST WRITE process includes the following steps.

(i) During uCy0, the user asserts address signal a0 on address bus Abus and data signal d0 on register bus Rbus for that address. Both signals WC=Burst=1.

(ii) During uCy1, the signal WC asserted in uCy0 gets executed. Data signal d0 is loaded into the bytes of CDR 1108 determined by address signal a0. Simultaneously, the user asserts address signal a1 on address bus Abus and data signal d1 on register bus Rbus.

(iii) During uCy2 and uCy3, data signals d1 and d2 are loaded into the bytes of CDR 1108 determined by address signals a1 and a2. The user asserts address signals a3 and a4 on address bus Abus and data signals d3 and d4 on register bus Rbus. During uCy3, the user asserts WC=1, but returns BURST=0 which triggers memory controller 1106 to write back to memory in uCy4 all the bytes that have been loaded into CDR 1108 during the burst operation.

(iv) During uCy4, the final cycle, the modified bytes of CDR 1108 are written to memory cell MCi along with the final data element. The unmodified bytes of CDR 1108 are not written, by not driving onto data bus Dbus from CDR 1108.

The explanation below describes how configuration memory accesses are interleaved with user memory accesses. In one example, the configuration accesses are a sequence of CRSi signals that are a subset of signals CRS0 to CRS7, while the user memory accesses are CSRj accesses not in the configuration subset.

Figure 18:
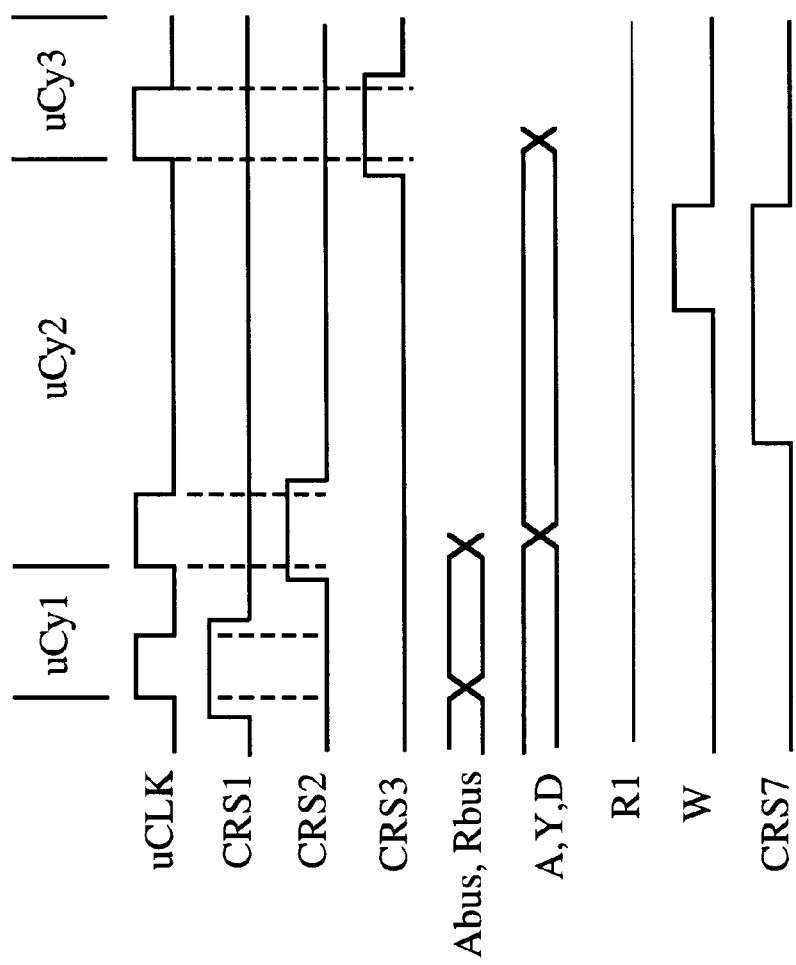
FIG. 18 shows configuration access timing graph for the shared memory.

FIG. 18 illustrates a timing diagram for a WRITE operation for the configuration shown in FIG. 17. Three micro cycles (uCy1, uCy2, uCy3) are shown in FIG. 18, each micro cycle having a different configuration for the CLB array. Access signal CRS1 defines the configuration for uCy1. In a similar manner, access signals CRS2 and CRS3 define the configurations for uCy2 and uCy3, respectively. Between asserted signals CRS2 and CRS3, a user access signal CRS7 is provided. A WRITE (W=1) signal is asserted during this user access signal. The address signals (on Abus) and WRITE data signals (on Rbus) have been defined by user logic in uCy1, latching them both on the next micro cycle clock so that they will be available for uCy2. For eight CRS signals, 3 address bits are used to select the signal CRSn (CRS7 in this example) for the user access. Each configuration has its own set of registers which interface with MDR 1103 (FIG. 11).

5.0 Chip Layout

In accordance with one embodiment of the present invention, a time multiplexed FPGA integrated circuit chip is based on the architecture of the Xilinx XC4000™ family of devices.

Figure 23:
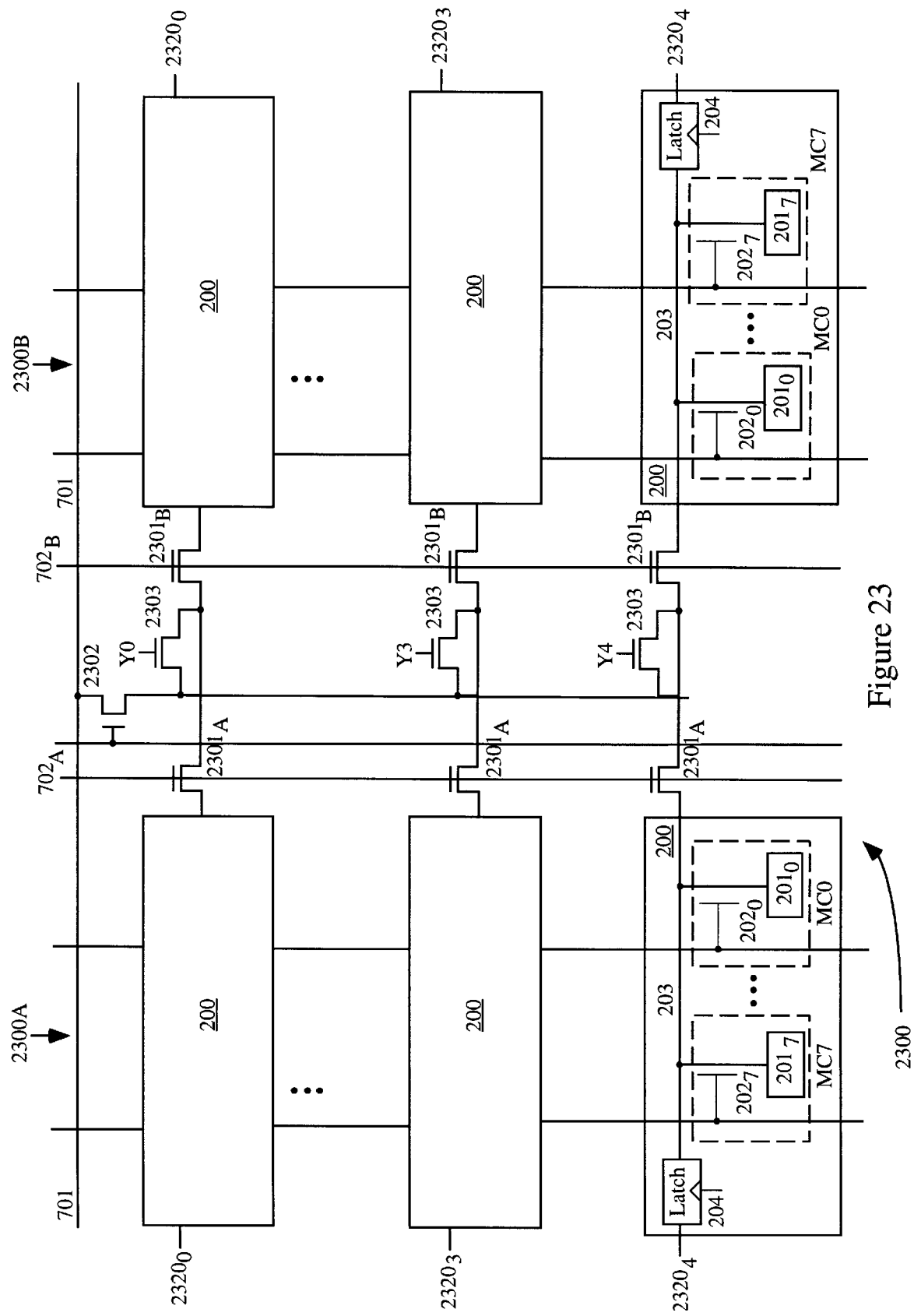
FIG. 23 illustrates a split memory in accordance with the present invention.

FIG. 23 shows a 2×5 array 2300 of bit sets 200 (FIG. 2) having the same topology as a chip layout. Bit set columns 2300A and 2300B both provide five latch output lines $2320_0$–$2320_4$. Splitter transistors 2301A and 2301B (controlled by address signals on lines 702A and 702B, respectively) allow multiplexer transistors 2303 and switches 2302 to be shared between bit set columns 2300A and 2300B, while allowing both columns to load latches 204 in parallel when all transistors 2301 are turned off. Signals Y0 to Y4 determine which row is selected for global bus 701 transfer. Transistor 2302 allows for selectively coupling one bit set column of array 2300 to global bus 701.

Figure 24:
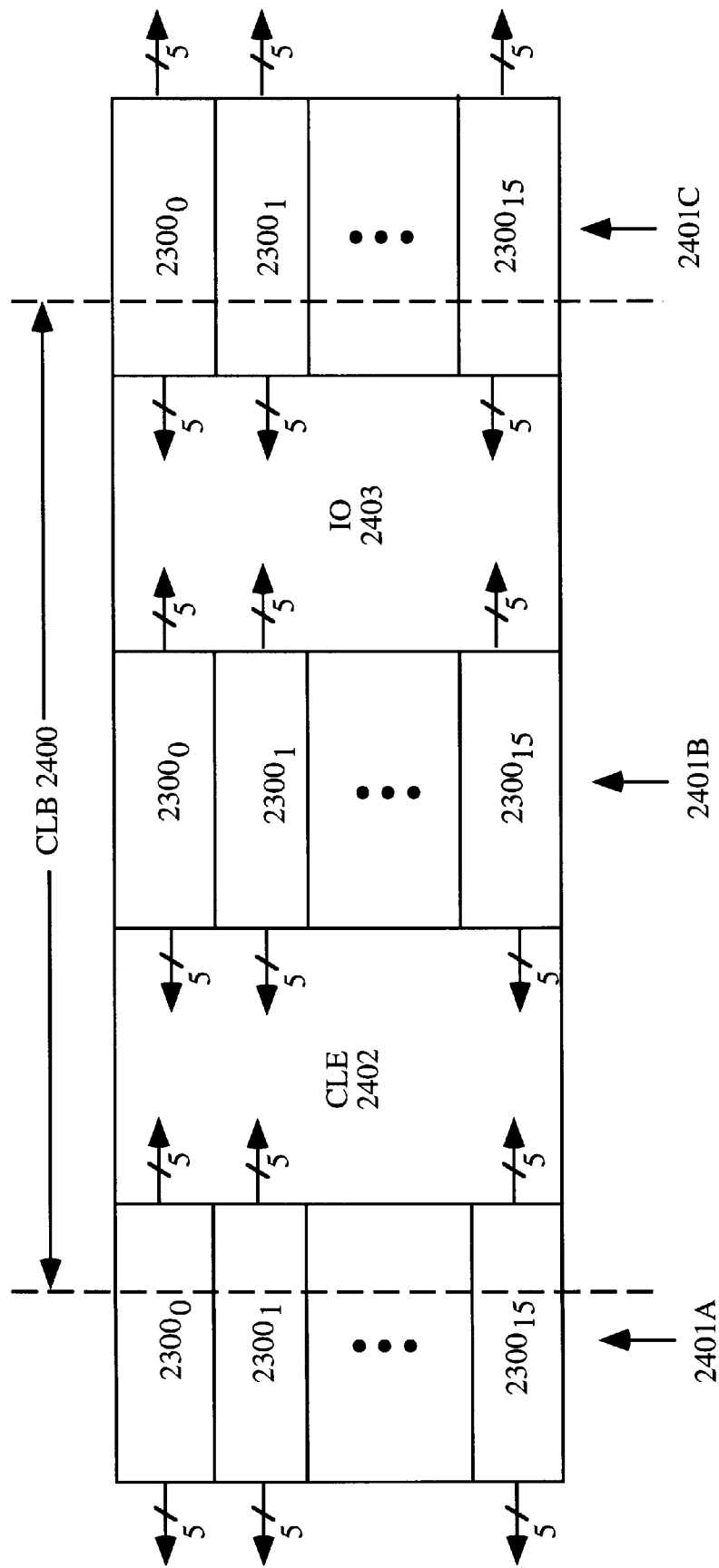
FIG. 24 shows one embodiment of a layout for a CLB.

FIG. 24 illustrates a CLB layout, including 3 columns, i.e. columns 2401A, 2401B, and 2401C, wherein each column 2401 includes 16 arrays 2300 (FIG. 23). The columns 2401A and 2401C are shared with adjacent CLBs (not shown), whereas column 2401B is used by CLB 2400. Two logic sections, a IO 2403 and a CLE 2402, are fed by the latch outputs of adjacent arrays 2300. In this embodiment, each logic section is fed by 160 latches.

6.0 Reconfiguration

Prior art FPGA reconfiguration involves loading new configuration data from off-chip without resetting the state of the FPGA. This may be done while the FPGA is operating (referred to as dynamic reconfiguration) and may only be for some portion of the configuration without the need to reload the entire configuration data pattern (i.e., partial reconfiguration). In contrast, the present invention defines a superset of the conventional reconfiguration modes by providing the ability to store multiple configurations on-chip.

In one embodiment in the time share mode, an FPGA operates based on a first configuration, while a partial or whole new set of configuration data is loaded (from off-chip) into one or more of the memory slices. (Note that this operation also works in the logic engine mode if the logic engine versions use up less than or equal to the 8 memory slices.) A second configuration data is then activated in parallel by way of a flash reconfiguration operation. This operation differs from normal flash reconfiguration in that additional configuration data is brought in from off-chip after system boot-up. This off-chip capability allows the user to change between an unlimited number of configurations rather than only eight (described above in reference to one embodiment of the invention). Depending on the clock speed, reconfiguration may require milliseconds to load each new configuration word from off chip. However, note that the FPGA is still active during this time. Dedicated reconfiguration hardware may share the memory access facilities of the user memory interface, or user logic can control reconfiguration, or both.

7.0 Single Clock Sequencer

In accordance with the present invention, a sequencer generates control signals to initiate reconfiguration, conclude reconfiguration, and manage configuration sequencing. Advantageously, the sequencer is controlled by or formed from user logic, thereby ensuring the user has significant flexibility in creating logic using any combination of input and output signals.

7.1 Configuration Sequencing

The sequencer programmably chooses the next configuration. As mentioned previously, the next configuration is selected sequentially, or directly with an address. The address may be generated externally (i.e. provided to the pins of the FPGA chip), or may be generated internally. Therefore, the next address may be conditioned on internal or external logic. The switch to the next configuration is alternatively dictated by an external signal, an internal signal, or by a count of a number of nano-cycles (wherein a nano-cycle is a very fast internal clock on the order of 200 MHz). Note that in one embodiment, the selection of sequencing method differs from one configuration to the next.

In one embodiment, the FPGA includes multiple sequencers, each controlling a different part of the FPGA. The sequencer may operate in lock step, to emulate a single sequencer, or independently, to allow operation with multiple user clocks.

In accordance with the present invention in the logic engine mode, flash reconfiguration (i.e. the configuration of a memory slice) occurs in one of two methods. In a first method, flash reconfiguration is triggered by selected input signals (or any input signal). The chip waits doing no calculation (with low power consumption) until one of the selected set of input signals changes (i.e., goes high or low). At this point, the chip executes the reconfigurations associated with one major cycle (wherein a major cycle is a complete iteration through all reconfigurations), a fixed number of major cycles, or a number of major cycles or reconfigurations until an internal or external signal indicates a stop condition.

In a second method, flash reconfiguration includes continuous reconfiguration sequencing. Specifically, the chip continually cycles through all or some reconfigurations without regard to any particular external signal.

7.2 Configuration Duration

In the logic engine mode, micro cycle duration must be long enough for the longest net to settle before proceeding to the next configuration. The present invention provides the following alternatives in the sequencer.

1. Fixed micro cycle duration. All net delays must be short enough to meet this time constraint. In one embodiment, the enforcement of the time constraint is done in the architecture (i.e., hardware), such that no possible path is longer than the preset limit. In another embodiment, the enforcement is done in the software by re-routing nets that are over the time limit.

2. Variable micro cycle duration from design to design. Specifically, allow the user to supply a regular micro cycle clock.

3. Variable micro cycle duration from one micro cycle to the next. There are several ways to vary the micro cycle duration. In a synchronous method, each micro cycle configuration has a duration field. This field selects a fixed delay, wherein the sizes of the fixed delays are set by one of the following methods:

a. Build delays into the chip.

b. Determine delays by how the chip is wired (i.e., an external delay circuit).

c. Set delays in the chip's configuration information.

d. Associate a count with each micro cycle of the number of nano cycles in a micro cycle. The nano cycle is a cycle of a very fast internal clock called the nanocycle clock.

e. Progress from one micro cycle to the next based on an external trigger, for example, an external micro cycle clock, which has irregular pulses.

f. Progress to the next micro cycle when an internal signal arrives, wherein that internal signal is routed so that it traverses the slowest path in the micro cycle.

g. Using an interrupt address signal, trigger the micro cycle sequence to jump immediately to a new address, and to continue operating from that point.

h. Select one of two addresses based on an internal signal provided to a sequencer. In other words, this alternative provides a conditional jump to the next micro cycle. In another embodiment, a plurality of internal signals are provided, wherein each internal signal selects a different next-address (i.e., a multi-way branch). For predetermined sequencing (i.e. no skipping of configurations), these bits must be wired to constants. In yet another embodiment, the next address is computed by user logic in the micro cycle. In one embodiment, the sequencer saves the current configuration and returns to that configuration or the following configuration, thereby effectively providing a "subroutine call" to a subset of the configuration.

In the logic engine mode, the read access time for a new memory slice is pipelined such that reading the memory for the next configuration is done in parallel with the logic of the current configuration, thereby minimizing reconfiguration time.

7.3 Micro Cycle Generation for a Synchronous FPGA

Figure 19:
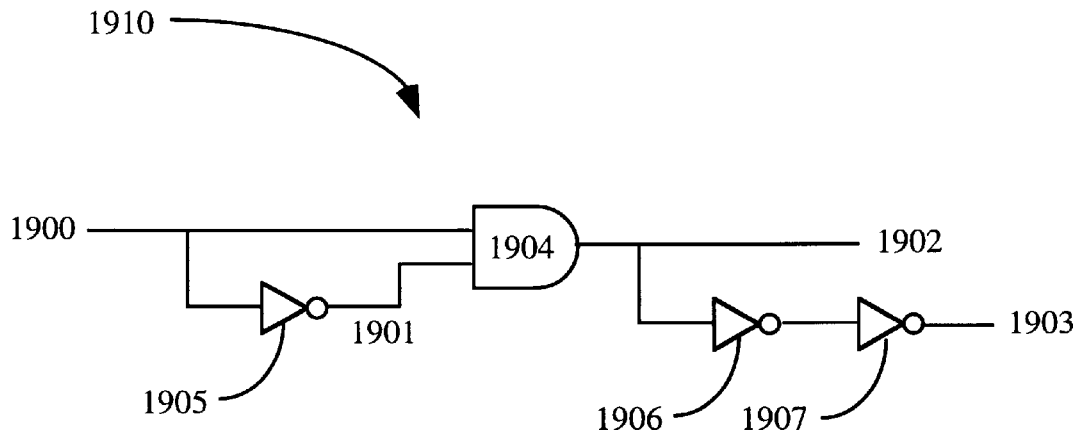
FIG. 19 illustrates a prior art self-timed circuit.
Figure 20:
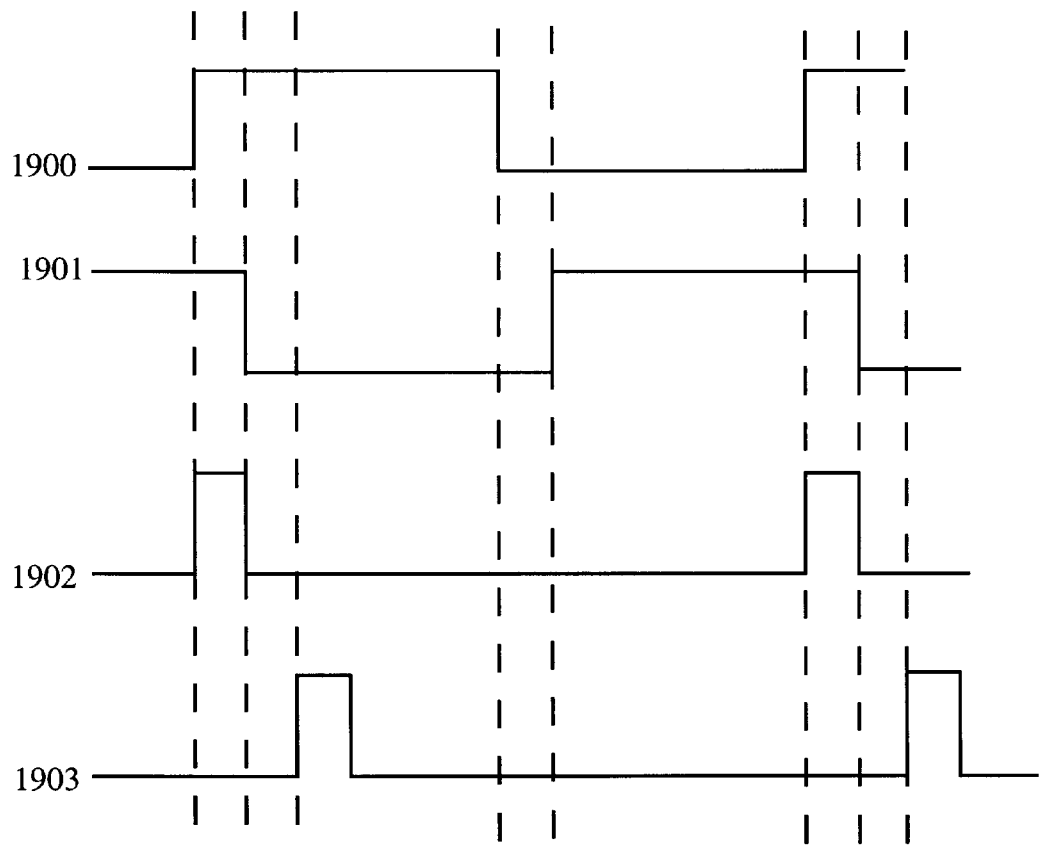
FIG. 20 illustrates timing for the circuit of FIG. 19.

Analog self-timed circuits are well known in the art. FIG. 19 illustrates a prior art analog self-timed circuit 1910 which includes an AND gate 1904 and three inverters 1905, 1906, and 1907. The AND gate 1904 receives a signal 1900, as well as signal 1901 (inverted signal 1900). As shown in the associated timing diagram of circuit 1910 in FIG. 20, signal 1901 is slightly delayed by inverter 1905. The AND gate 1904 outputs a signal 1902, wherein signal 1902 is high only if both signals 1900 and 1901 are high. Signal 1902 is further inverted, and hence delayed, twice by inverters 1906 and 1907. This twice delayed signal 1903 is shown in FIG. 20. Thus, circuit 1910 creates multiple clocks, i.e. signals 1902 and 1903.

However, circuit 1910 provides no feedback to control the delays of inverters 1905, 1906, or 1907. Thus, if the delays provided by the inverters were too small (typically caused by process or environmental variations), the pulse widths of signals 1902 and 1903 would be too small to meet circuit requirements. In this manner, even if the external clock, i.e. signal 1900, slows down, the chip does not work. In other words, an analog self-timed circuit, if malfunctional, is typically malfunctional at any speed.

Figure 21:
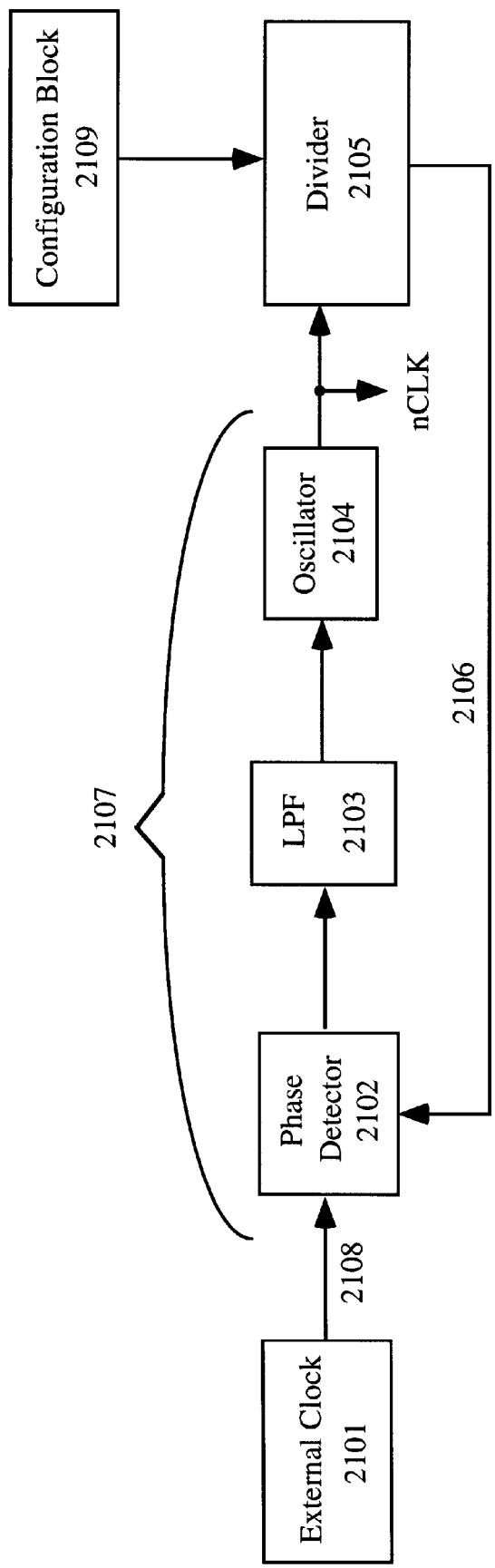
FIG. 21 illustrates a timing circuit for generating multiple internal cycles for each external clock cycle.

In contrast, the present invention creates a digital timing allocation which permits slowing down the external clock to achieve functional operation of the chip, thereby providing a more reliable method of providing accurate multiple clocks than analog self timed circuit 1910. In one embodiment, a time multiplexed FPGA provides an internal clock frequency that is a multiple of an external clock frequency, such that multiple internal cycles occur for every external cycle. Referring to FIG. 21, an external clock 2101 provides a clock signal to phase locked loop (PLL) 2107. PLL 2107 typically includes a phase detector 2102, a low pass filter (LPF) 2103, and an oscillator 2104. Oscillator 2104 operates at a frequency multiple of the clock signal provided by external clock 2101.

Divider 2105 divides the oscillator frequency to approximate the signal frequency provided by external clock 2101. To ensure accurate synchronization of these output signals to the input clock signal provided by external clock 2101, a feedback line 2106 is coupled to phase comparator 2102. Phase comparator 2102 compares the frequencies provided on input line 2108 and feedback line 2106. Phase comparator 2102 then generates an output phase-error signal that is determined by the phase difference between these two frequencies. If the frequency on line 2106 does not equal the frequency on line 2108, the phase-error signal, after being filtered by LPF 2103 (which corrects for jitter), causes the frequency of oscillator 2104 to deviate in the direction of the frequency on line 2108.

In accordance with the present invention, a high internal oscillator frequency (i.e. a 5 nsec period) allows all internal cycles to be multiples of the oscillator period. Specifically, the higher the frequency of oscillator 2104, the more fine tuned, i.e. shorter, the possible internal cycles. For example, assuming oscillator 2104 provides a frequency of 200 MHz (i.e. a 5 nsec period), then a single clock sequencer (described in detail in reference to FIG. 22A) can provide internal cycles of 5 nsec or multiples thereof. In the present invention, the sum of all the internal cycles equals the external cycle, although the internal cycles need not be equal.

Configuration bits from configuration block 2109 program divider 2105 to select the frequency division for feedback line 2106, thereby extending the frequency range of external clock 2101. Divider 2105, a conventional binary counter, is preset by configuration block 2109 every time that the divider reaches zero.

Figure 22A:
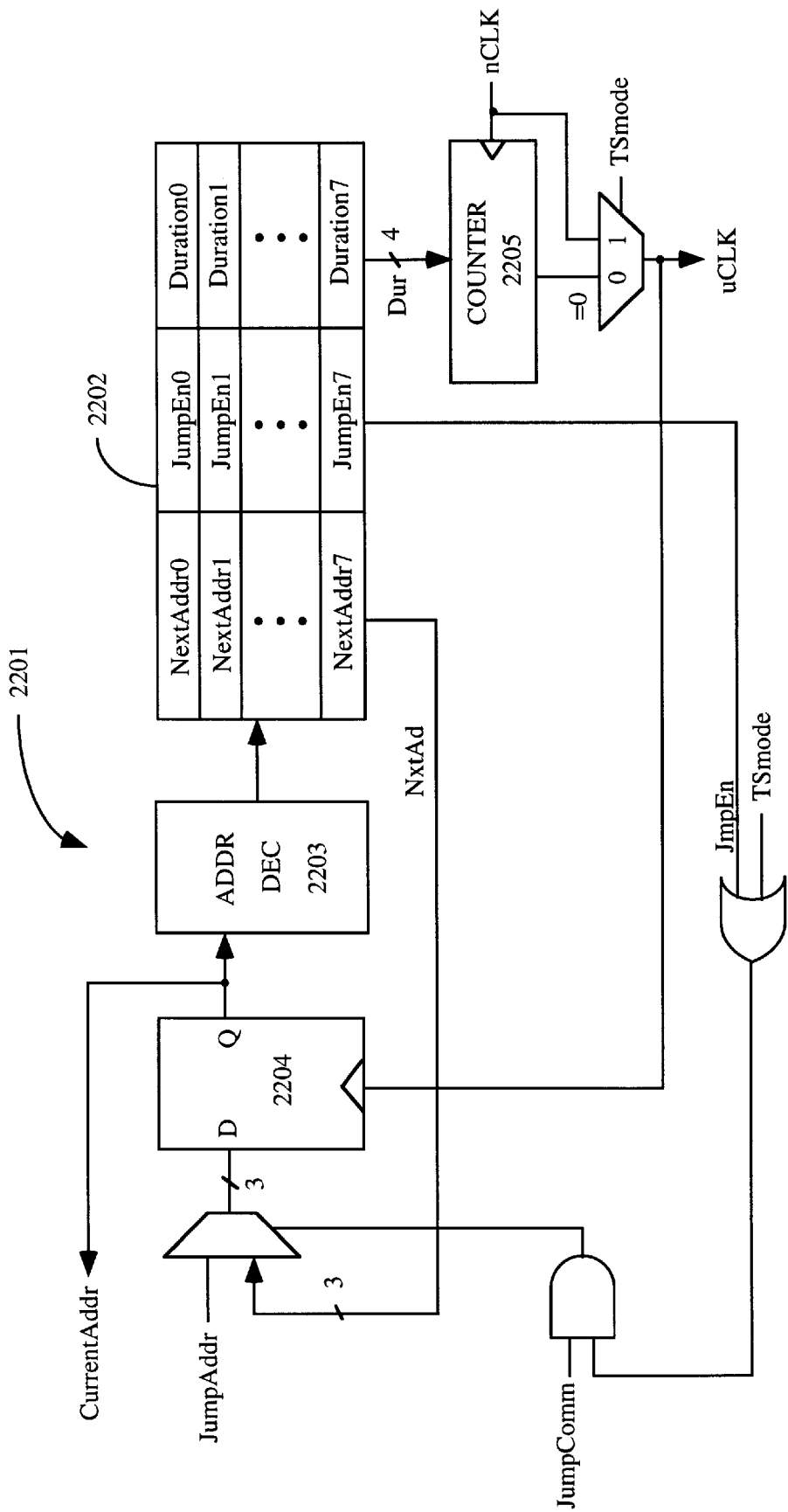
FIG. 22A illustrates a single clock sequencer in accordance with one embodiment of the present invention.

FIG. 22A illustrates a single clock sequencer 2201 in one embodiment of the present invention which receives user-generated signals from CLBs 1100 to control its operation. Specifically, user-generated signal JumpComm (i.e. generated from the user logic and provided, for example, by multiplexer 315 (FIG. 3)) directs single clock sequencer 2201 to divert from its programmed sequence of configurations, whereas user-generated signal JumpAddr (typically 3 bits) determines to which slice single clock sequencer 2201 jumps. Single clock sequencer 2201 provides user logic 1101 with the current slice address signal CurrentAddr to assist logic 1101 in determining when and where to jump.

Single clock sequencer 2201 includes a sequence table 2202 having a plurality of bits divided into three fields: NextAddr, JumpEn, and Duration. The bits NextAddr0 to NextAddr7 are addresses for the respective memory slices (i.g. NextAddr0 for slice 0, etc.). The bits JumpEn0 to JumpEn7 determine whether a user jump command is executed for that memory slice. The bits Duration0 to Duration7 indicate the duration of the respective memory slices. In one embodiment, the bits of sequence table 2202 are supplied by the configuration bitstream, whereas in other embodiments, the bits are supplied by user logic 1101.

In accordance with the present invention, the operation of single clock sequencer 2201 is mode dependent. For example, (i) in the Time Share only mode or the Time Share Plus Static mode, the nanoclock (nCLK) is equal to the micro clock (uCLK)(as set by the time share mode signal TSmode) and the only configuration switches are by user logic jumps. Note that in this case, the NextAddr is recirculated. In other words, the next address is the current address;

(ii) in an embodiment which supports a mixed mode with some Time Share and some Logic Engine CLB's, a second single clock sequencer is required: one sequencer for the Logic Engine mode and another sequencer without a sequence table for the Time Share mode. In that embodiment, each sequencer 2201 has separate JumpComm and JumpAddr input bits as well as separate CurrentAddr output bits; and (iii) in the Logic Engine mode only or the Logic Engine plus Static mode, single clock sequencer 2201 is used.

Note that single clock sequencer 2201 shown in FIG. 22A includes features, such as reset, which are well known in the art and therefore not illustrated in detail.

The steady state operation of single clock sequencer 2201 is as follows:

(i) During activation of slice 0, flip-flop 2204 contains "0" and address decoder 2203 selects slice 0 values from sequence table 2202 (i.e. NextAddr0, JumpEn0, and Duration0).

(ii) NextAddr0 gives the number of the memory slice for the next ucycle if a jump is not taken. JumpEn0 determines whether a jump is possible. Thus, if JumpEn=0, then JumpComm is ignored.

(iii) If JumpEn0=1, then user logic 1101 (FIG. 11) determines the memory slice address for the next configuration by supplying the 3 bit address JumpAddr and issuing a jump command on JumpComm. User logic 1101 calculates Jump Addr using the current configuration address on CurrentAddr (In other words, user logic 1101 indicates a jump depending upon the active slice).

(iv) Counter 2205 counts the nanocycles for the current ucycle. For example, assume counter 2205 is loaded with Duration0, counts down to zero (the '=0' signal on counter 2205), and issues a new uCLK pulse, which in turn loads flip-flop 2204 and restarts the process on the next uCycle.

Figure 22B:
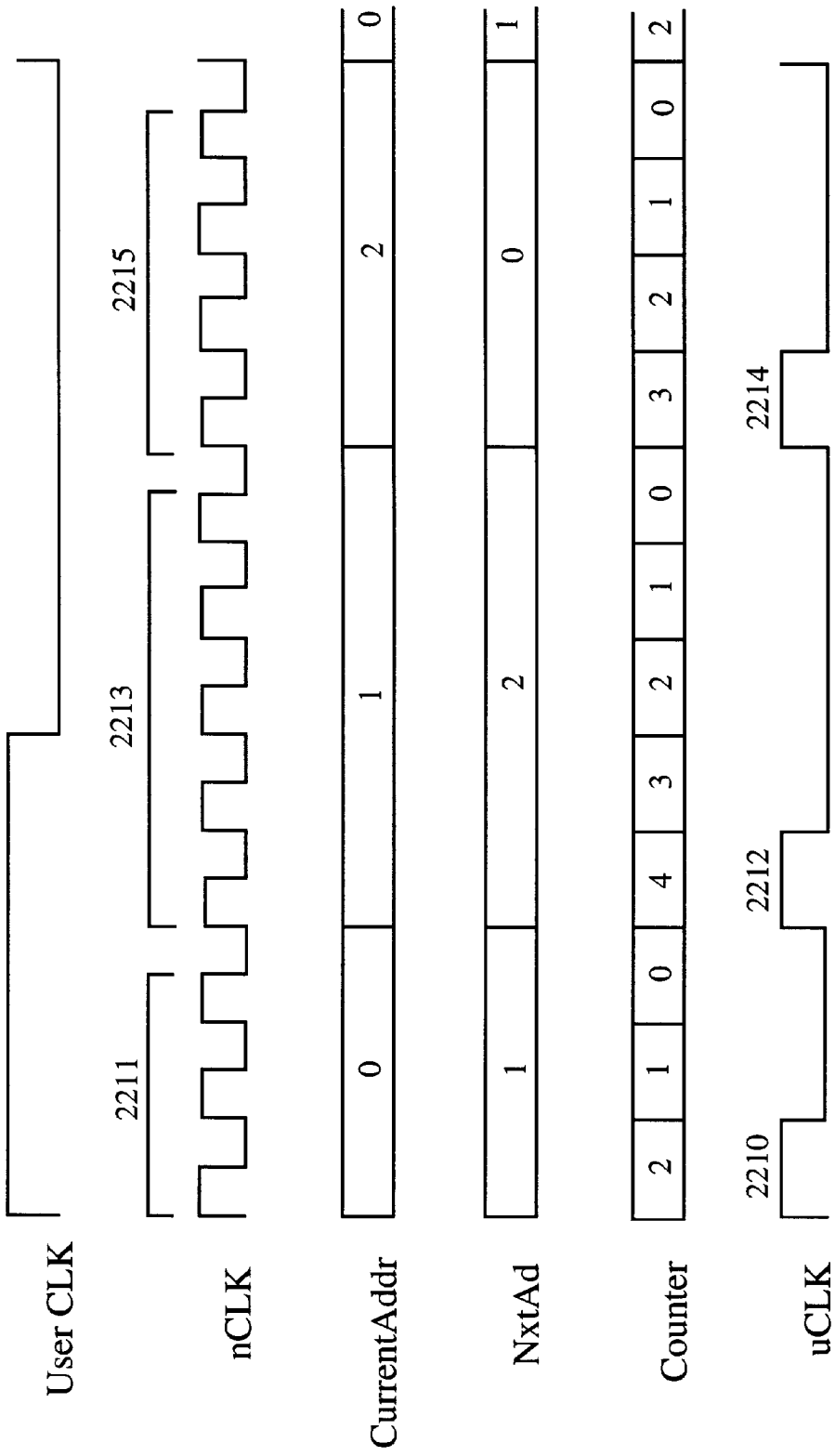
FIG. 22B shows an illustrative timing sequence for three configurations.

In accordance with the present invention, the user can program NextAddr values such that selected NextAddr signals in sequencer table 2202 for some slices are not used, i.e. for a sequence less than 8. Timing for a sequence of three configurations is shown in FIG. 22B. Specifically, the first uCycle (indicated by a uCLK pulse 2210) includes three nanoclocks 2211, the second ucycle (indicated by a uCLK pulse 2212) includes five nanocycles 2213, and the third ucycle 2214 (indicated by a uCLK pulse 2214) includes four nanocycles 2215. Note that uCLK pulse 2210 triggers loading of a counter value of "2", uCLK pulse 2212 triggers loading of a counter value of "4", and uCLK pulse 2214 triggers loading of a counter value of "3". After loading, each nanocycle pulse reduces the counter value by "1" until "0" is generated. The zero generation triggers the next uCLK pulse.

8.0 Modes of Operation

An FPGA in accordance with the invention operates in three modes. In the first mode, the time-share mode, there are multiple user cycles per flash reconfiguration (e.g., the FPGA remains at a single configuration for plurality of user clock cycles). Flash reconfiguration is generally triggered by a signal, and typically there is no predefined sequence of configurations. In the second mode, the logic engine mode, there are multiple flash reconfigurations (micro cycles) per user cycle. In this mode, flash reconfiguration is generally sequenced continuously in a predefined sequence of configurations. In the third mode, the static mode, many configurations are the same. In other words, the logic being performed remains the same when the FPGA is reconfigured, thereby appearing to be permanently resident. In this mode, flash reconfiguration is triggered by either of the above-described methods. Although some embodiments operate exclusively in one mode, other embodiments operate in a plurality of modes, either sequentially or simultaneously. Each of the modes is hereinafter explained in detail.

8.1 Time-Share Mode

Figure 25:
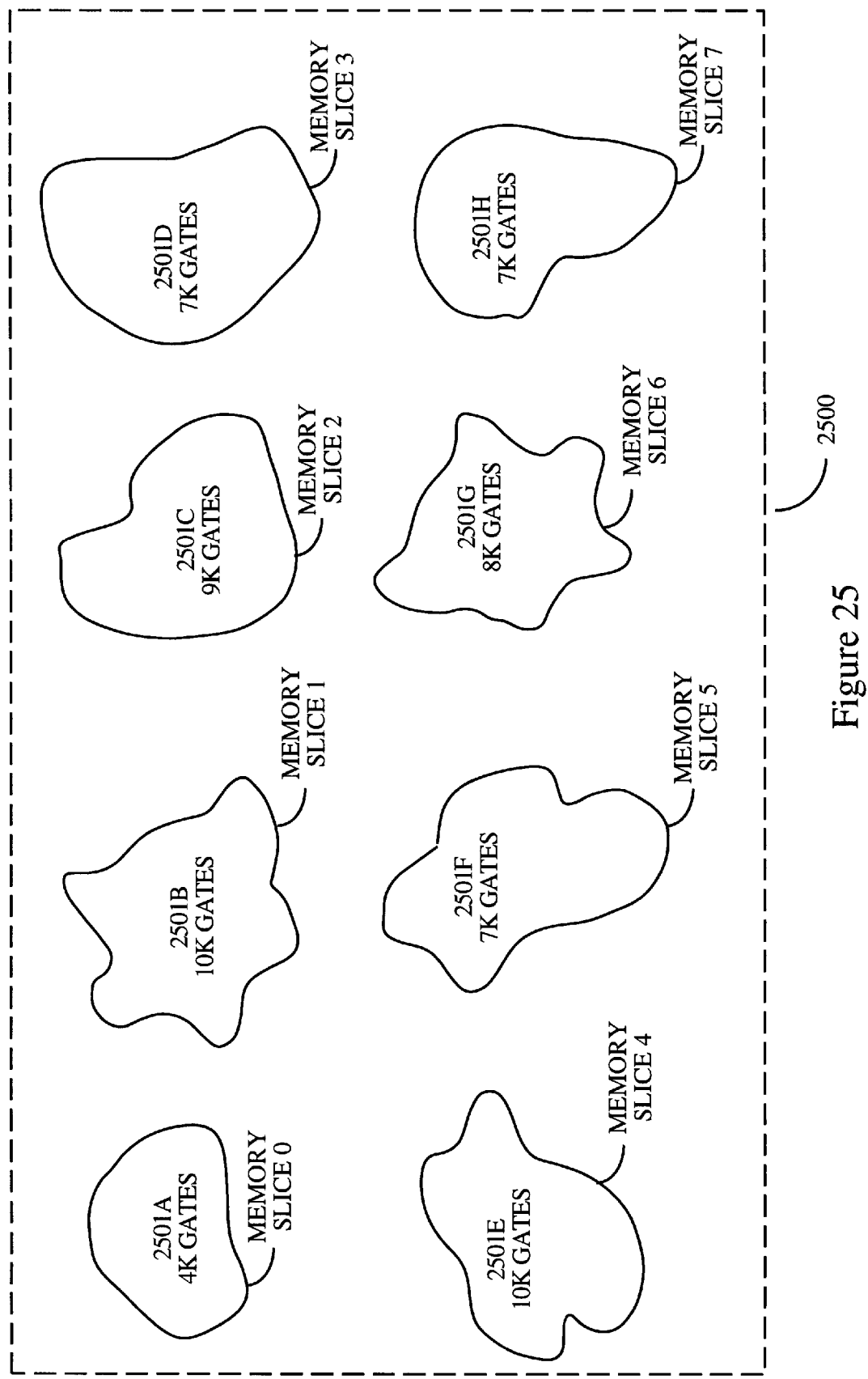
FIG. 25 illustrates the multi-function time share operating mode of a PLD.

Referring to FIG. 25, in the time-share mode, the FPGA is programmed with multiple configurations 2500, i.e., memory slices 0–7, to support different functions which do not have to be operational simultaneously. Each of the illustrated shapes 2501 represents a logic function of arbitrary size (e.g. number of CLBs) and form (e.g. routing structure). Logic functions 2501A–2501H are shown in FIG. 25. In one sequencing, the FPGA is programmed initially to perform some logic function (2501A for example), then flash reconfigured to perform a different logic function (2501H for example). The FPGA switches from any logic function to any other logic function in response to signals generated in the user's logic or provided by external pins.

In this embodiment, the FPGA stores up to eight separate configurations on-chip at the same time (each in a different memory slice). Any time that a flash reconfiguration occurs, the states of the CLB outputs are stored automatically into the previously-described micro registers, thereby allowing parameters to be passed between configurations. If a previously used configuration is recalled, all previous states may be restored so that the configuration operation can resume where it left off.

As shown in FIG. 25, each logic function 2501 requires a predetermined number of gates. In the prior art, an array of, for example, 400 CLBs implemented 10,000 gates of logic. However, in accordance with the time-multiplexing capability of the present invention, up to 80,000 gates of logic are implementable (8×10,000). FIG. 25 illustrates an embodiment in which 62,000 gates of logic are implemented in an array of 400 CLBs.

Referring to FIG. 4, note that latched signal QOLD, in addition to being provided to micro register 324, is also provided to flip-flop 322. In the above-referenced time-share mode, on the first cycle of a new configuration (which is indicated by an active global signal FirstCyc), signal QOLD is restored to the Q output terminals of flip-flop 322. In contrast, in the static mode (referenced in Section 8.3), signal FirstCyc is locally inhibited at the static mode CLBs with a configuration bit, thereby preventing signal QOLD from being loaded into flip-flop 322. Specifically, other peripheral logic (not shown) generates the signal FirstCyc. This signal is then gated with a configuration bit, thereby either inhibiting the signal FirstCyc or providing an active signal FirstCyc.

Glitches can occur on lines controlled by bits changing from one configuration to another configuration. These potential glitches restrict static mode flip-flop connections. Specifically, in contrast to combinational logic, most flip-flop input signals must remain glitch-free at all times to prevent the glitches from changing the flip-flop state. Therefore, signals such as C and SR, must be glitch-free all the way back to their sources, implying configuration bit restrictions all the way back on these paths. Additionally, signals D and EC need to be valid with certain set-up and hold times relative to clock signal C. Because for asynchronous clocks, signal C has no relationship to configuration switching times, the signals D and EC cannot have any glitches at any time due to configuration switching, thereby implying the same restrictions as signals C and SR.

8.2 Logic Engine Mode

In the logic engine mode, the FPGA is programmed to implement a single large design in stages, wherein each stage is one configuration. The FPGA typically sequences through all the configurations in a predetermined order at a rate comparable to the speed of signal propagation through each piece of logic. The results of the logic performed in one configuration are stored in micro registers for use in subsequent configurations. Results that are to be stored in flip-flops in the design are stored in micro registers and used in the subsequent passes through the micro cycles. Although this process is slower than prior art FPGAs because of re-use of the CLBs, the chip capacity is significantly increased.

In this mode, each flash reconfiguration is called a "micro cycle". One iteration through all the micro cycles is called a "major cycle". A "user cycle" is the time at which the user's fastest clock cycles. Typically, output signals must be updated once per user cycle. In the simple case, a user cycle is identical to a major cycle. If all user logic is synchronous and there is either only one clock (a "user" clock) or all other clocks are derived from the user clock, then that user clock defines a user cycle which is the same as a major cycle. The user clock triggers the micro cycle sequencing through all the configurations or the sequencer may continually cycle through all micro cycles. Note that the major cycle may be synchronized with the user clock (for example, configuration 0 may be synchronized with an upward transition of the user clock).

Typically, in the logic engine mode, combinational logic in the user's design is divided into LUTs or whatever logic primitive is available on the FPGA. The "level" of a LUT in a design is defined as follows: the level of a LUT with connections only to flip-flop output terminals and chip input pins is "1", whereas the level of all other LUTs is one greater than the largest level of the LUTs that generate its input signals. Combinational logic cycles are broken by ignoring the LUT input signal that depends on the LUT output signal. The largest level of any LUT in the design is called the depth of the design.

Figure 30:
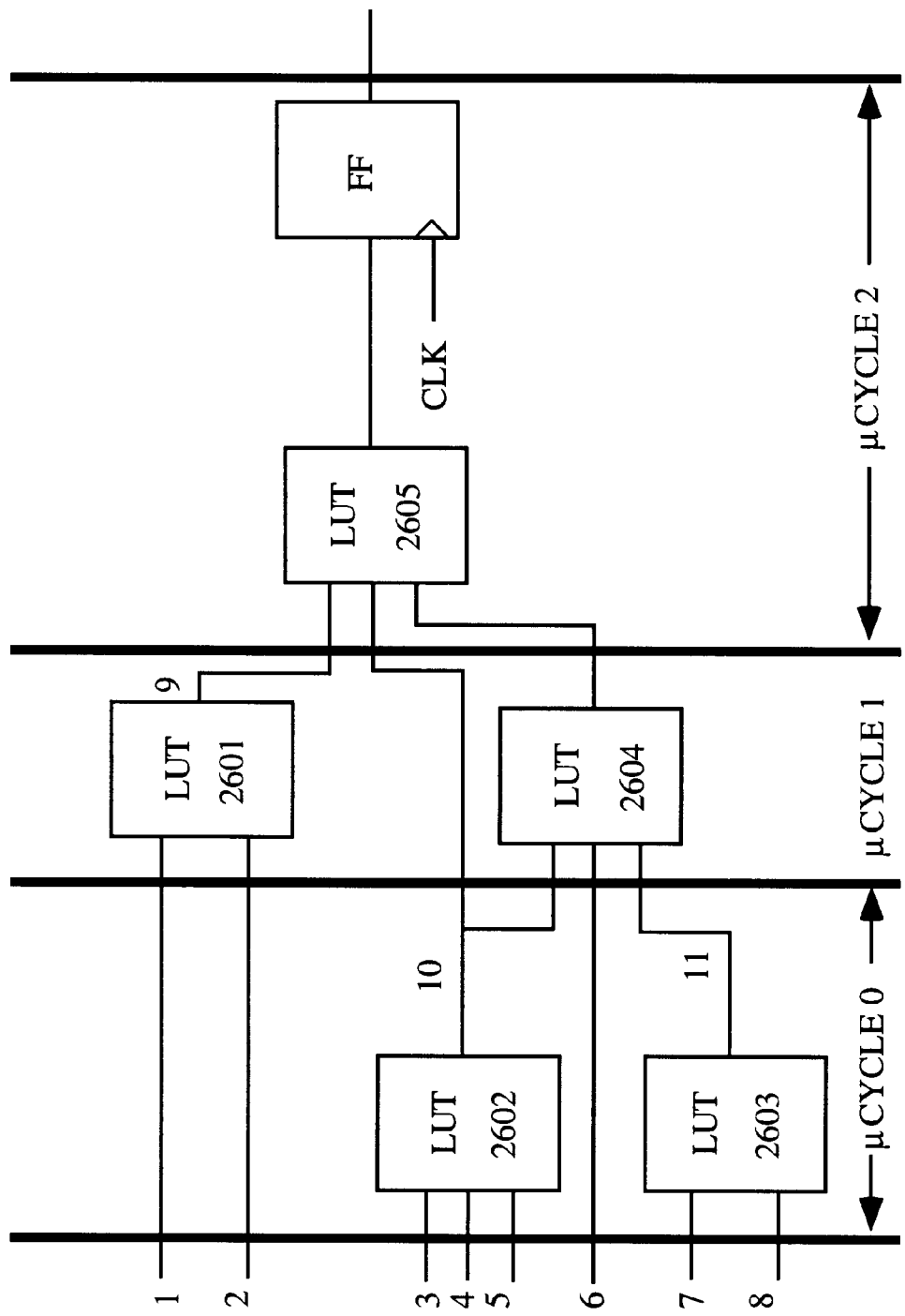
FIG. 30 illustrates the rescheduled logic of FIG. 26.

When dividing the logic into micro cycles, serial connections from one LUT to the next indicate that the LUT generating the source of the signal must be evaluated in a micro cycle earlier (or the same micro cycle) than all destinations of the signal. Therefore, each LUT is evaluated in the micro cycle corresponding to its level, wherein the LUT output signals are held in micro registers. The level and the depth of the design indicate the number of micro cycles required to evaluate the logic. These restrictions are addressed later in reference to FIGS. 26 and 30.

As mentioned previously, LUTs and interconnect are reconfigured for each micro cycle in the logic engine mode with intermediate states held in the micro registers for access in later micro cycles. In the example shown in FIG. 26, a circuit design requiring five virtual LUTs 2601–2605 is implemented using only three real LUTs. During the first micro cycle, $\mu$cycle 0, LUTs 2601–2603 are configured, receive signals from nets 1–8, and produce results on nets 9, 10, and 11. The states of nets 9, 10, and 11 are latched into micro registers and the new configuration word, corresponding to the second micro cycle $\mu$cycle 1, is read. In $\mu$cycle 1, LUT 2604 is implemented by reusing one of LUTs 302–304 (FIG. 3) previously used in $\mu$cycle 0. Access to nets 10 and 11 are accomplished via three of output multiplexers 313–320 (FIG. 3). In a similar manner, in $\mu$cycle 2, LUT 2605 is implemented by reusing one of LUTs 302–304 (FIG. 3).

Figure 26:
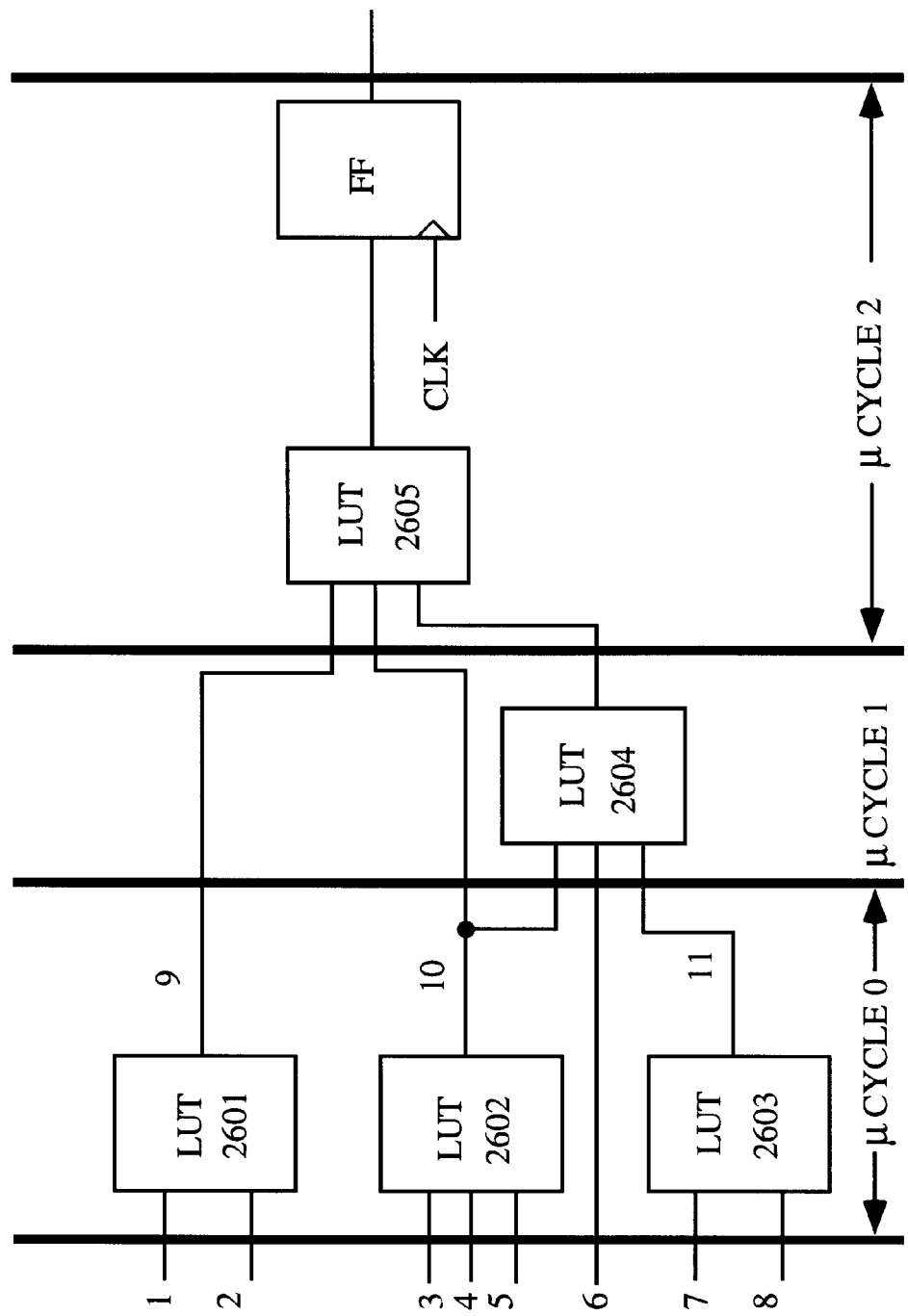
FIG. 26 shows an implementation of the logic engine mode in a PLD.

For the sake of simplicity, FIG. 26 only shows three micro cycles. However, assuming all eight memory slices are used for configuration data, an FPGA in accordance with the present invention holds up to eight times the amount of logic of equivalent prior art circuitry. The logic implemented however is slower, depending on the number of logic levels in the critical path and the user clock requirements. For example, if a critical path is only two levels deep, but the circuit design is implemented using eight micro cycles, then the circuit design will be at least four times slower than if the design were implemented in a prior art FPGA (or in timeshare or static mode, as described in detail herein). If, on the other hand, the circuit design had eight or more levels of logic in its critical path, the design as implemented in the present invention may only be marginally slower than a prior art FPGA. Thus, the logic engine mode gains significant density at some expense of speed.

Note that the logic depth of the design may not be the same as the number of configurations built into the FPGA. For example, if the design requires only three configurations, (i.e. a calculation is finished in three configurations), then the sequencer may skip other configurations (for example, configurations 4–8 in an FPGA having eight configurations) and return to the first configuration. In this manner, there is less latency after the completion of the logic (i.e. after the third micro cycle ($\mu$cycle 2) to the start of the next (i.e. potentially at the next micro cycle instead of 5 cycles later). Thus, in this example, the major cycle is shortened to fit the design. In one embodiment, this termination count in the sequencer, which is set for each user design, is stored in a programmable register.

With the basic chip architecture, i.e. for an "n" micro cycle architecture, it would appear that only a user design up to n levels deep can be evaluated. Although the average path depth in a circuit design is typically between three and four levels, it is not uncommon to have a few long paths in a typical circuit design. A design may be modified to fit into fewer micro cycles than the depth of the design in order to improve performance or to fit a design when the user's design has more levels of logic than the number of available micro cycles. The present invention provides the following alternate solutions.

1. Signals are directed around the micro registers using a "bypass" connection (for example, refer to signal G provided to multiplexers 313–314 (FIG. 3)). These signals are used by other logic in the current micro cycle, but not by logic in other micro cycles unless they are also stored in the micro register.

2. The micro register holds more values than the total number of micro cycle configurations in the FPGA, thereby allowing access to results that were generated more than one major cycle ago. Multiple passes through the configurations (major cycles) are required to complete the calculation.

3. Provide a free-running micro cycle sequence and supply the user clock as an enable on the results of the longer calculation. Thus, in this solution, the user cycle contains more than one major cycle. Optionally, this solution includes a micro cycle sequence count longer than the number of micro cycles, so that the number of micro cycles in a circuit design need not be a multiple of the number of real micro cycles built into the chip.

In solution 3, each LUT is used on only one of the multiple major cycles in each user cycle. On other major cycles, the LUT is calculating a value which is ignored. Thus, the user clock is needed as an enable signal to ensure the ignored values are not stored, configuration bits are needed to indicate on which major cycle to save results, and a global signal is needed to indicate which major cycle is active. Optionally, the indication of when to save the results and the global active signal can be constructed with logic on the FPGA.

8.2a Multiple Clocks/Asynchronous Clocking

Although the above description of the logic engine mode implies a single clock, many user circuit designs do not have this restriction. There are two different categories of clocked circuits: multiple related clocks and unrelated (asynchronous) clocks.

Figure 39:
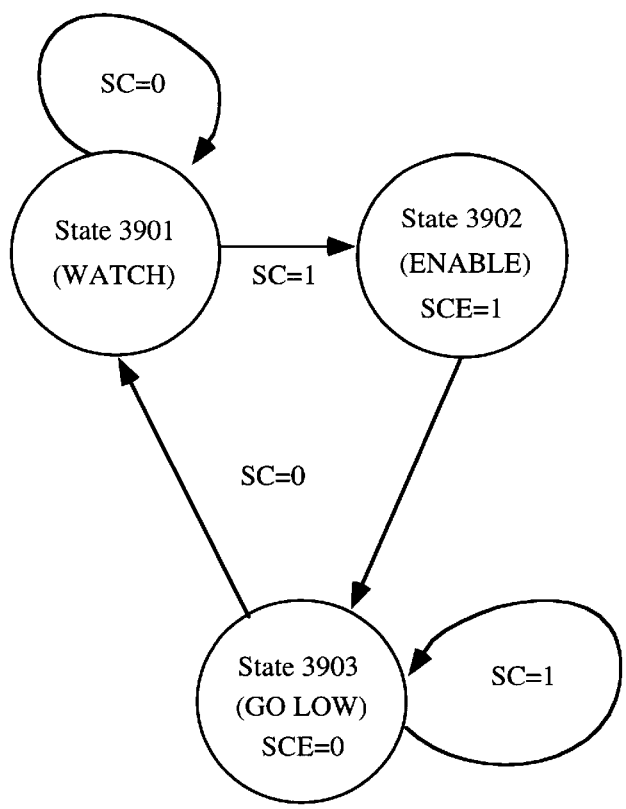
FIG. 39 illustrates a state machine which provides appropriate waveforms if the fastest clock is implemented as the user clock, and all other clocks are implemented with micro cycle register enable signals.
Figure 39A:
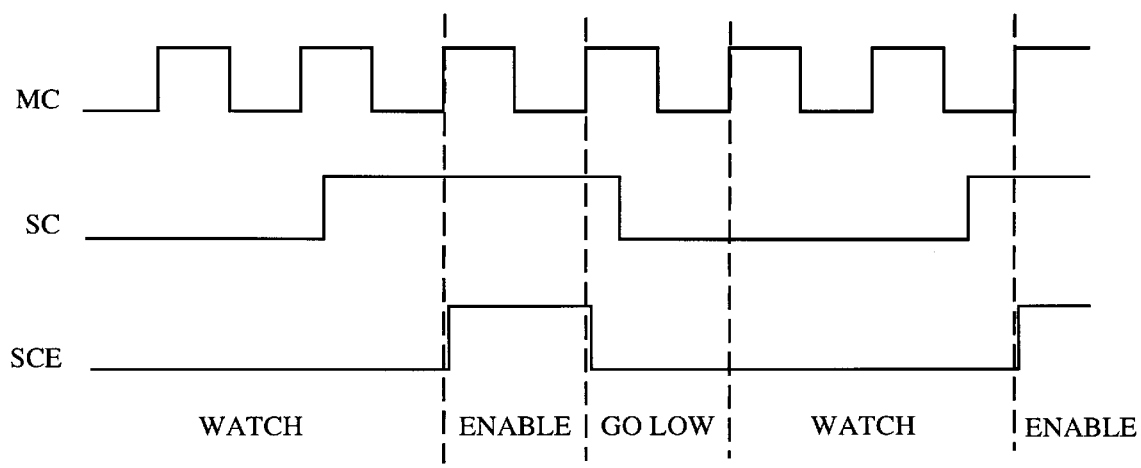
FIG. 39A shows a timing diagram of the slow clock signal, the enable signal, and the master clock signal of FIG. 39.

If a circuit design has more than one clock and all clocks are multiples of the fastest clock, the fastest clock is implemented as the user clock, and all other clocks are implemented with the micro cycle register enable signals. For example and referring to FIGS. 39 and 39A, as soon as possible after the rising edge of the slow clock signal SC (as determined in state 3901), the slow clock enable signal SCE goes active (in state 3902) and remains active for one major cycle. After one major cycle (as determined by major clock signal MC), the slow clock goes low (in step 3903) and the system returns to watching for the rising edge of the slow clock (state 3901) when slow clock SC returns to zero. The enable signal state machines are either provided as special-purpose logic on-chip or built from FPGA logic in the CLBs. This technique can also be used to implement slower clocks that are not a multiple of the fastest clock.

Figure 27:
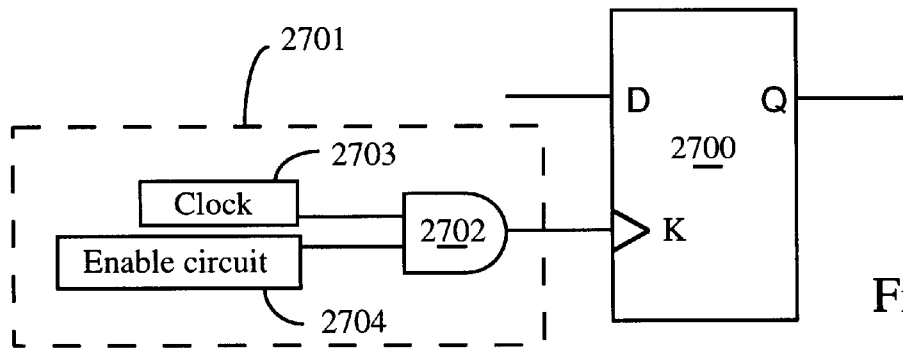
FIG. 27 shows a gated clock flip-flop.

For example, FIG. 27 illustrates part of a user's design in which flip-flop 2700 receives a clock signal from clock gating circuitry 2701. In this embodiment, clock gating circuitry 2701 includes an AND gate 2702 which receives input signals from a clock 2703 and an enable circuit 2704. In this manner, clock terminal K of flip-flop 2700 receives an enable signal from AND gate 2702 only if both signals from clock 2703 and enable circuit 2704 are a logic high. Clock 2703 provides signals every major cycle (i.e. provides the fastest user clock signal in the PLD). In one exemplary user design, enable circuit 2704 provides signals every major cycle. Thus, if clock gating circuitry 2701 is identified as being coupled to user-designed flip-flop 2700, two important pieces of information are determined. First, the signal provided by clock 2703 (the user clock) and the signal provided to the clock terminal K of flip-flop 2700 are related, and second, the signal provided to the clock terminal K of flip-flop 2700 is slower than the user clock. Thus, the slower clock signal is identified. The user's design may be optimized so that this slower signal is connected to the clock enable pin on the micro register enable, thereby eliminating AND gate 2702.

Figure 28:
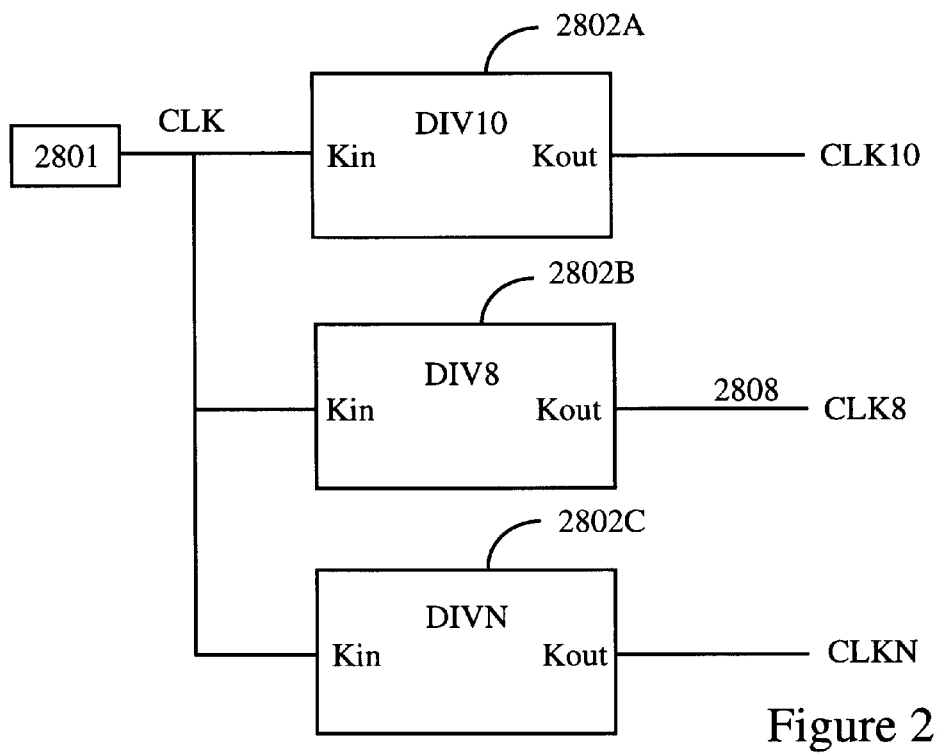
FIG. 28 illustrates various library elements and their relationship to the micro cycle clock.
Figure 29:
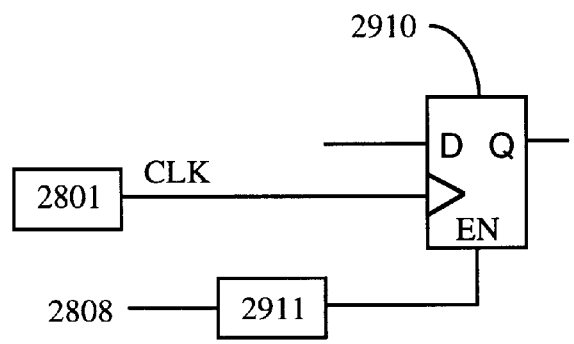
FIG. 29 shows a clock-enabled flip-flop.

In another embodiment, a library element (gates, flip-flops, or other logic functions) specifies clock divisions (in other words, identifies the micro clock chosen by the end user). FIG. 28 shows illustrative library elements 2802A, 2802B, and 2802C and their relationship to micro cycle clock 2801. Specifically, library element 2802B specifies that clock signal CLK is divided by 8, thereby providing an output signal CLK8. Finally, generic library element 2802N specifies that clock signal CLK is divided by N, wherein N is a number provided by the user. However, although the user designs using a clock divider in this embodiment, the present invention typically implements the clock divider in the manner shown in FIG. 27. In other words, clock 2801 provides the micro cycle clock signals, and the dividers associated with library elements 2802A–2802N provide the enable signals. Output signals CLK10, CLK8, and CLKN are the signals provided to the clock input terminals of the flip-flops (not shown) determined by the user during schematic capture. In one embodiment shown in FIG. 29, these signals are implemented by providing a divided signal, for example the divided signal on output line 2808, to a circuit 2911 which operates in accordance with the state machine shown in FIG. 39. Circuit 2911 provides slow clock enable signals to the enable EN pin of a micro register 2910.

A portion of the fast logic may run, for example, at two to four times the speed of the system as a whole. In the present invention, this logic is duplicated and implemented, for example, in micro cycles 1–4, and then again in micro cycles 5–8. This implementation, i.e., fitting two cycles of the fast clock in a single major cycle, doubles the speed of the fast logic with respect to the rest of the logic.

8.2b Sequencer for Logic Engine Mode/Micro Cycle Sequencing

The sequencer sequences through micro cycles taking input from the original configuration, and user-generated signals. For best performance of a circuit design, the micro cycle is made of as short duration as possible. The micro cycle duration is set by the amount of time needed to:

1. Read the micro cycle configuration from configuration memory;
2. Propagate signals to the LUTs;
3. Evaluate the LUT; and
4. Set up the micro register for the next micro cycle. If multiple levels of logic are evaluated in one micro cycle, steps 2 and 3 are repeated (Note that the latency of step 1 can be hidden by the pipeline latch, so it does not contribute to the μcycle duration.).

The logic included in an FPGA may be divided into fast logic, i.e. logic that rapidly performs its operation, and slower logic, i.e. logic that requires significantly more time (in comparison to the time required by the fast logic) to complete its operation. In accordance with one embodiment of the present invention, the fast logic is evaluated a plurality of times in predetermined micro cycles such that the fast logic is evaluated at least twice in any major cycle. This evaluation is done using an iterative technique (described in reference to FIG. 33) or a subroutine technique (described in reference to FIG. 34). In other words, assume the fast logic has twice the clock rate of the slow logic. In this example, the major cycle is set at the slow logic clock rate, wherein the fast logic executes twice per major cycle.

Figure 33:
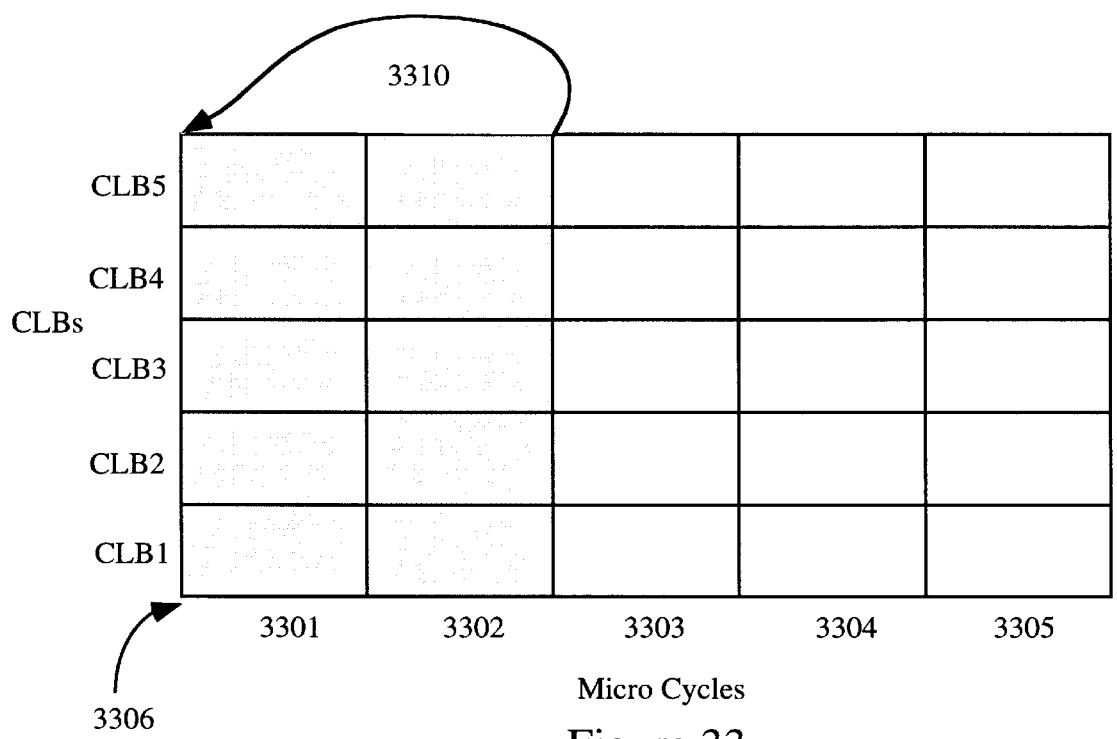
FIGS. 33 and 34 illustrates micro cycle sequencing in a time-multiplexed PLD.

FIG. 33 illustrates a representation of CLBs 1–5 through time, specifically through micro cycles 3301–3305. As previously described, each CLB 1–5 typically has a different configuration for each micro cycle 3301–3305. The shaded area 3306 represents logic to be evaluated a plurality of times in each major cycle as indicated by an arrow 3310.

Specifically, in this embodiment, micro cycle 3302 follows micro cycle 3301. After completion of the configuration associated with micro cycle 3302, the fast logic generates the next micro cycle address indicating a return to the configuration associated with micro cycle 3301 (represented by arrow 3310). The configurations for CLBs 1–5 associated with micro cycles 3301 and 3302 then repeat. In one embodiment, the repeat count is a fixed number, such as two. In that embodiment, CLBs 1–5 are reconfigured four times during micro cycles 3301 and 3302 (i.e. 3301, 3302, 3301, 3302, 3303 . . . ).

In another embodiment, the configurations associated with micro cycles 3301 and 3302 are repeated until a condition (supplied to the conditional branch logic) is met. After micro cycles 3301 and 3302 are repeated the appropriate number of times, micro cycles 3303, 3304, and 3305 follow sequentially (i.e.(3301, 3302), . . . (3301, 3302), (3303, 3304, 3305)). Thus, the logic associated with micro cycles 3301 and 3302 is evaluated many times more often than the logic associated with micro cycles 3303, 3304, and 3305. Because the logic associated with micro cycles 3301 and 3302 is evaluated more often than the logic associated with micro cycles 3303, 3304, and 3305, the logic has a faster response and so appears to run faster. Thus, the iteration through micro cycles 3301 and 3302 typically occurs multiple times per major cycle, whereas the sequence through micro cycles 3303, 3304 and 3305 typically occurs once per major cycle.

Figure 34:
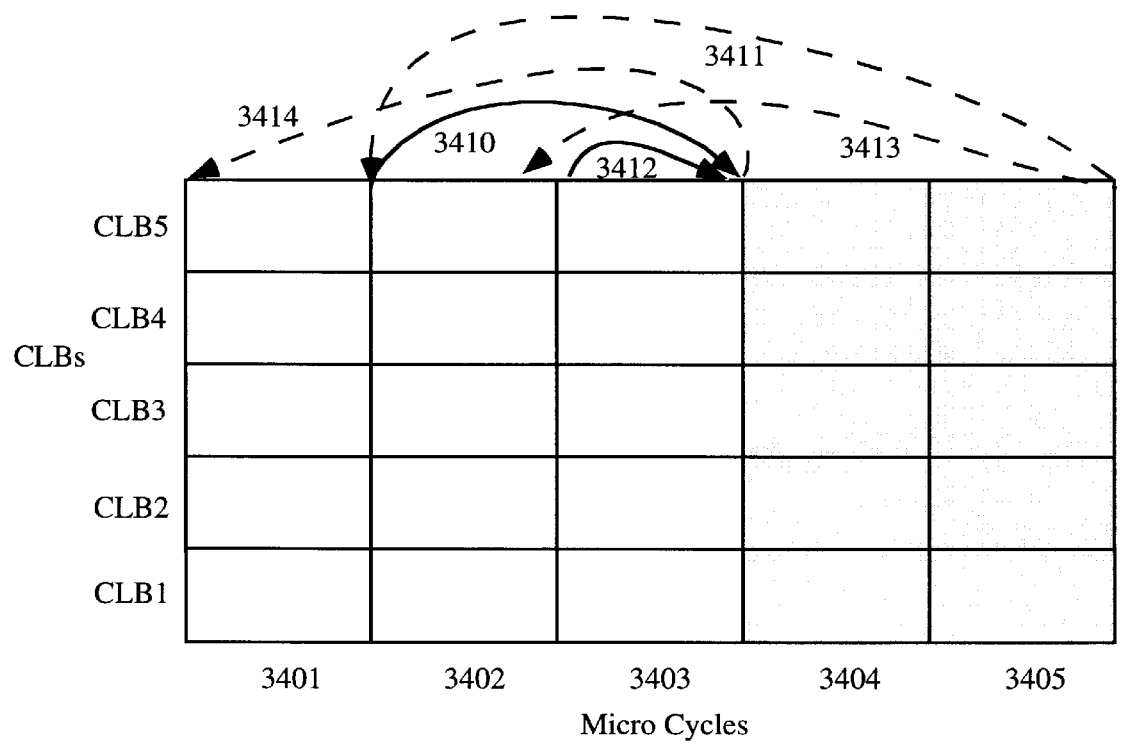

Alternatively, in another embodiment, the fast logic is analogous to a subroutine call. In other words, the subroutine is selectively called anywhere in the micro cycle sequence, and returns to the original micro cycle sequence. FIG. 34 illustrates a representation of CLBs 1–5 through micro cycles 3401–3405. In this embodiment, after the slow logic configurations of CLB1–CLB5 associated with micro cycle 3401, the fast logic configurations associated with micro cycles 3404 and 3405 are called (represented by arrow 3410) and analyzed. After completion of micro cycle 3405, the program returns (represented by arrow 3411) to analyze the slow logic configurations provided in micro cycle 3402. Then, the program once again calls the fast logic configurations in micro cycles 3404 and 3405 (represented by arrow 3412). After completion of micro cycle 3405, the program returns (represented by arrow 3413) to analyze the slow logic configuration in micro cycle 3403. Finally, the program returns to micro cycle 3401 (represented by arrow 3414) to repeat the total sequence. Thus, in this embodiment the program follows the logic configuration sequence associated with micro cycles 3401, 3404, 3405, 3402, 3404, 3405, and 3403.

8.2c The Scheduler

The assignment of logic in the user's design to configuration slices in the logic engine mode is called scheduling. Scheduling may be done manually, but is more conveniently done automatically by a program called the Scheduler.

Scheduling is not arbitrary. In order for a circuit, for example the circuit in FIG. 26, to produce the correct result in one major cycle, each LUT must be scheduled in a micro cycle no earlier than all the LUTs that generate the input signals to it. Further, there are two requirements for flip-flops. First, each flip-flop must be scheduled in a micro cycle no earlier than all the LUTs that generate input signals to the LUT. Second, each flip-flop must be scheduled in a micro cycle no earlier than all the LUTs or the flip-flops that it drives.

Figure 26A:
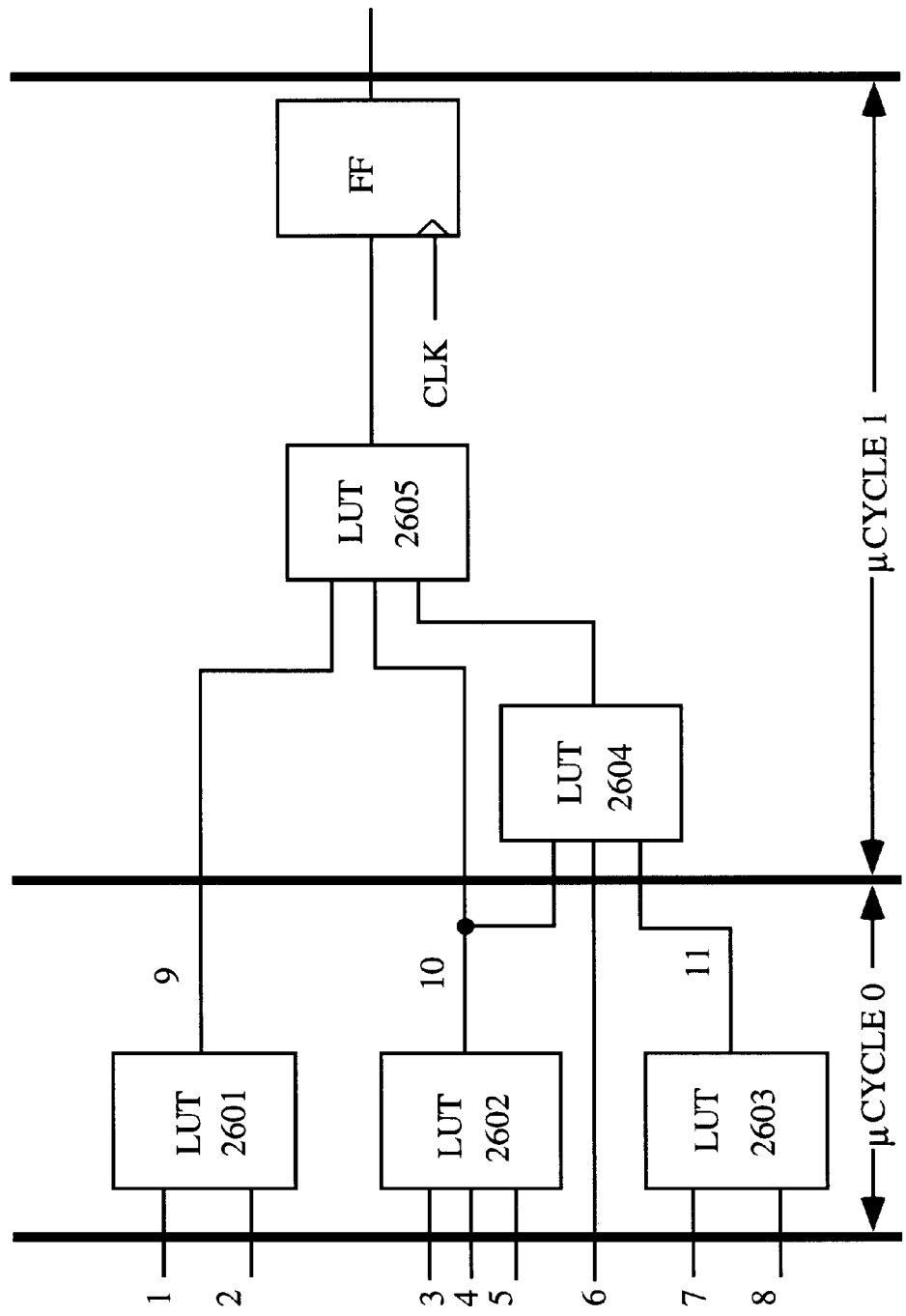
FIG. 26A illustrates a compression method in accordance with one embodiment of the present invention in which pairs of the levels on the critical path are merged into a single level using the micro register bypass to fit two LUTs serially in the same micro cycle.
Figure 26B:
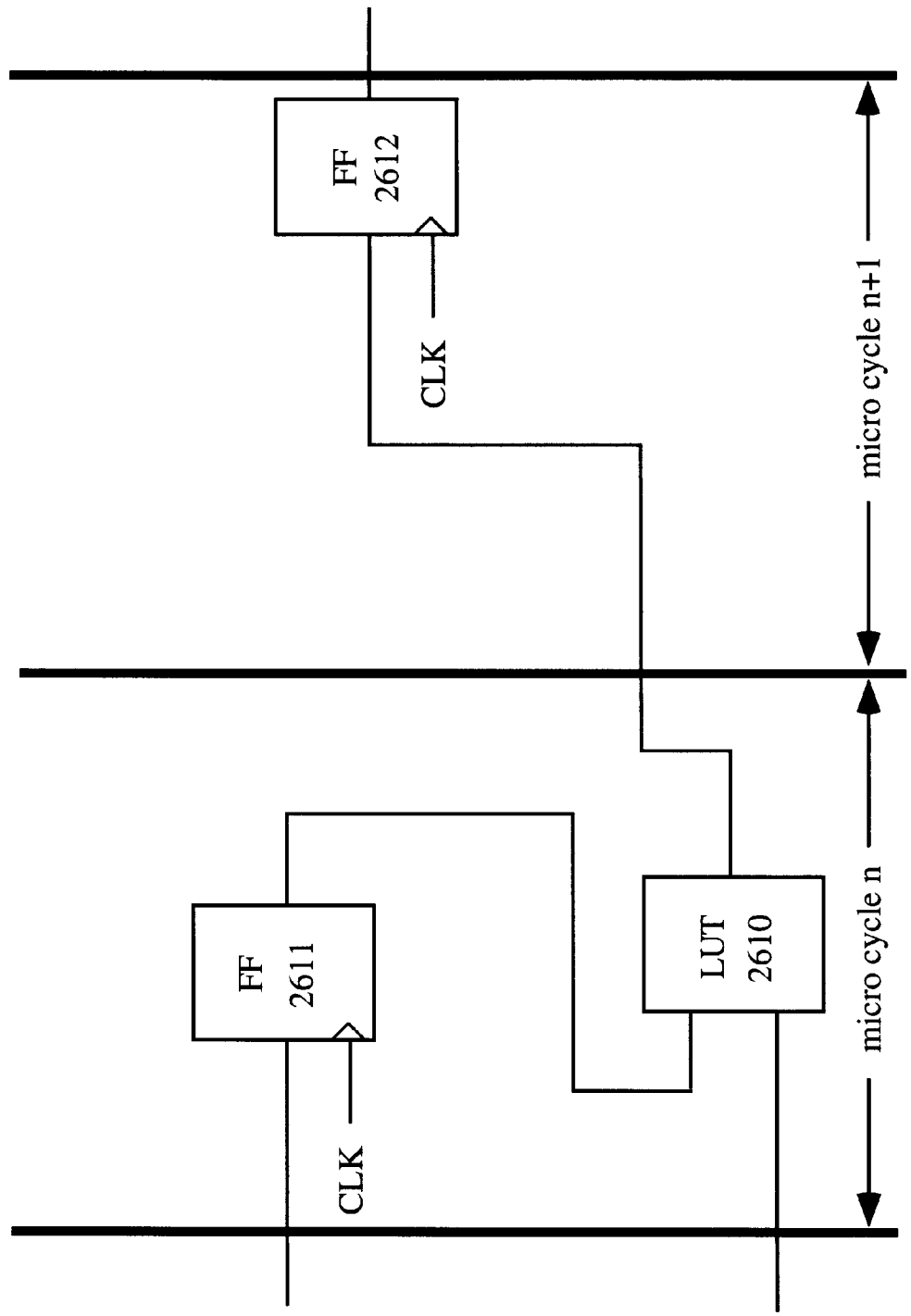
FIG. 26B shows two necessary scheduling relationships between a flip-flop and other elements in the device.

Referring to FIG. 26B, flip-flop 2611 satisfies the second requirement, i.e. is scheduled no earlier than LUT 2610 (in this case, in the same micro cycle n as LUT 2610). Thus, LUT 2610 gets the value of flip-flop 2611 from a previous user cycle. In this manner, the output signal of flip-flop 2611 will not change until micro cycle n+1. Therefore, flip-flop 2611 gets sampled for the input signal of LUT 2610 at the end of micro cycle n. Note that flip-flop 2611 could have been scheduled in any later micro cycle and LUT 2610 could have been scheduled in any earlier micro cycle. Moreover, flip-flop 2612 satisfies the first requirement, i.e. is scheduled in a micro cycle no earlier than LUT 2610 (in this case, in a later micro cycle). Note that flip-flop 2612 could also have been scheduled in micro cycle n or in any micro cycle after micro cycle n+1.

In accordance with the present invention in the logic engine mode, a software program (hereinafter referred to as the "Scheduler") uses a technique known as levelization to identify the critical path in the design. In the simplest case, the design is assumed to be a synchronous design, with all flip-flops clocked by the same clock signal. (Note that the transformation of a multiple clock design to a single clock design with clock enable signals is discussed in further detail in Section 8.2f.) The first (lowest number) micro cycle is synchronized with the rising edge of the user clock. All combinational logic is evaluated and all flip-flop values are updated in one pass through the configurations. Each user clock cycle involves an evaluation of all micro cycles.

Assuming that only one LUT or CLB's combinational logic will be evaluated in each micro cycle (in other words, propagation will not occur through more than one LUT per micro cycle), one micro cycle duration consists of one LUT delay plus the interconnect delay to transfer the input signals to the LUT input terminals. Micro registers hold combinational logic intermediate values for use in later micro cycles. Micro registers also hold flip-flop values for use in the next user cycle which is evaluated on the next pass through the micro cycle.

Given these restrictions, the design can be scheduled using levelization algorithms. Specifically, each LUT that takes input signals only from chip input pins or flip-flops is given level 1. Other LUTs are given a level number one greater than the largest level of any input. This technique produces an As-Soon-As-Possible Schedule.

As-Soon-As-Possible scheduling, shown in FIG. 26, schedules each LUT as soon as all input signals are ready. As Late As Possible scheduling, shown in FIG. 30, schedules each LUT in the micro cycle before its output signal is required. Other schedules are possible, including those that increase the number of micro cycles to reduce the number of LUTs needed in each micro cycle. For example, in FIG. 26, if the Scheduler is allowed to use 5 micro cycles, the Scheduler could schedule each LUT in its own micro cycle, save all results in micro registers, and use results stored in the micro registers during previous micro cycles as input signals. In this manner, only one real LUT is required to build the design.

Although levelization gives a partial order of evaluation, there is significant leeway in the partial order for LUTs that are not on a critical delay path. To this end, the Scheduler may identify LUTs not within the critical path and reschedule their evaluation into other micro cycles so as to minimize the number of LUTs required per micro cycle. For example, comparing FIG. 26 and FIG. 30, LUT 2601 has been rescheduled (by the Scheduler) to be evaluated during micro cycle 1. By doing this, the number of physical LUTs required to implement the circuit design is reduced from three to two. Because LUT 2601 is not in the critical path, rescheduling that LUT into micro cycle 1 does not impact circuit performance.

Optimization methods can improve scheduling by: (i) minimizing the number of real LUTs required in any micro cycle, (ii) minimizing the number of micro cycles each net appears in, and (iii) maximizing the number of pins of each net routed in the same micro cycle.

Figure 40:
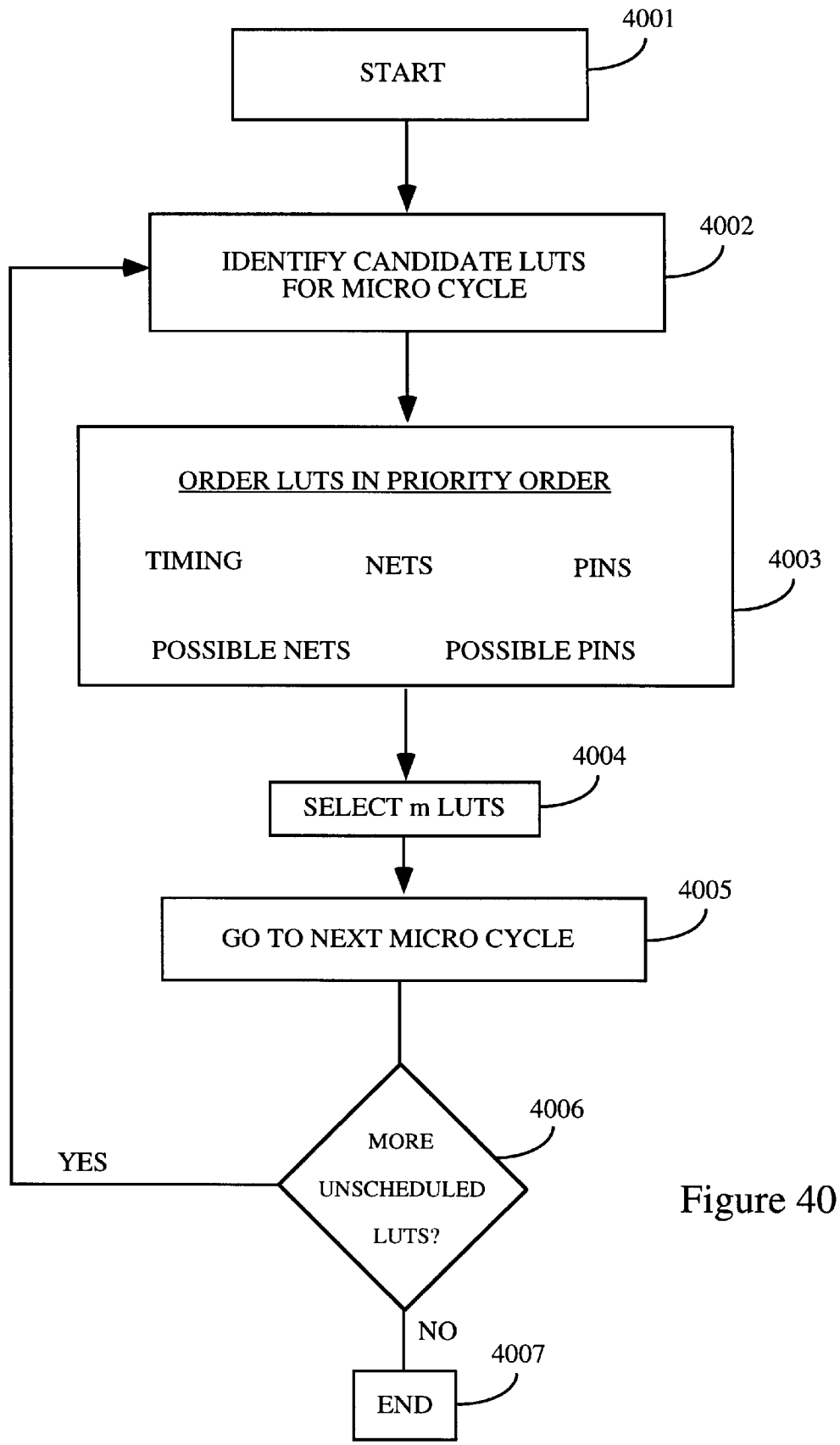
FIG. 40 shows a flow chart for optimizing scheduling in accordance with the present invention.

A method for optimizing scheduling i.e. a variation of a technique known as list scheduling, is described in reference to FIG. 40:

1. Start at the first micro cycle (step 4001).
2. Identify all LUTs that may be scheduled in this micro cycle (step 4002), i.e. those LUTs whose input signals come from chip input pins, flip-flop output terminals, or LUTs that have had all the LUTs that generate their input signals already scheduled in an earlier micro cycle.
3. Order the LUTs in priority order (step 4003) based on:
   a. Timing—LUTs with the earliest latest-possible schedule are first, as determined by an As-Late-As-Possible scheduling of the LUTs.
   b. Nets—LUTs that have input nets in which all other destination LUTs are already scheduled.
   c. Pins—LUTs that include a pin on a net that has had at least one of its destination instances scheduled.
   d. Possible Nets—LUTs that will complete a net that may be introduced in this micro cycle by the addition of a LUT earlier in the list.
   e. Possible Pins—LUTs that include a pin on a net that may be introduced in this micro cycle by the addition of a LUT earlier in the list.
4. Select the m LUTs with the highest priority, wherein m is the number of real LUTs in the FPGA. Label those m LUTs with the current micro cycle number. Remove them from the list of identified LUTs. (Step 4004).
5. Go the next micro cycle (step 4005).
6. If there are more unscheduled LUTs (step 4006), go back to step 4002, otherwise exit (step 4007).

In another embodiment, the m LUTs are selected one at a time, wherein step 4003 is re-executed after each selection.

Although this embodiment is slower, ordering of the LUTs after each selection may find a result that takes fewer micro cycles or is easier to place and route.

8.2d Scheduling Compression

When the number of levels of logic in the critical path is greater than the number of configurations in which the FPGA design is to be implemented, the Scheduler compresses the critical path. Referring to FIG. 26A, compression merges pairs of the levels on the critical path into a single level using the micro register bypass to connect the two LUTs, i.e. LUTs 2604 and 2605, serially in the same micro cycle, i.e. micro cycle 1. In one embodiment, compression selects the pair to merge based on the minimal expansion of the number of LUTs on the critical path.

8.2e Simultaneous Scheduling and Placement

The logic in one configuration cannot access more than a fixed number of signals generated in the same LUT in other configurations. This limitation is a constraint between scheduling (the configuration) and placement (the real LUT), which makes decoupling those processes difficult or impractical.

Although the above discloses levelizing LUTs in order to schedule them, constraints imposed by scheduling may adversely affect placement and routability. Therefore, in one embodiment, scheduling and placement are performed simultaneously.

Table A compares a standard FPGA circuit design process for a standard FPGA, a "simple" time-multiplexed FPGA design process, and a "better" time-multiplexed FPGA design process.

TABLE A

| Standard FPGA | Simple Time-MUX | Better Time-MUX |
|---|---|---|
| Design Entry | Design Entry | Design Entry |
| Optimize | Optimize | Optimize |
| Technology Map | Technology Map | Technology Map |
|  | Schedule |  |
| Place | Place | Schedule and Place |
| Route | Route | Route |

In a standard FPGA process, after circuit design entry, the circuit design is optimized and mapped to the physical resources available on the FPGA (for example, LUTs for combinational logic). Note that optimization, which is well known to those in the art, includes restructuring the combinational logic to minimize the LUTs in the design, as well as performing retiming to shorten long combinational logic paths. Then the FPGA resources are placed to select the real resource used to implement each function in the user's logic and routed to connect these resources.

A simple way to implement a process design flow with a time-share FPGA is to add a Schedule step after Technology Mapping, but before Placement. The Schedule step determines the micro cycle of each LUT in the design, thereby allowing division of the design into N placement and routing problems, (wherein N is the number of micro cycles used by the design).

The Schedule and Placement steps are dependent on one another. Specifically, the Schedule step determines which nets are required during each micro cycle. Clearly, if the numbers of nets or the numbers of pins to be connected are reduced, placement becomes correspondingly easier.

The output signals of the LUTs provided in a specific micro cycle n are used as input signals in other micro cycles (e.g., n+1). Therefore, the locations of the sources of all nets in one of those n placements are determined by the placements of LUTs in other micro cycles. If each LUT output micro register has N output multiplexers, the same real LUT should not provide more than N different signals scheduled to be in the same micro cycle. The assignment of LUTs in the design to real LUTs in the FPGA is done during the Placement step. Therefore, in the Better Time-Share FPGA process, Schedule and Place operations are simultaneously performed.

Figure 31:
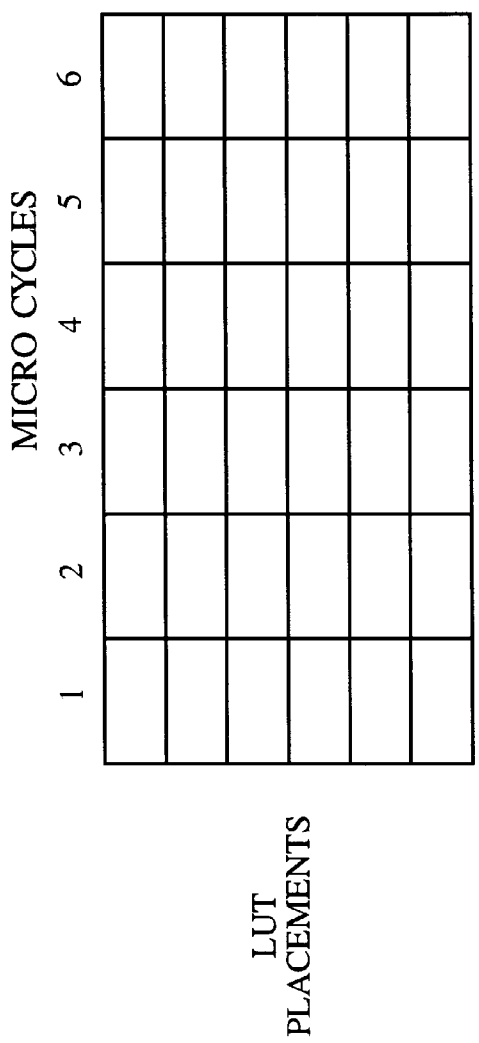
FIGS. 31 and 32 show scheduling and placement look-up tables in two and three-dimensional space, respectively.

Referring to FIG. 31, each box is a placement in space (LUT placement) and time (micro cycle). Scheduling constraints are constraints on the relative placement of the LUTs in the micro cycle (time) dimension.

Figure 32:
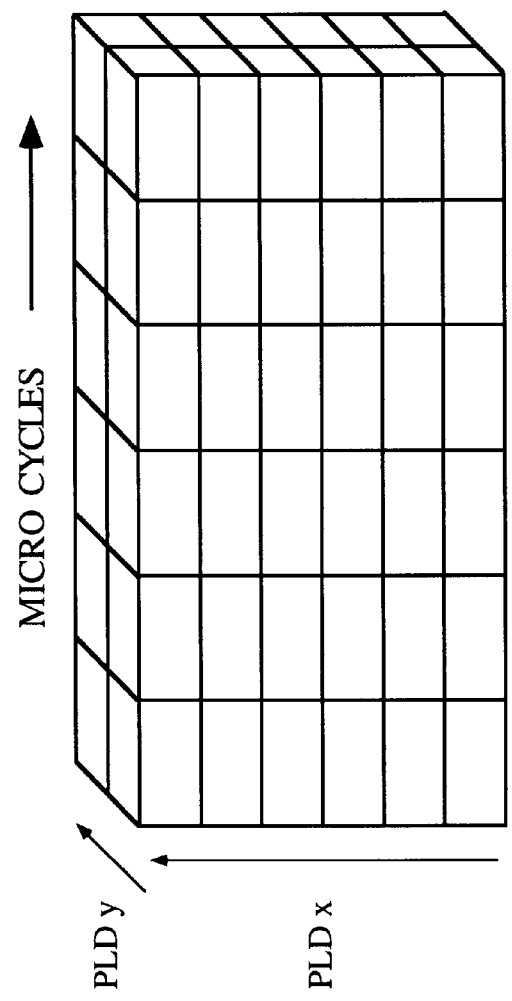

Because FPGAs are two-dimensional, combined scheduling and placement can be solved as a three-dimensional placement problem as shown in FIG. 32. The placement cost function reflects physical constraint costs in the PLD x and y dimensions, and scheduling constraint costs in the micro cycle dimension. Conventional placement heuristics are applicable, including simulated annealing, min-cut bi-partitioning, cluster growth, simulated evolution and force-directed relaxation. The placement algorithms must obey the relative placement constraints imposed by scheduling.

8.2f Logic Engine Input and Output Signals

Input/output signals must be updated by the end of a user cycle. However, preferably a value is passed to an output as it is calculated, rather than waiting for the last micro cycle.

In the simplest model of operation of the logic engine mode, all input signals are available at the first micro cycle and all output signals are required at the end of the user cycle (at the end of the last micro cycle). In fact, some input signals arrive later and some output signals are required sooner. To accommodate these constraints, the Scheduler computer program avoids scheduling the use of late-arriving input signals until after some micro cycle, and produces early-needed output signals before the last micro cycle. These early output signals must be routed to their respective output pads at an early micro cycle and presented on the chip output pins.

For a value to be present at the chip output during all micro cycles, the routed path from the register holding the signal to the output pad must be a static path (i.e. using the static logic technique described in Section 8.3 wherein the programming for the path is contained in all micro cycle configurations). In one embodiment, a single static register is provided with every output pad to hold the value to be output.

In accordance with one embodiment of the present invention, asynchronous input signals are synchronized with logic engine synchronous operations. This synchronization is similar to the synchronization problems encountered in any other system. User circuit designs take into account that signals are to be available when the user clock cycles. Late-arriving signals can be accommodated by scheduling the use of these signals later in the major cycle.

Arrival times of asynchronous signals cannot be predicted. A complete user cycle is needed to update the output signals from the input signals. In addition, if an input signal changes just after the start of a major cycle, that signal might not be included in the result. Therefore, two complete major cycles are needed before results of an asynchronous input are guaranteed to be visible. To facilitate synchronization, input signals are brought directly into the chip or brought in through micro registers in the I/O blocks.

Figure 64A:
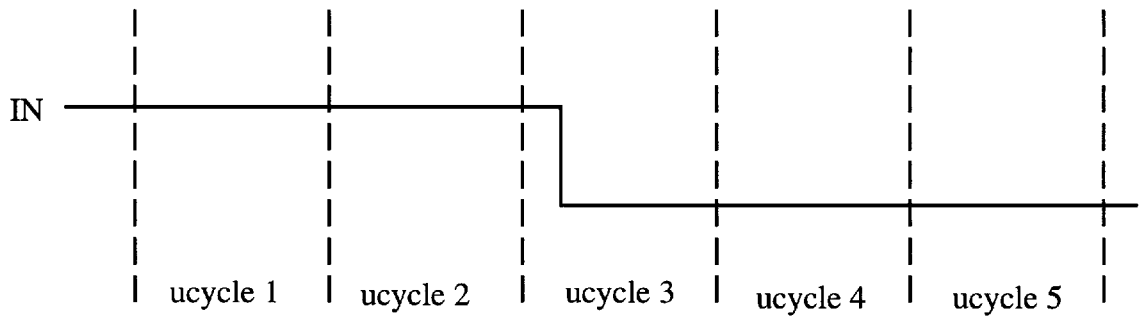
FIGS. 64A and 64B show a timing diagram and circuit which exemplify a skew problem solved by the invention.
Figure 64B:
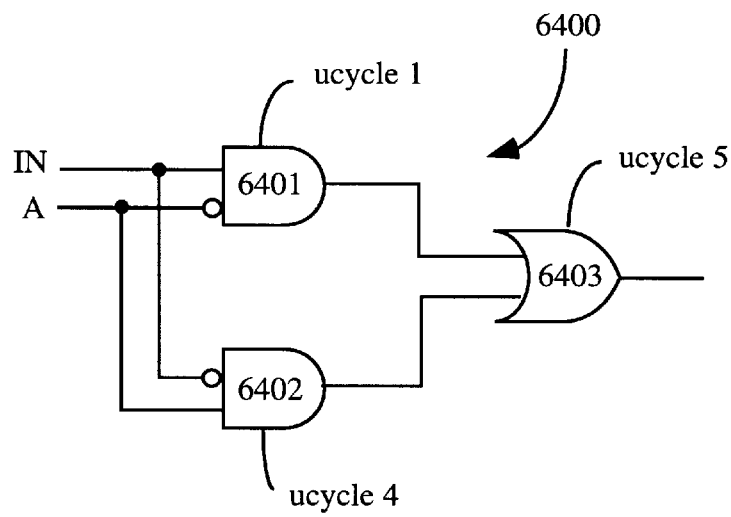

A skew problem occurs when an input signal changes after some micro cycles in a user cycle have been executed. Specifically, different values of the signal may be included in different parts of the calculation, thereby leading to incorrect results. For example referring to FIG. 64A, logic that uses signal IN during micro cycles 1 and 2 will use IN=1; logic that uses IN during micro cycles 4 and 5 will use IN=0; and logic that uses IN during micro cycle 3 will use either IN=0or IN=1. FIG. 64B illustrates a logic circuit 6400 in which the logic elements are labelled with the micro cycle in which they are scheduled. Because the value of signal IN changes between the evaluation of AND gates 6401 and 6402, these gates receive different values of the same signal, thereby yielding unpredictable results. Specifically, in this case, the output signal of OR gate 6403 is "1", regardless of the value of signal A because one of AND gates 6401 or 6402 provides a "1" (as noted signal IN changes between the evaluation of these gates).

Figure 41:
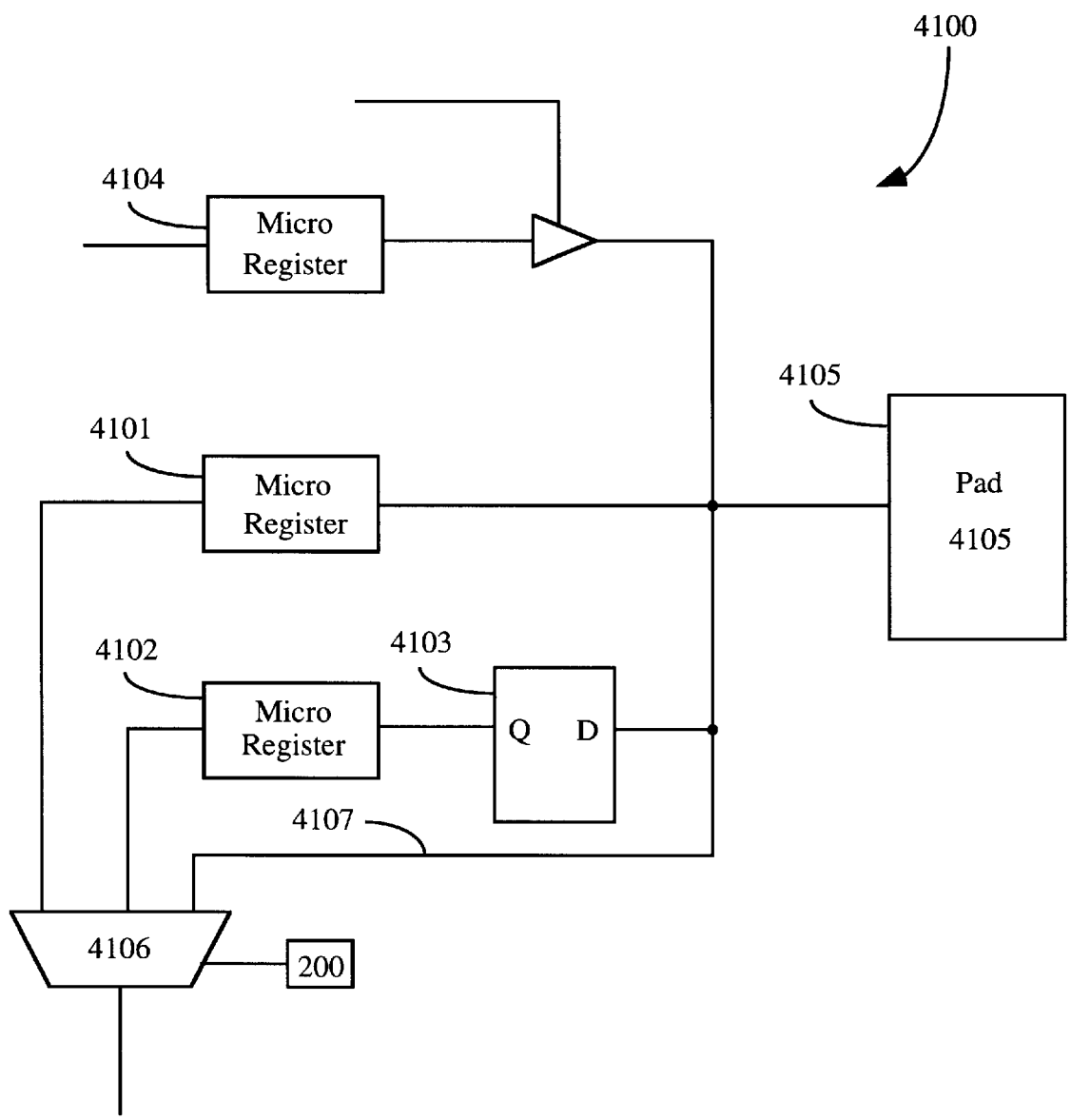
FIG. 41 shows an illustrative input/output block in accordance with the present invention.

Input synchronization of the present invention using micro registers in the input/output blocks avoids this problem. For example, referring to FIG. 41 which illustrates a portion of an input/output block 4100, micro register 4101 captures the input signals from a pad 4105, whereas micro register 4102 captures the output signals from flip-flop 4103. Multiplexer 4106, controlled by a bit set 200 (FIG. 2), selectively outputs signals from micro register 4101, micro register 4102, or a line 4107. A micro register 4104, which captures output signals to pad 4105, allows a constant (i.e. design independent) time specification for the delay from reconfiguration to output values in the time share mode.

8.3 Static Mode

Asynchronous paths and particularly high speed logic can be implemented by dedicating some of the CLBs and interconnect as static logic for those signals and calculations.

In the third mode, the static mode, a part of the FPGA retains a single configuration as other parts of the FPGA are reconfigured. That part of the FPGA configured in the static mode is functionally identical to the corresponding part of a prior art FPGA. Because additional silicon area is consumed by memory bits, the logic density of a CLB in the static mode is less than that of the prior art CLB.

A static mode is typically implemented by programming all memory slices to the same configuration value, thereby ensuring that the function remains the same regardless of the configuration. Note that in the static mode, the flip-flop clocks and the micro register clocks have no relationship to one another. Therefore, restoring a value into a static flip-flop from a micro register has no meaning and must be inhibited. For example, the static flip-flop could have multiple clock cycles for every user cycle defining the micro register clocks. Therefore, the micro register values would be too old and the restore operation must be inhibited by disabling signal FirstCyc (FIG. 4) explained in detail in Section 8.1 Time-Share Mode.

8.4 Mixed Mode

System designs may require a mixture of logic types, some with high performance requirements and some with modest performance needs. Moreover, synchronous systems have need of some asynchronous capability in order to handle real-time interrupts. In order to support this, the present architecture provides for mixed mode operation. For example, some configurations operate in time share cycles, while other configurations are combined into logic engine sequences. For example, a microprocessor bus peripheral may include static logic for detecting the bus operation and timeshares that allow the peripheral to perform at different times as a printer controller, network interface, or disk drive controller. In one embodiment of this application, the printer controller may include several micro cycles of a logic engine. Additionally, a subset of the CLBs and interconnect may be programmed in static mode, in which case they will be unavailable for the timeshare or the logic engine modes.

9.0 Miscellaneous 9.1 Variable Depth CLBs

Figures 35, 36:
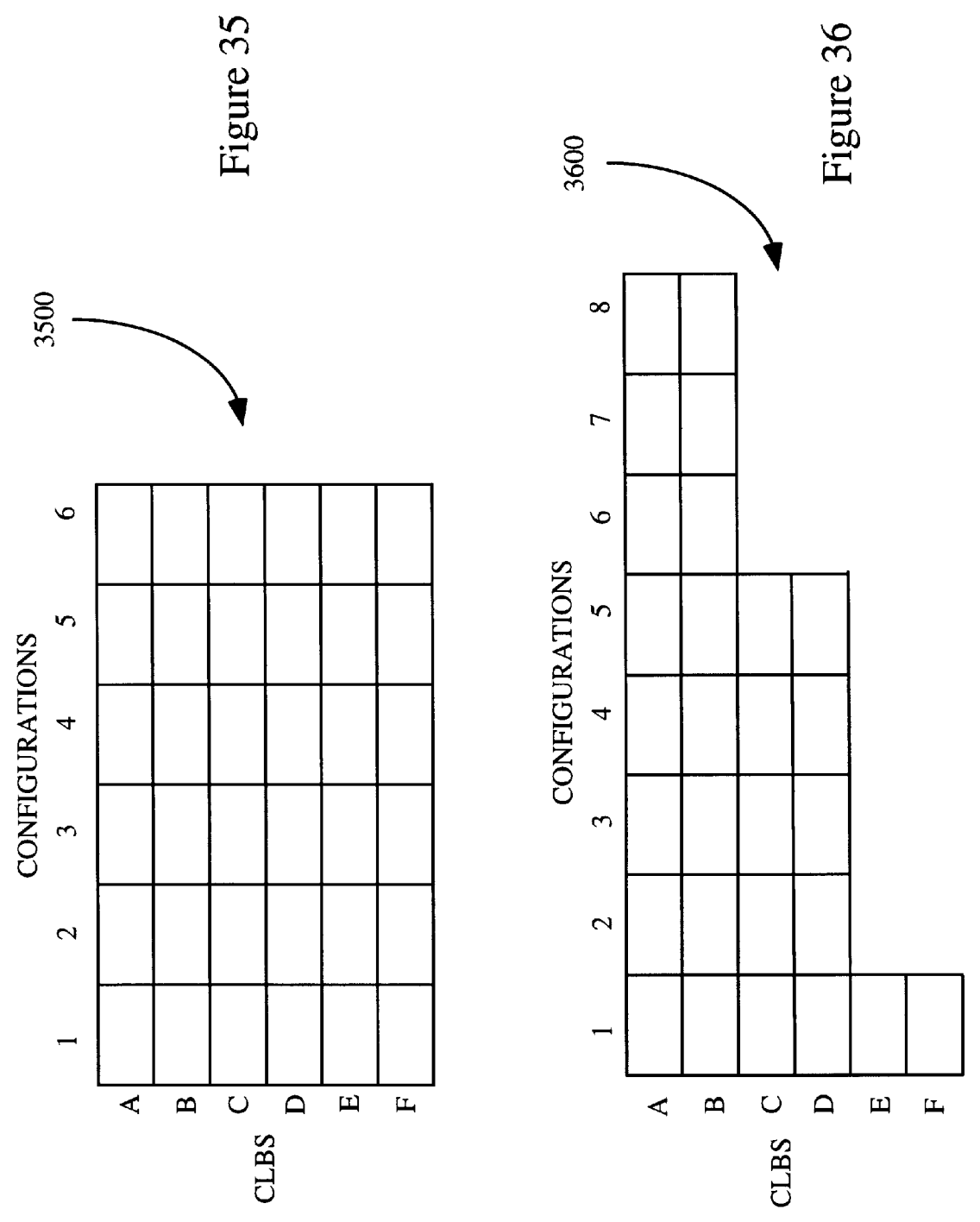

The required depth of logic (and hence the number of configuration memory cells behind each programming point) is circuit design dependent, and varies within the design. Therefore, if a specific user design fails to take advantage of all configurations of each CLB, then some of the configuration memory is wasted, thereby leading to an FPGA that is larger than necessary. Thus, although typical CLBs in accordance with the present invention have N bits for N memory cycles, some CLBs in some embodiments have fewer. FIG. 35 shows a time-shared PLD, including CLBs A–F on the y-axis and configurations 1–6 on the x-axis. In FIG. 35, each CLB has six different configurations. Thus, architecture 3500 requires 36 CLB maps of memory (6 CLBs*6 micro cycles).

A modified architecture is shown in FIG. 36, wherein CLBs A and B have configurations 1–8, whereas CLBs C and D have configurations 1–5, and CLBs E and F have only configuration 1. Architecture 3600 requires 28 CLB maps of memory (2*8+2*5+2*1). Thus, assuming a circuit design has variation in depth, architecture 3600 saves significant amounts of memory in comparison to architecture 3500.

A typical, well-designed PLD has a distribution of depth chosen to fit the circuit designs to be implemented on it. For example, FIGS. 37A and 37B illustrate two 2-input LUTs: LUT 3700A (which includes multiplexer 3701 and eight configurations provided by memory cells 3702), and LUT 3700B (which includes multiplexer 3703 and four configurations provided by memory cells 3704). One column of memory cells is needed for each configuration. Thus, memory cells 3702 are arranged in 8 columns, whereas memory cells 3704 are arranged in 4 columns. During operation, one column of memory cells is sequentially selected as the contents of the LUT.

The CLBs that do not have memory cells for a configuration must still be programmed for that configuration. For example, referring to FIG. 36, CLBs E and F must be programmed during configurations 2–8, and CLBs C, D, E and F must be programmed during configurations 6–8. In some embodiments, instead of actually programming the CLBs for specific configurations, the present invention provides the following alternatives.

1. Hold the last value. The CLB programming remains what it was on the last implemented memory cell.

2. Recycle. A CLB that contains fewer than the maximum number of configurations re-cycles through its configurations for higher configuration numbers. (If there are 8 configurations maximum and 4 bits of storage with the CLB, the CLB proceeds 12341234.)

3. Remain idle. The CLB does nothing, i.e. uses a predetermined, hard-wired idle configuration.

4. Per-CLB choice. Choose which option to use on a CLB-by-CLB basis.

FIG. 38 illustrates a 2-input LUT 3801 with different numbers of configurations for different multiplexer input terminals. Specifically, multiplexer 3803 includes two input terminals for receiving five configurations and two input terminals for receiving four configurations. The choice of idle configuration may be 0, 1, or a user signal 3805, in which case, for those configurations in which the LUT has fewer fully-controlled input signals, some restricted functions of all input signals are still available. In a configuration in which not all input signals are present, LUT 3801 can be described as a multiplexer with some memory cells providing input signals and some constants providing input signals.

9.2 Micro Cycle Interrupt Simulation

The logic engine mode works well with a single-clock system. However, a network frequently operates as a multi-clock system. Specifically, the flip-flops in many end-user designs are triggered by unrelated clocks or the timing relationships between the clocks cannot be determined. In other words, the clocks are deemed to operate asynchronously.

In accordance with the present invention, a logic network having asynchronous clocks is simulated. Specifically, the logic network is first divided into sub-networks, each sub-network containing flip-flops that share a common clock as well as the intervening logic. In one embodiment, the logic network is transformed to reduce the number of clocks, thereby reducing the number of sub-networks. Each sub-network is then independently compiled (scheduled) using the method previously described and is assigned a subset of the eight configuration slices which it occupies exclusive of any other sub-network. Finally, transitions on the clock net(s) associated with each sub-network are detected, triggering the evaluation of the respective sub-network as per dynamic scheduling.

Figure 42:
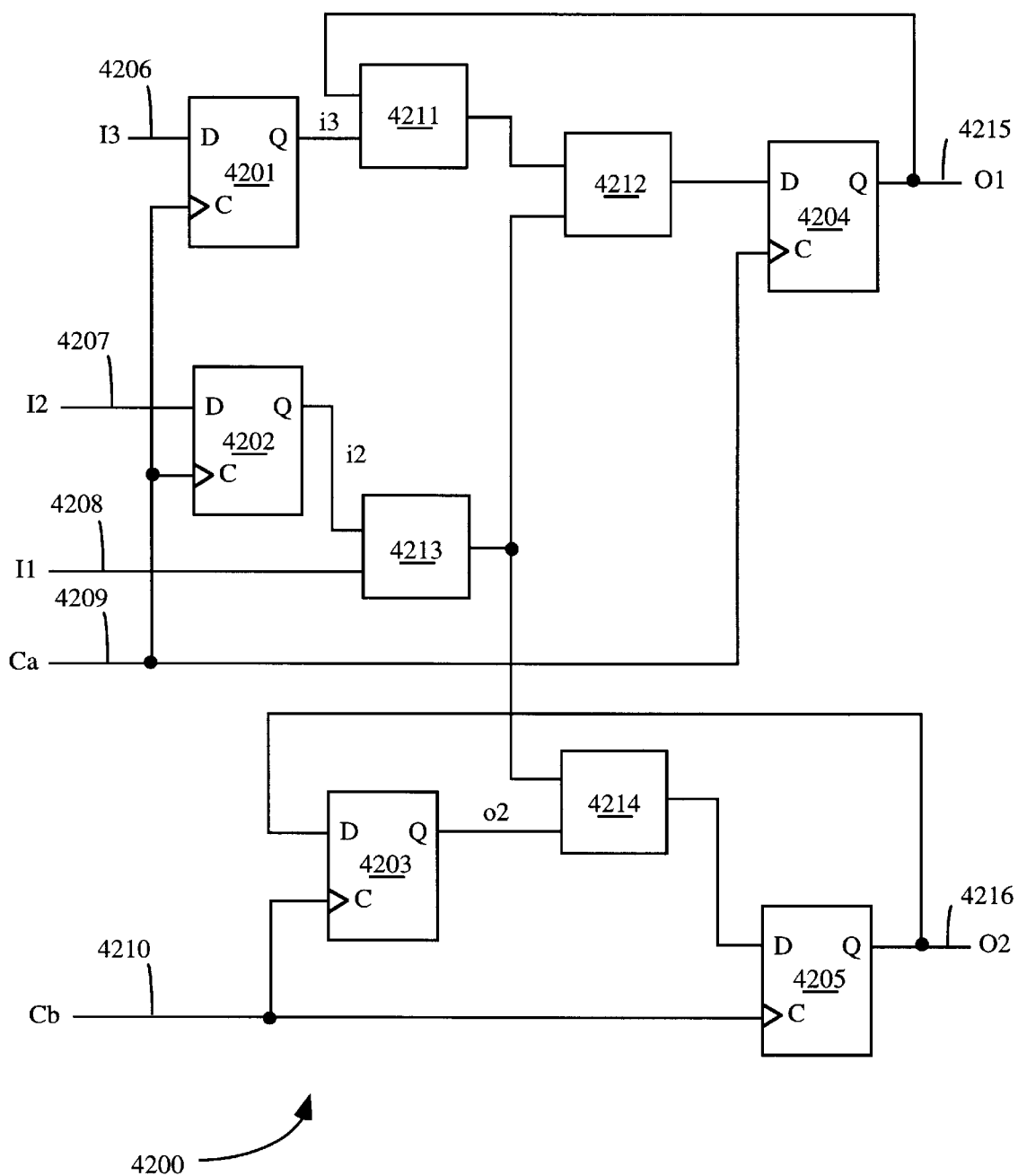
FIG. 42 illustrates a circuit subject to micro cycle interrupt simulation.

FIG. 42 illustrates an example of a user network 4200 in which flip-flops 4201, 4202, and 4204 are triggered by a signal on a first clock line 4209 and flip-flops 4203 and 4205 are triggered by a signal on a second clock line 4210. Note that the intervening combinational logic blocks (hereinafter blocks) 4211–4214, receive signals at different times. For example, block 4213 receives a primary input signal i1 on line 4208 and also receives another input signal i2 from flip-flop 4202 which in turn is triggered by a clock signal Ca on clock line 4209. As another example, block 4214 receives an output signal from block 4213 as well as a signal from flip-flop 4203 which in turn is triggered by a clock signal Cb on clock line 4210. Note that blocks 4211–4214, by definition, do not include any flip-flops or feedback loops.

Figure 42A:
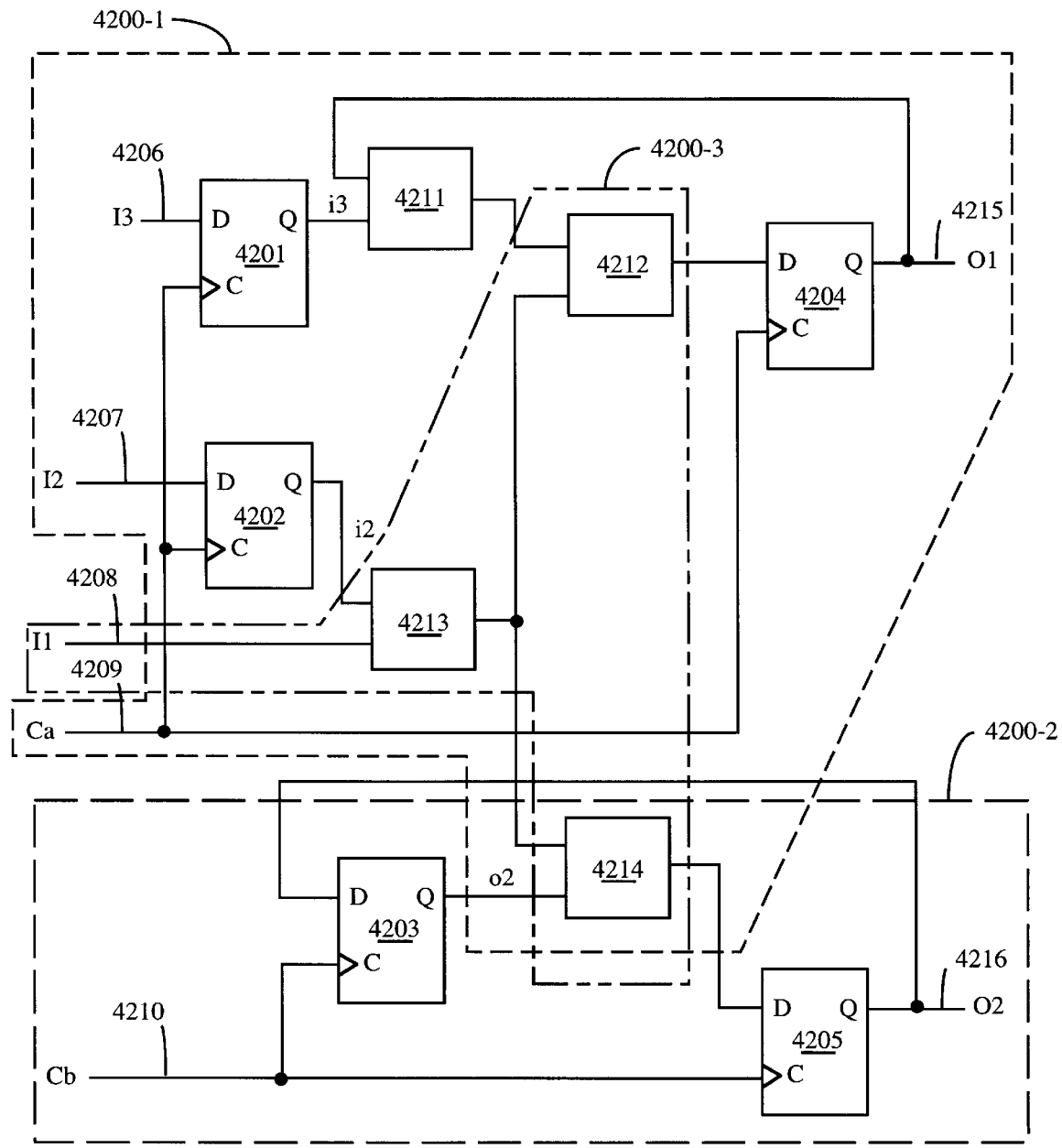
FIG. 42A shows the partitioning of the user network of FIG. 42 into sub-networks.

FIG. 42A shows a partitioning of user network 4200 into sub-networks 4200-1, 4200-2, and 4200-3. Note that these sub-networks overlap which signifies that the evaluation of some blocks can be triggered by more than one clock transition. As an extreme example, block 4214 can be triggered by the positive edge of signal Ca, the positive edge of signal Cb, or any change in signal I1.

Figure 43:
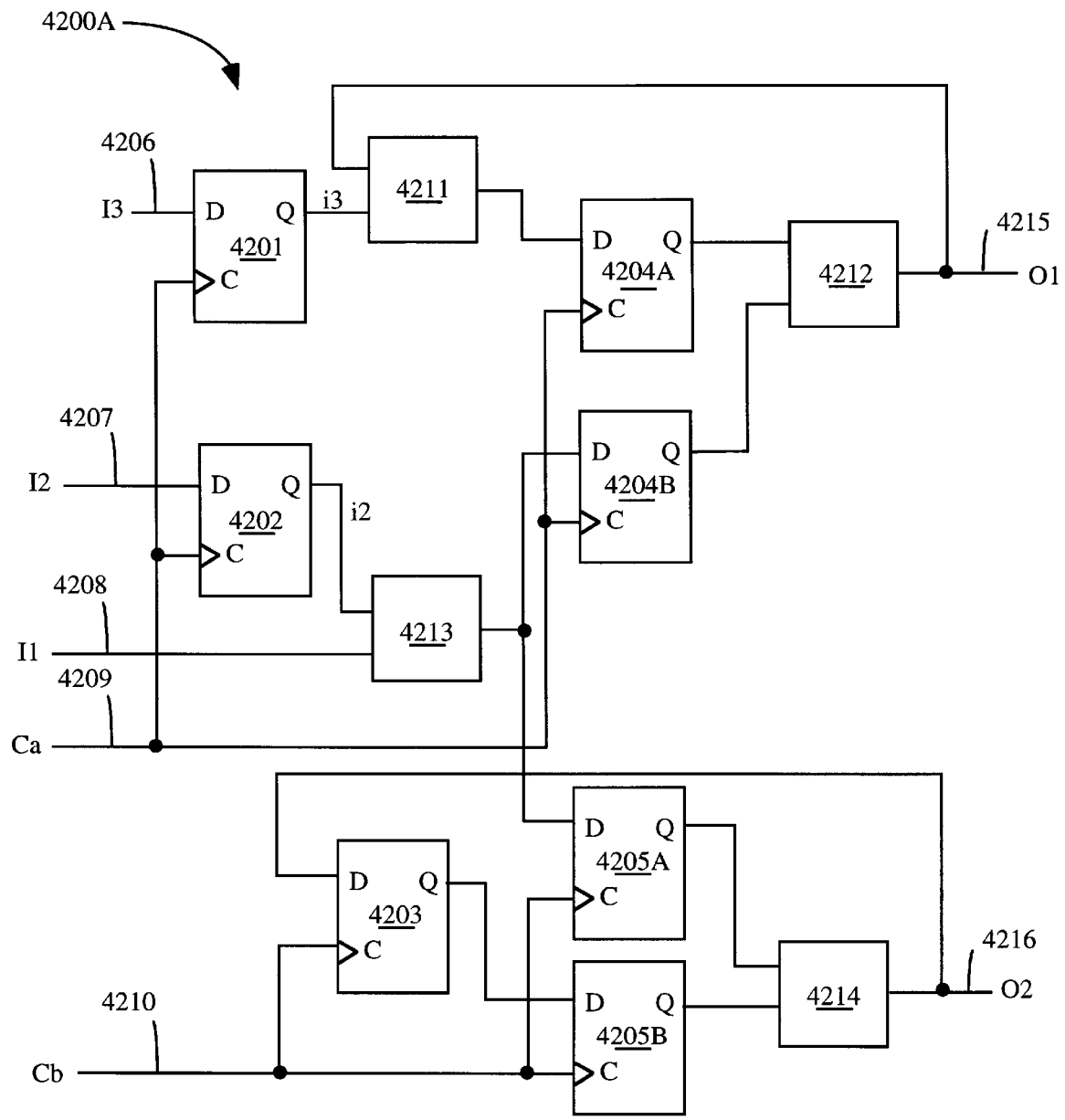
FIGS. 43, 44, and 45 show further transformations of the circuit of FIG. 42.
Figure 44:
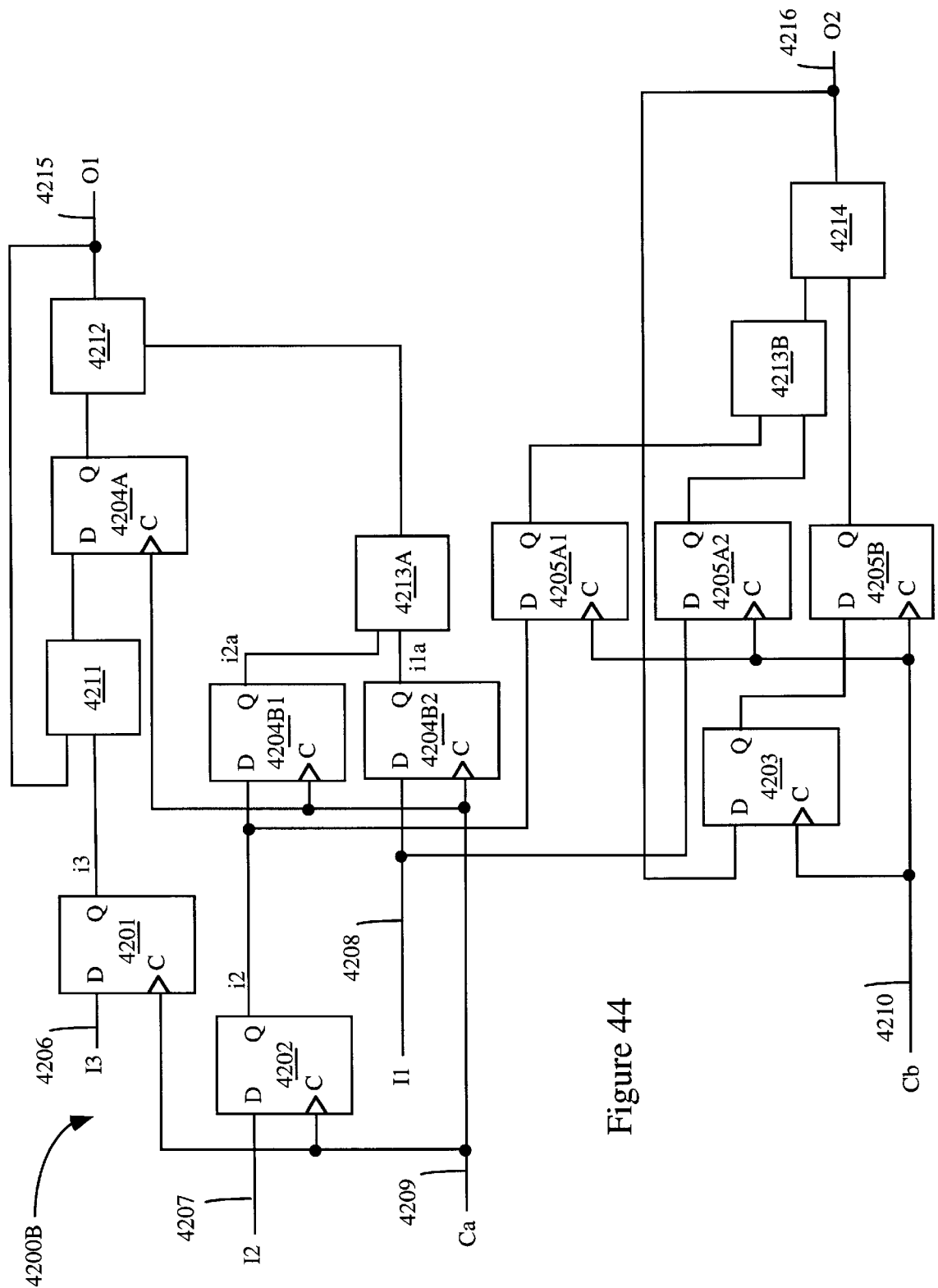

As an enhancement to the present invention, all block input signals that do not derive from flip-flops of the same clock are "retimed" forward through the flip-flops whose inputs they feed, if possible. For example, referring to FIG. 43, block 4212 is retimed through flip-flop 4204 and block 4214 is retimed through flip-flop 4205. Note that in this step flip-flop 4204 is replaced by two flip-flops 4204A and 4204B, wherein each of these flip-flops provides an output signal to block 4212. Similarly, flip-flop 4205 is replaced by two flip-flops 4205A and 4205B, wherein each of these flip-flops provides an output signal to block 4214. In FIG. 44, block 4213 is retimed though flip-flop 4204B. Note that in this step flip-flop 4204B is replaced by flip-flops 4204B1 and 4204B2. Referring back to FIG. 43, further note that block 4213 provides an output signal to both flip-flop 4204B and flip-flop 4205A. Thus, in network 4200, block 4213 must also be retimed through flip-flop 4205A, thereby creating flip-flops 4205A1 and 4205A2.

Figure 45:
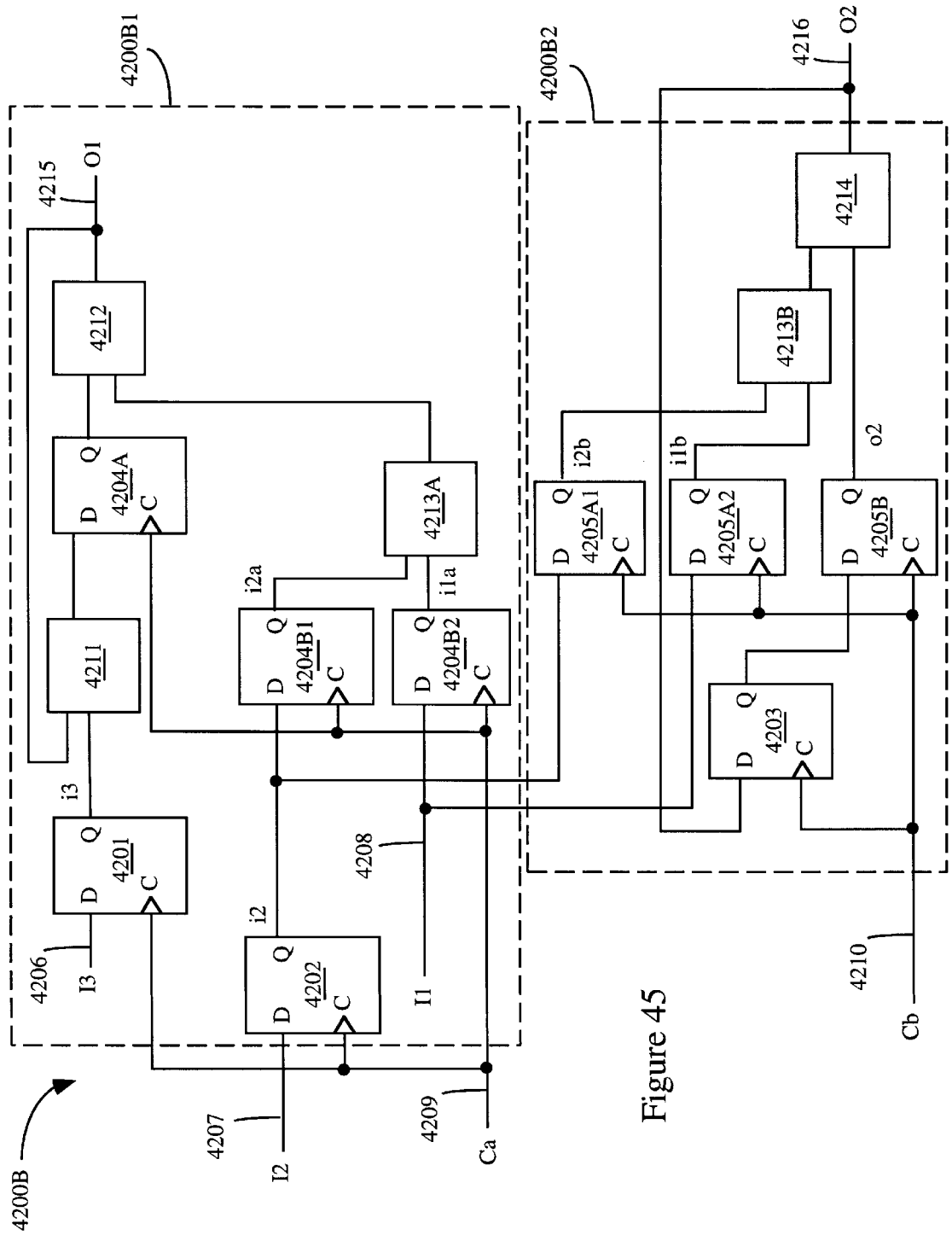

FIG. 45 shows network 4200B, functionally equivalent to network 4200 (FIG. 42), which is divided in accordance with the present invention into sub-networks 4200B1 and 4200B2, each sub-network having only one clock. Note that blocks 4213A and 4213B increase the die area of network 4200B by one block in comparison to network 4200 which includes only block 4213. Flip-flops 4204B1, 4204B2, 4205A1, 4205A2 and 4205B, although represented as "new" flip-flops in a user's design, generally do not require additional hardware resources because the micro registers provide ample storage at the block outputs, and the storage is required regardless of the placement of flip-flops at block outputs in the user's design. (See §2.1) Additional resources are required only in the infrequent case in which a flip-flop or a primary input feeds a flip-flop without intervening logic. Thus, it is unlikely that an increase in the number of flip-flops will effect a significant increase in the die area required to implement the user's network.

In the example of network 4200, block 4213 is duplicated in transformed network 4200B because it must be evaluated at more than one clock edge. However, in typical design practice, a single block is typically not required to operate at multiple clock edges. Thus, retiming rarely increases the number of blocks in the user's design. It logically follows that the retiming transformation is likely to result in zero or an insignificant die area increase.

FIGS. 46 and 47 illustrate pseudo code translations 4600 and 4700 for scheduled logic networks 4200 and 4200B (FIGS. 42 and 45), respectively. (Note that although translation 4700 which includes retiming processes is typically preferred over translation 4600, both translations produce functionally correct results.) Each translation includes a plurality of partitions, i.e. processes. For example, translation 4600 includes Processes 1(5), 2(5), and 3(5). Process 1(5) is triggered by the positive edge of clock signal Ca, Process 2(5) is triggered by the positive edge of clock signal Cb, and Process 3(5) is triggered by the transition of signal I1.

After detecting the positive edge of clock signal Ca, Process 1(5) first samples the input signals of flip-flops 4201 and 4202, i.e. transferred input signals i2 and i3 to the Q-output terminals of flip-flops 4201 and 4202, respectively, and referenced as signals i3 and i2). Second, Process 1(5) evaluates logic network 4200-1 based on the scheduling constraints 4600A illustrated in FIG. 48. Note that "<" indicates "before". Thus, for example, block 4211 is evaluated before block 4212. Likewise, "≧" indicates "after or simultaneous with". Thus, for example, block 4212 is evaluated after or the same time as block 4211.

Figure 50:
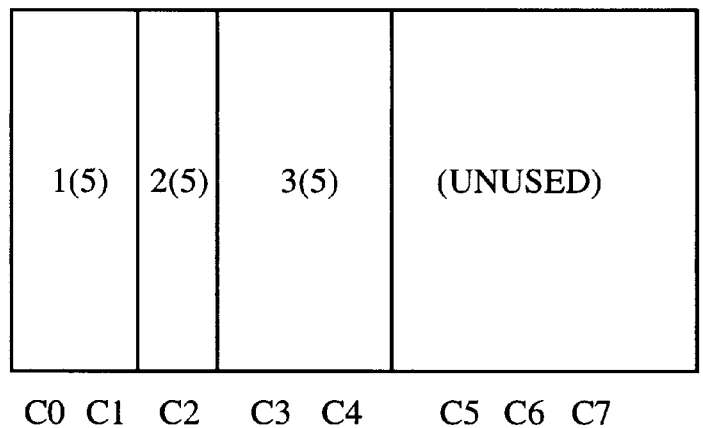
FIG. 50 illustrates one micro cycle allocation.

Referring to both FIGS. 46 and 48, after detecting the positive edge of clock signal Cb, Process 2(5) samples signal o2 before evaluating block 4214. Simultaneously, Process 2(5) evaluates block 4214 not before sampling output signal O2, and identifies that output signal O2 is transferred signal o2. After detecting a signal transition of input signal I1, Process 3(5) evaluates block 4213 before block 4214. FIG. 50 illustrates the micro cycle allocation for Processes 1–3 (5). Specifically, Process 1(5) includes micro cycles C0 and C1, Process 2(5) includes micro cycle C2, and Process 3(5) includes micro cycles C3 and C4. The remaining micro cycles, i.e. micro cycles C5–C7, remain unused.

Figure 51:
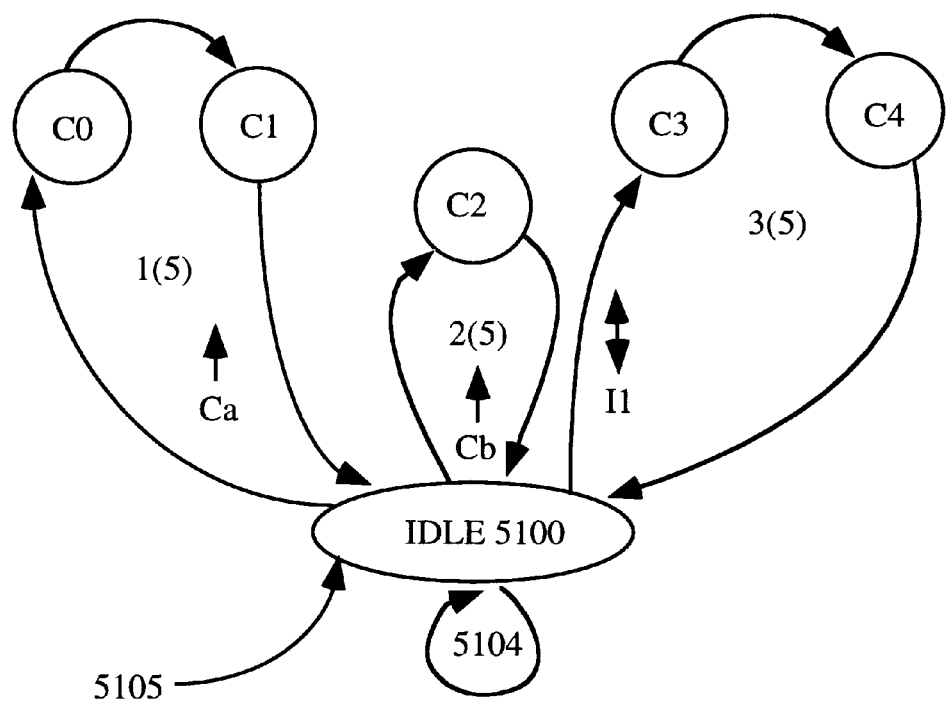
FIG. 51 shows a state diagram for FIG. 50.

FIG. 51 shows a state diagram for the micro cycle allocation illustrated in FIG. 50. After the state machine begins in step 5105, a process, such as Process 1(5), begins (also shown in FIG. 46). After Process 1(5) is complete, the state machine returns to idle state 5100 where the system loops (represented by loop 5104) until another process, such as Process 3(5) begins. Similarly, after Process 3(5) is complete, the state machine returns to idle state 5100 until yet another process begins. However, as shown in FIG. 51, this state machine does not account for the possibility of "process" contention for logic resources.

In accordance with the present invention, logic network 4200B (FIG. 45), although more complicated than logic network 4200 (FIG. 42), actually has a simpler pseudo code translation. In schedule 4600, blocks 4212, 4213 and 4214 are assigned in more than one place. This assignment requires that the micro register write select signals be controlled independently on a CLB by CLB basis, which is not supported by the disclosed implementation. A solution to this problem is to provide dedicated sites in the array, each site consisting of a flip-flop which is configured to clock on any combination of the micro cycles. Such a site could be used in lieu of a micro register if a block is scheduled in more than a signal micro-cycle. As an additional benefit, such sites could be used as a hardware resource (known as a "tie-down" in the industry) that either applies a constant 1 or 0 to unused interconnect, thereby preventing buffers in the interconnect from drawing static current as a result of floating conditions.

If retiming is performed, then a micro register is assigned in more than one place only if it occurs along a path from primary input to primary output which is unbroken by a flip-flop, and it is fed by signals of different clocks. By duplicating logic, such micro registers are required only at the primary outputs.

In a run-time environment, sub-networks (referred to as "processes" in microprocessors) are by default waiting for a trigger event (i.e. the processes are "blocked"). In the context of the present invention, the trigger event is an input pin transition as specified by the process. When a clock edge occurs, the corresponding sub-network is evaluated. When the evaluation is complete, the sub-network returns to the waiting state, wherein the system is triggered by the next clock edge.

Because simulation resources are limited, it is possible for a clock edge to arrive while the system is already in the process of evaluating another sub-network, thereby triggering one of a number of different operations. In one embodiment, the interrupting sub-network is placed in the waiting state. As resources become available, a predetermined process, such as the interrupting sub-network, is selected and then run. One circuit embodiment to implement this process scheduling is shown in FIG. 52.

Figure 52:
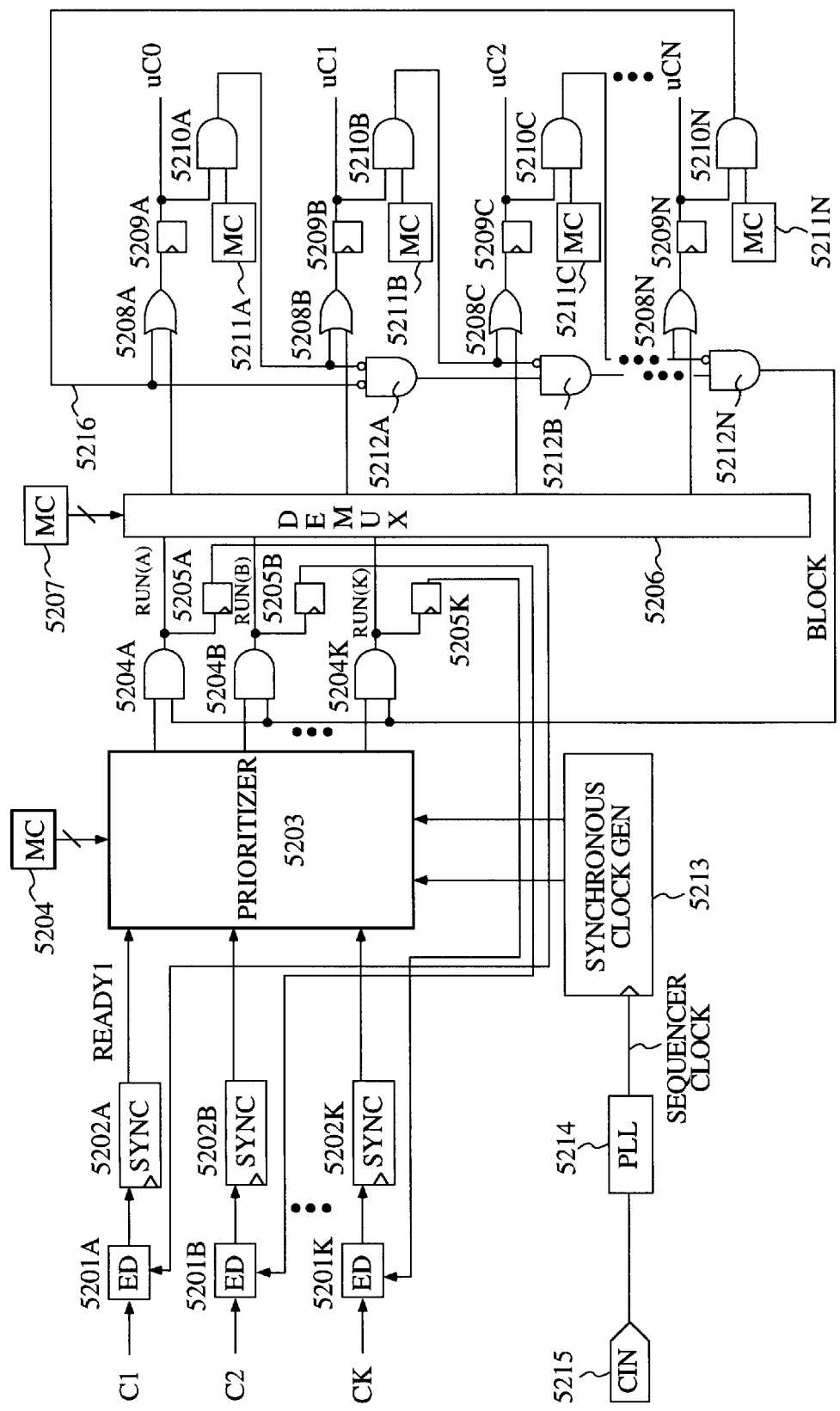
FIG. 52 illustrates circuitry for determining an appropriate micro cycle.

FIG. 52 illustrates multi-clock sequencer 5200 which receives external clock signals C1, C2 . . . CK (typically provided via pins on the FPGA chip) and outputs internal micro cycle clocks uC0, uC1 . . . uCN which determine the appropriate micro cycle (i.e. sub-network) to be active. Edge detect blocks 5201A–5201K detect the edges of clock signals C1–CK, respectively. These signals are then synchronized to the free-running multi-clock sequencer clock by synchronize blocks 5202A–5202K. The multi-clock sequencer clock is labeled "SEQUENCER CLOCK" in FIG. 52 and is implicitly connected to every clock input (e.g. on 5202A–K, 5205A–K, 5209A–N) in the circuit that is not explicitly connected. Prioritizer 5203 receives the signals from synchronize blocks 5202A–5202K and, if multiple signals are received simultaneously, determines which signal to provide to AND gates 5204A–5204K. As shown in FIG. 52, AND gates 5204A–5204K also receive a signal BLOCK which is provided by AND gate 5212N (explained in detail below). The BLOCK signal provides that if a sub-network is running, the request made (indicated by the incoming clock signal(s)), is ignored. Specifically, if the BLOCK signal is low, all the output signals of AND gates 5204A–5204K are also low. That condition results in demultiplexer (demux) 5206 providing all logic zero signals (i.e. an "ignore" condition).

On the other hand, if the BLOCK signal is high, then that means the system is idle (i.e. no sub-network is being run). In this condition, if an output signal of an AND gate 5204 (i.e. a signal RUN) goes high, that specific high signal along with all other low signals provided by the other AND gates 5204 are fed into demultiplexer (DEMUX) 5206, thereby providing a one-hot or zero-hot pattern which determines the output signals of DEMUX 5206 which are also one-hot or zero-hot Note that DEMUX 5206 is configured to reflect the starting micro cycle of the processes. The output signals of DEMUX 5206 determine which micro cycle clock uC is activated, which in turn determines which micro cycle is active. Note that DEMUX 5206 is programmed by memory cells 5207, wherein the programming determines which micro cycle is associated with each trigger signal uC.

Note that flip-flops 5205A–5205K receive signals RUN (A)–RUN(K), respectively. Upon being triggered by the multi-clock sequencer clock (the fastest clock on the FPGA chip), flip-flops 5205A–5205N provide feedback signals to edge detectors 5201A–5201N, respectively. In this configuration, if a high signal is output by a flip-flop 5205, that high signal resets the respective edge detector 5201, thus acknowledging receipt of an edge.

The logic gates, including OR gates 5208A–5208N, AND gates 5210A–5210N, and AND gates 5212A–5212N generate signal BLOCK. In one preferred embodiment, the series chain of AND gates 5212A–5212N is implemented as a single wide NOR gate, and further pre-charged logic is used. This implementation is well known in the art (see, for example, Weste & Eshraghian, "Principles of CMOS VLSI Design: A System Perspective", 160–164, Addison Wesley, 1988) and therefore is not described in detail herein.

Each of memory cells 5211A–5211N provides a logic zero to its corresponding AND gate 5210A–5210N if and only if the corresponding micro-cycle is the last micro-cycle of a process in the scheduled network. For example, in the schedule of FIG. 50, micro cycles 1, 2, and 4 are the last micro cycles, and thus memory cells 5211B, 5211C and 5211E (not shown explicitly) provide logic zeros. Memory cells 5211A–5211N, 5204, and 5207 comprise part of the configuration memory; however, their outputs are not time-multiplexed as shown in FIG. 2. The state of flip-flops 5209A–5209N represents the current micro cycle state. Specifically, if no flip-flop 5209A–5209N holds a logic one, then multi-clock sequencer 5200 is in the idle state (state 5100 of FIG. 57). If a single flip-flop holds a logic one, then multi-clock sequencer 5200 is in the corresponding micro cycle. For example, if only flip-flop 5209B holds a one, then multi-clock sequencer 5200 is in micro cycle 1 (FIG. 50). All other states of flip-flops 5209A–5209N are invalid.

The operation of the circuit is as follows. In the idle state, flip-flops 5209A–5209N store low signals, which forces the output signals of AND gates 5210A–5210N low. These low signals force the output signals of gates 5212A–5212N, and thus, signal BLOCK high. A high BLOCK signal enables the highest priority pending clock edge (if any) to provide a high signal to DEMUX 5206. If no edge is pending, (in other words, no unserviced clock edge has been detected), then all zeroes are fed to DEMUX 5206. DEMUX 5206 then maps the signaling edge (if any) to the first micro cycle in the corresponding process. If there is no pending edge, then DEMUX 5206 outputs logic zeros on all its outputs, thereby forcing the output signals of all OR gates 5208A–5208N to be zero. These low signals, provided to flip-flops 5209A–N, ensure that multi-clock sequencer 5200 remains in the idle state at the next sequencer clock.

If, however, there is a pending edge, then a single DEMUX output signal is high, thereby forcing the output signal of the corresponding OR gate 5208 high. This high signal causes multi-clock sequencer 5200 to enter the appropriate micro cycle at the next sequencer clock.

If multi-clock sequencer 5200 is in a micro-cycle which is not the last micro cycle of a sequence, then the memory cell 5211 corresponding to the current micro cycle stores a high signal. Thus, the output signal of the corresponding AND gate 5210 is high, thereby guaranteeing that the BLOCK signal is low. A low BLOCK signal in turn guarantees that the output signals of DEMUX 5206 are all low. Note that the logic one signal in the corresponding flip-flop 5209 flows through the corresponding AND gate 5210 to the next OR gate 5208 and then into the next flip-flop 5209. In this manner, multi-clock sequencer 5200 enters the next micro cycle in the sequence at the next sequencer clock.

If multi-clock sequencer 5200 is in a micro cycle which is the last micro cycle of a sequence, then the BLOCK signal is high, thereby causing the next state to be determined as though multi-clock sequencer 5200 were currently in the idle state. Note that this is an improvement over state diagrams of the form exemplified by FIG. 51, to the extent that IDLE state 5100 can be bypassed if appropriate.

Note that the above-described sequencer clock is free-running and each micro cycle lasts one sequencer cycle. Phase locked loop (PLL) 5214 is generally required because in order to achieve adequate system performance, the sequencer clock must be of a frequency too high to be practically distributed from off chip. Thus, a lower frequency clock signal CIN is provided via pin 5215 and frequency-multiplied by PLL 5214 to achieve the sequencer clock. PLL 5214 also advantageously minimizes skew between the off-chip and on-chip versions of the clock. In some cases, a triggering signal is known to be synchronous to the sequencer clock (for example, a signal that is divided from the sequencer clock, the sequencer clock qualified by another signal, or some combination thereof), thus obviating the inherent delay associated with synchronizers 5202A–K. Synchronous clock generator 5213 is provided to generate such clocks, thereby bypassing the unnecessary synchronization step. Note that the micro cycle duration varies by manipulating the duration of the sequencer clock.

In another embodiment, the running sub-network is preempted and placed in the waiting state while the interrupting sub-network is evaluated. Upon completion of the running of the interrupting sub-network, the intermediate state of the preempted sub-network is restored and then evaluation continues. In yet another embodiment, the running sub-network is preempted, its intermediate state is discarded, and the running sub-network is placed in the waiting state. When resources become available, evaluation of the preempted sub-network is restarted. Although this approach is normally not an alternative in a computational environment, this embodiment provides advantages if the number of available levels of state save is less than the number of sub-networks.

Signals transmitted between sub-networks require an "inter-process communication" mechanism. Specifically, if a signal from sub-network A feeds a flip-flop in sub-network B, then sub-network B simply reads the value from the data space of sub-network A when the clock edge for sub-network B occurs. In other words, sub-networks A and B have a shared memory. However, if signals from multiple sub-networks feed the same combinational logic, a mechanism is required to allow each "process" to update the output signal of the combinational logic. Creating redundant logic blocks can circumvent this requirement (explained in detail in reference to FIG. 45), but such a mechanism is fundamentally required to implement output signals that change on multiple clock edges.

Figure 53:
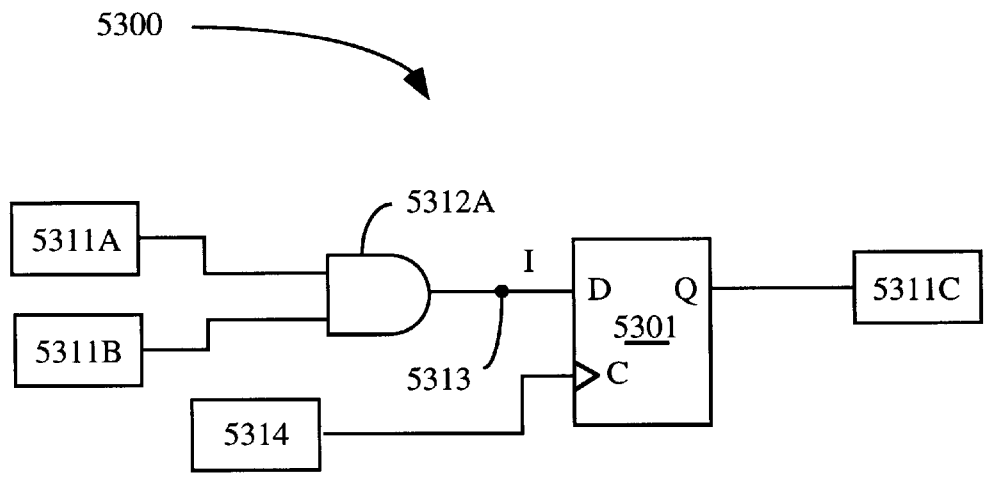
FIGS. 53 and 54 show equivalent circuits with synchronized output signals.

Some logic networks, such as logic network 5300 shown in FIG. 53, have signals that transition asynchronously as a function of their input signals. Specifically, assuming that the signals on pin 5311A, pin 5311B, and clock pin 5314 are asynchronous with respect to one another, the output signal of AND gate 5312A, i.e. signal I at node 5313, transitions whenever the signals provided on input pins 5311A and 5311B transition. If the signal transition at node I is observable, then the signals provided to input pins 5311A and 5311B must be viewed as clocks which trigger evaluations. However, signal I fails to reach output pin 5311C unless flip-flop 5301 is clocked frequently enough to sample every signal transition at input pins 5311A and 5311B. In this configuration, an AND gate 5312A is unnecessarily simulated every time one of the AND gate input signals change, thereby undesirably increasing simulation complexity.

Figure 54:
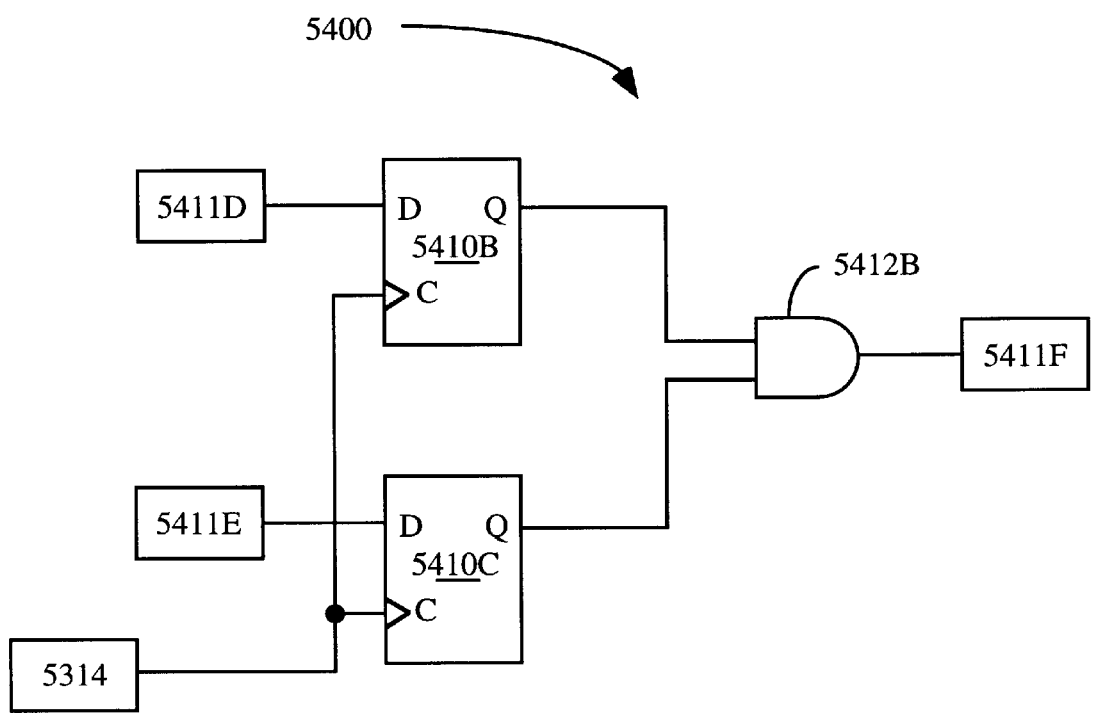

FIG. 54 illustrates a logic network 5400 in accordance with the present invention in which AND gate 5312A is retimed through flip-flop 5301, and which is functionally equivalent to logic network 5300 (FIG. 53). In logic network 5400, redundant logic is created to sample input signals if they are important (i.e. able to affect output signals), thereby simplifying simulation. Specifically, flip-flops 5410B and 5410C replace flip-flop 5301 (FIG. 53). Thus, in this configuration, input pins 5411D and 5411E provide signals to flip-flops 5410B and 5410C, respectively. In this manner, upon receiving a clock signal C (provided by clock 5314), flip-flops 5410B and 5410C provide signals to AND gate 5412B which in turn provides a signal to output pin 5411F.

In the case that retiming is not performed, for example in the case of paths from input(s) to output(s) that are unbroken by flip-flops, a straight-forward implementation would dictate that a separate sub-network is required for each input. In order to prevent the number of sub-networks from growing prohibitively large, input signals are grouped such that a transition of any one of those signals triggers a single sub-network fed combinationally by those input signals. Note that this step is typically performed only if the path is not broken with flip-flops. Once again, in the case that retiming is not performed, a separate subnetwork is typically required for each input.

In one embodiment of the present invention, an idle sub-network residing in local (i.e. on-chip) memory can be transferred to storage (i.e. off-chip) memory in order to free local memory for use as either user memory or as configuration memory for a sub-network currently not residing in local memory. Thus, sub-networks can be loaded on demand, and are not required to reside on-chip simultaneously. Although some sacrifice of response time is required to load the configuration from external memory, the logic density of the chip in this configuration is theoretically unbounded.

9.3 Micro Register Alternatives

Figure 10A:
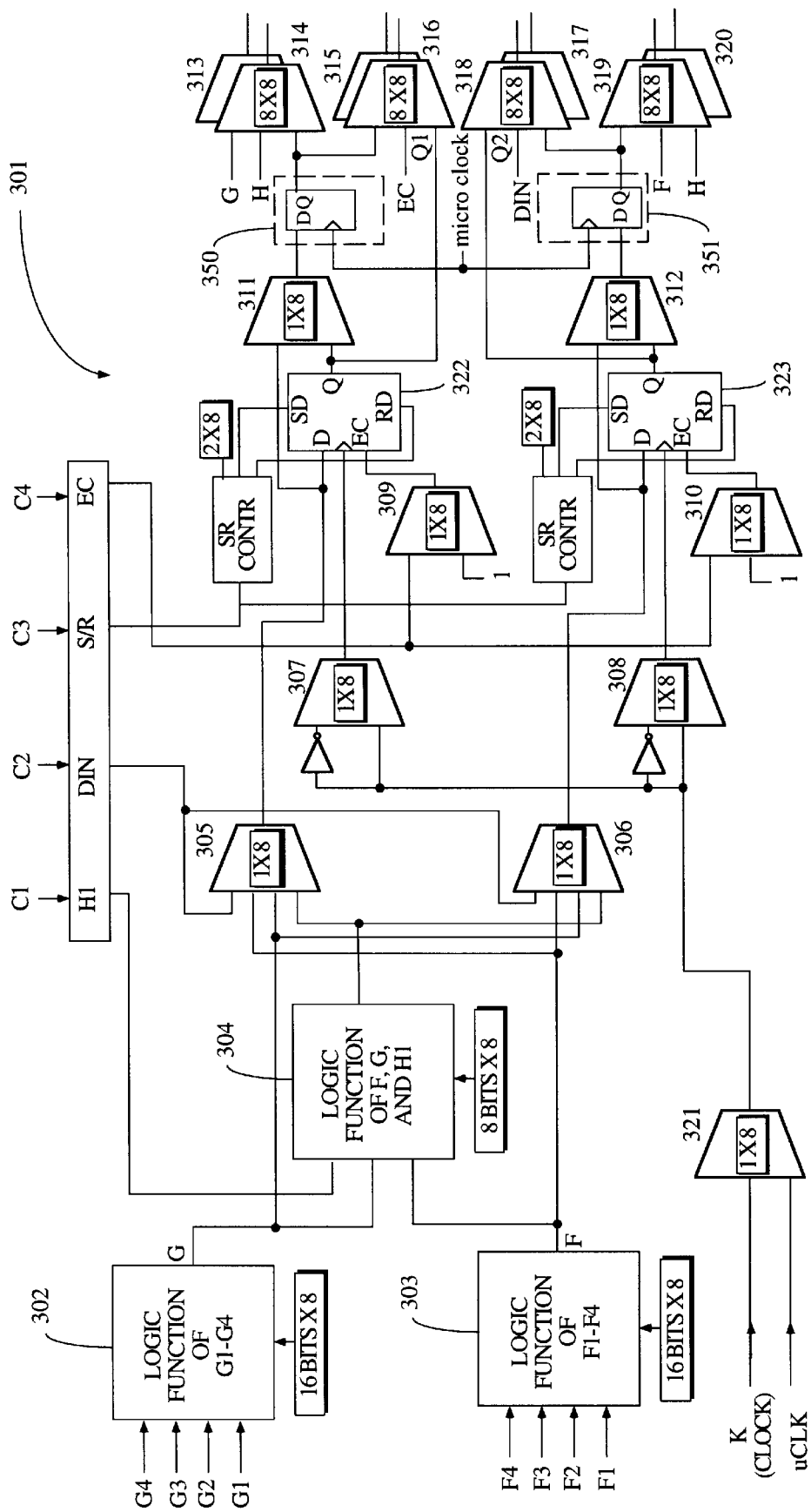
FIG. 10A shows a CLB with a storage device having a fixed delay in accordance with one embodiment of the present invention.

Another method to provide state storage particularly for the logic engine mode, is by a storage device having a fixed delay, called a "bypass". Referring to FIG. 10A, bypasses 350 and 351 replace the above-described micro registers 324 and 325, respectively (FIG. 3). A bypass is a single bit device that includes a latch to save the current result until the next configuration. Those signals which are merely being passed along to the next configuration are stored in bypasses 350 and 351. Typically, bypasses 350 and 351 are smaller and simpler than full micro registers 324 and 325.

Figure 10B:
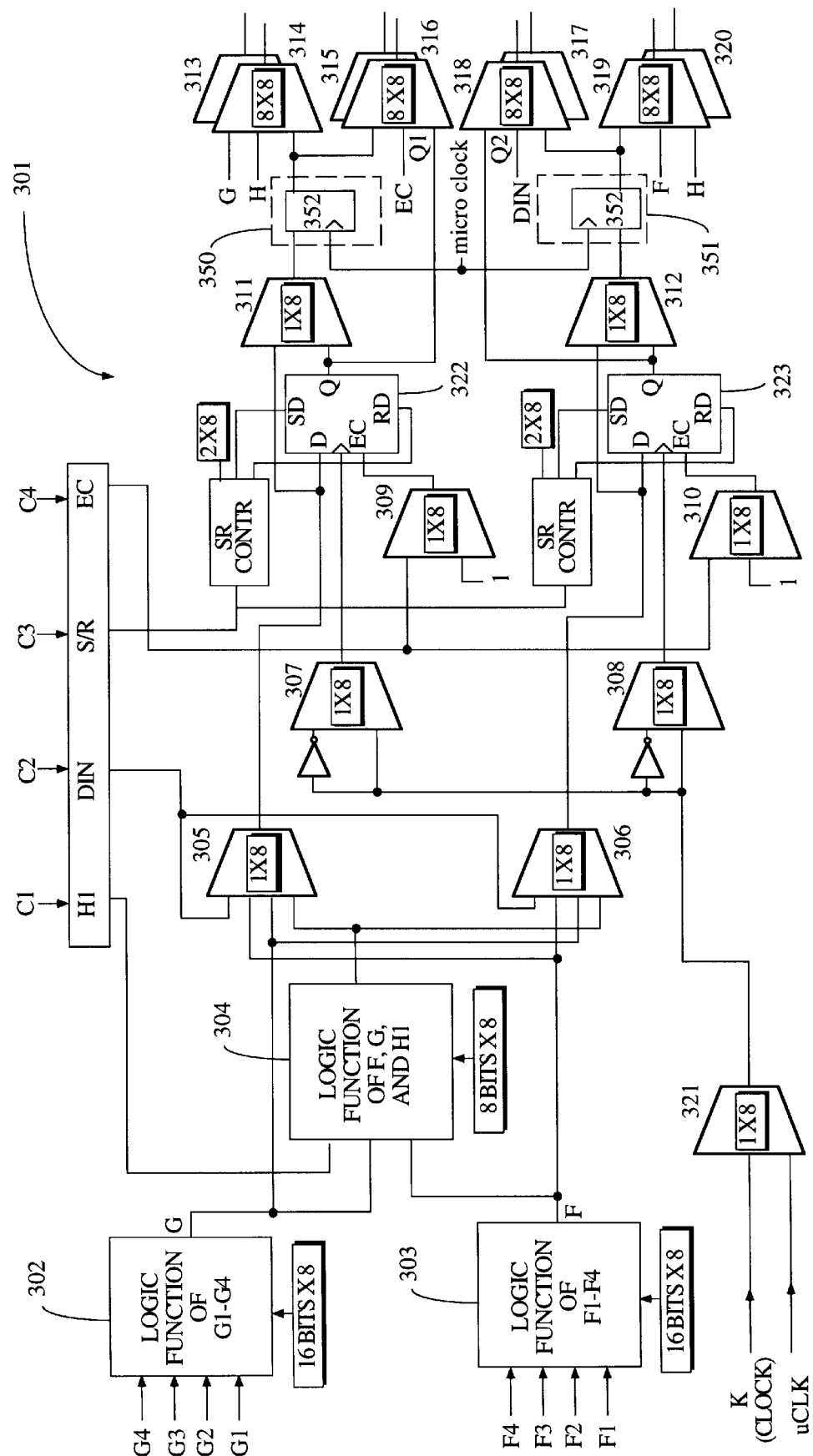
FIG. 10B shows another CLB with a storage device having a fixed delay in accordance with one embodiment of the present invention.

In another embodiment shown in FIG. 10B, each bypass 350 and 351 includes a shift register 352. In this manner, if a signal is stored in bypass 350, for example, the signal is not delayed one micro cycle, but instead a number of micro cycles. This delay saves rerouting the signal every micro cycle, thereby saving interconnect resources.

A bypass can be shared, putting a different signal into the shift register each micro cycle, and pulling out the resulting values after the register delay. The Scheduler only assigns signals with the same delay to the same bypass.

The Scheduler makes logic delays of the same length to maximize the utility of the shift-register bypasses.

The delay in the shift register is alternatively:

1. Fixed in the architecture. In this embodiment, the FPGA is prebuilt with a variety of bypass delays, wherein each bypass has a fixed delay. Because not all delays need to be the same, there may be long and short shift registers 352. The proper distribution of shift register lengths is determined from an analysis of required minimum register storage times in circuit designs.

2. Fixed at configuration time. In this embodiment, the bypass contains a length register that selects which bit is the output signal. The Scheduler program selects bypass lengths for the design at hand.

3. Selectable at each micro cycle. In this embodiment, at each micro cycle, one can select which bit comes out. The Scheduler must not schedule two bits in the same bypass if those bits are needed in the same micro cycle.

4. Determined by a combination of embodiments 1–3.

The length of the shift register bypass may be longer than the number of micro cycles in the chip. In one embodiment, two bypasses may be cascaded to build longer delays.

In another embodiment, some bits of a micro register may be omitted from the architecture. The reduced micro register may be coupled with a bypass for those micro cycles in which the CLB has no micro register bit. In other words, wherein most CLBs include micro registers that store the output signals from all micro cycles, some CLBs may be built to only save the output signals from the first few micro cycles. These CLBs must pass signals to the next micro cycle with the bypass in the other micro cycle.

9.4 Alternatives for Deeper Logic

Figure 55:
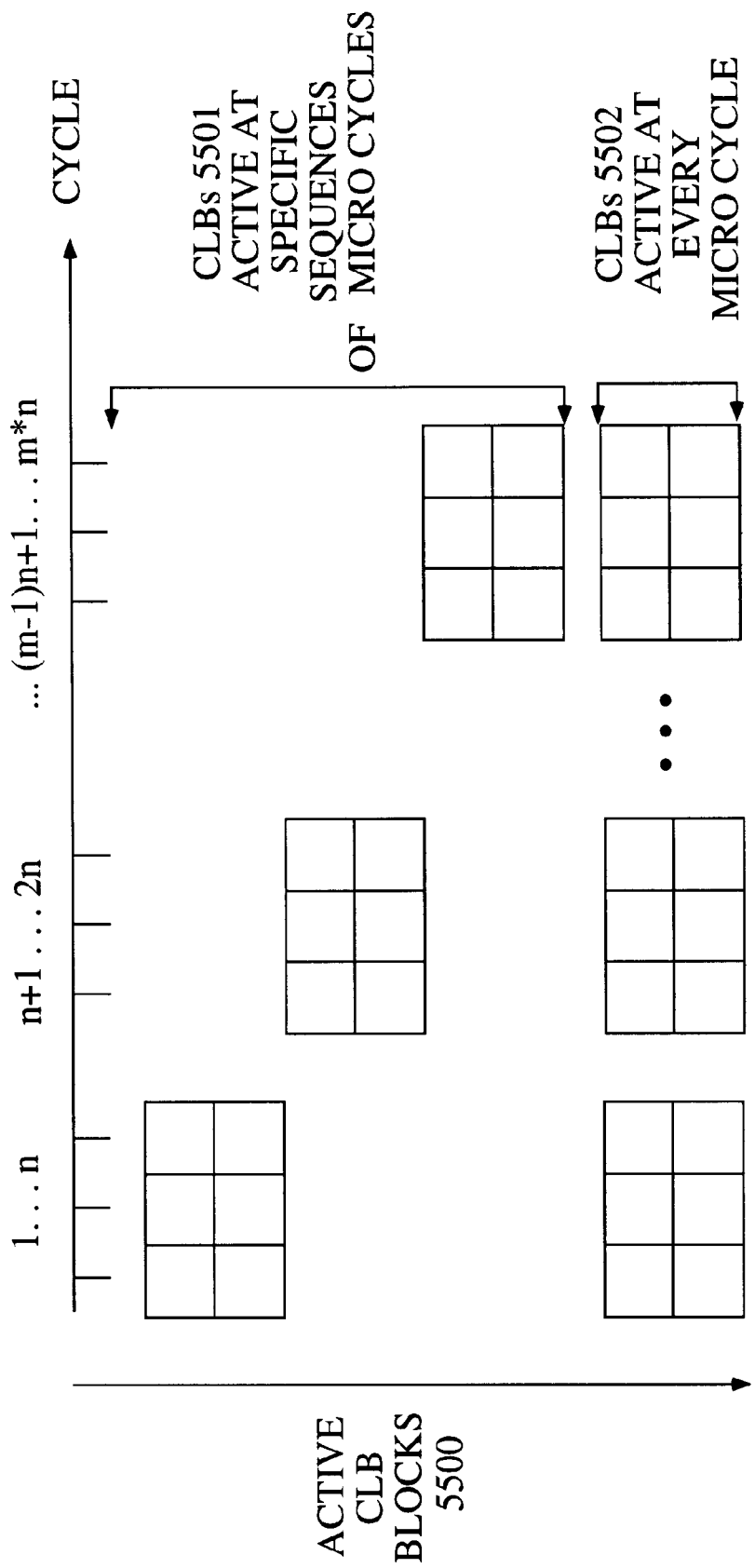
FIG. 55 shows a time multiplexed PLD with expandable logic depth.

Alternatively, the CLB array is partitioned into m blocks, wherein the CLBs in each block are active in one of m sequences of micro cycles in the logic engine mode. Partial results are passed from one block to the next. In this case, the maximum logic depth is m*n. With scheduling and partitioning, the logic can be very efficiently packed because only the portion of logic with a level deeper than n needs to be separately partitioned; the rest of the logic will still be running at every sequence of micro cycles. For example, referring to FIG. 55, which illustrates an array 5500 of active CLBs, CLBs 5501 are only active during specific sequences of micro cycles, whereas CLBs 5502 are active during every sequence of micro cycles (See also 8.2a Synchronous/Asynchronous Clocking).

An extension of this technique is to adjust the micro cycle sequencer to allow more micro cycles than the number of configuration slices in the FPGA. In this embodiment, the sequencer is set to cycle through one micro cycle per level of the logic, using the low-order bits of the micro cycle number to select the configuration. This embodiment is in conjunction with a partial partition of the CLB array for the paths where the depth of logic is greater than the number of configurations in the FPGA. The longer address counter allows the FPGA to sequence any number of configurations rather than a simple multiple of the number of configurations in the chip.

9.5 Per-CLB Memory Access Configuration Bit

Figure 61:
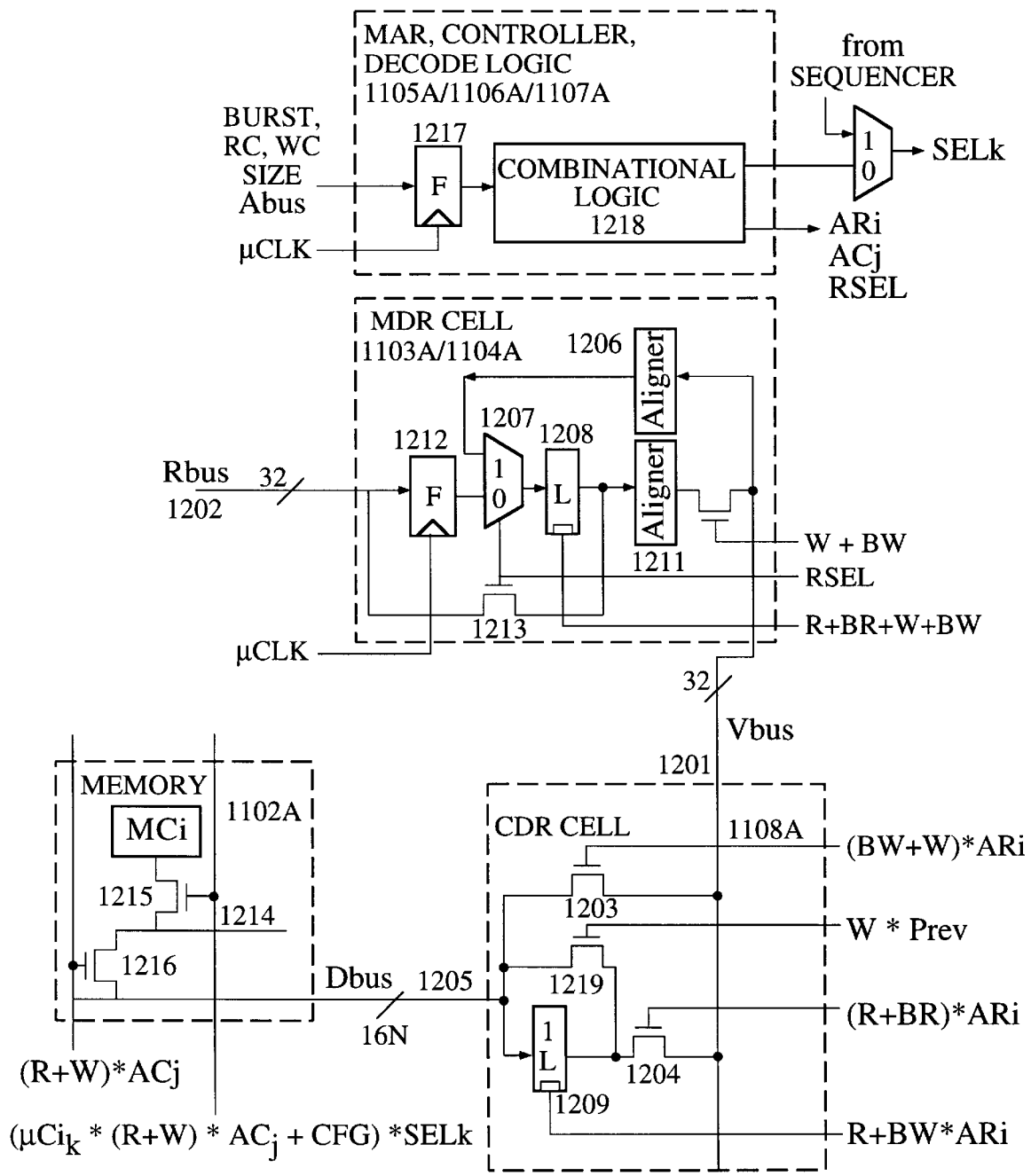
FIG. 61 shows an embodiment of the present invention in which an additional register limits access to the memory during a memory access cycle.

In accordance with one embodiment of the present invention, an additional register limits access to the memory during a memory access cycle. This register selectively turns off memory access for those CLBs not affected by the memory cycle, thereby reducing power consumption for each memory cycle. Furthermore, in addition to saving power, this register allows access to subsets of the memory by selectively disabling access to the memory. For example, referring to FIG. 61, signal MCik is from a memory cell (not shown) which controls access to the memory in a manner similar to register 720 (FIG. 7B). Thus, this signal determines whether or not the designated memory cell is selected for reading. Therefore, if signal MCik is logic "0" in this embodiment, the memory cells in CLBk are not read or written, thereby saving power.

9.6 Micro Register Selector Options

Figure 56A:
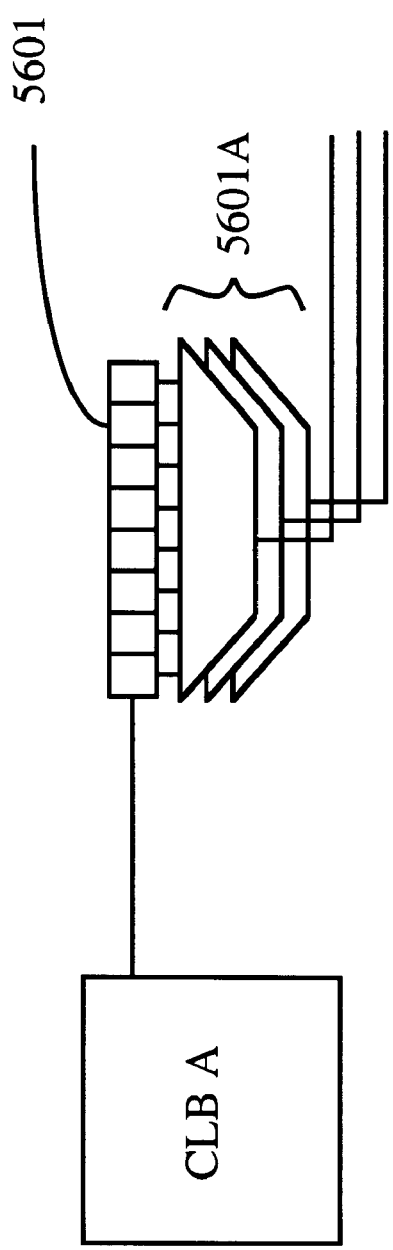
FIGS. 56A and 56B illustrate two CLBs having their own output micro register and multiplexers.
Figure 56B:
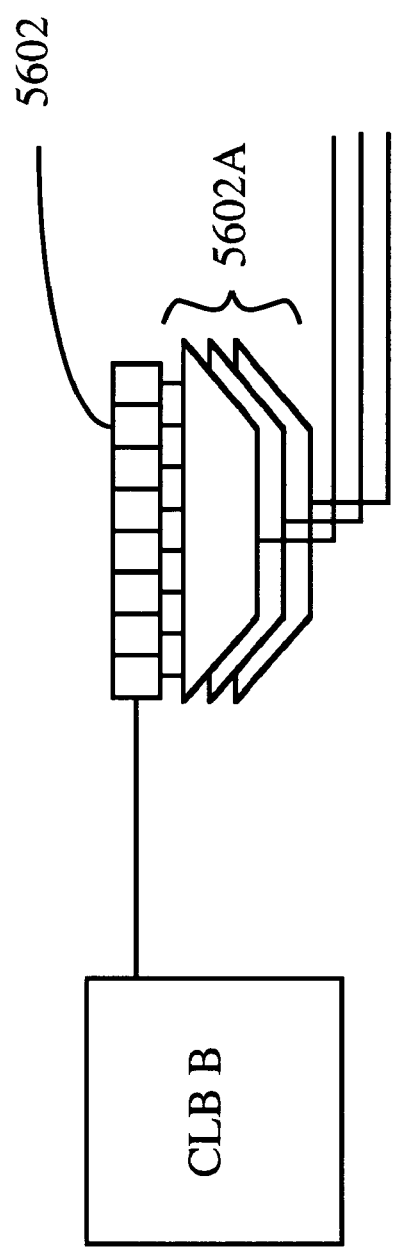

In accordance with the present invention, the number of the selectors (previously referenced as multiplexers for simplicity) on the micro registers is minimized to conserve chip area. In accordance with one embodiment, there are two elements to the selector: the multiplexer and the buffer. Sharing multiplexers on adjacent registers lowers the peak usage of the selectors. FIGS. 56A and 56B show micro registers (in this example, 8-bit registers) 5601 and 5602 and associated selectors (i.e. three output multiplexers) 5601A and 5602A, respectively.

Figure 57:
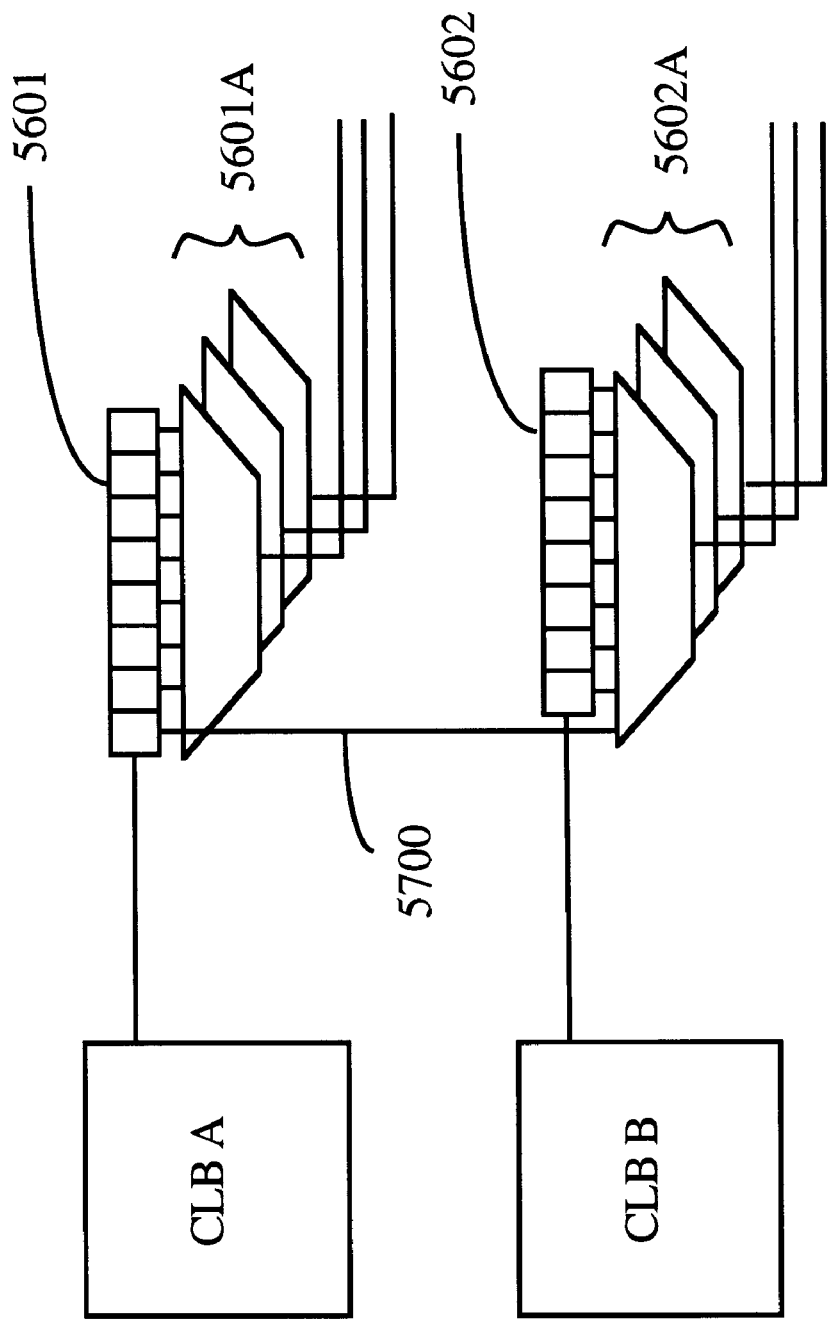
FIG. 57 shows two CLBs sharing multiplexers.

In FIG. 57, an additional connection 5700 is provided from micro register 5601 (which receives signals from CLB A) to multiplexer selector 5602A (which receives signals from CLB B). In this manner, if CLB B does not need all the multiplexers in a configuration, and CLB A needs an extra one, CLB A can use the shared multiplexer. Note that not all bits in register 5601 need be shared on every configuration. In fact, different bits may be shared on different selectors.

Figure 58:
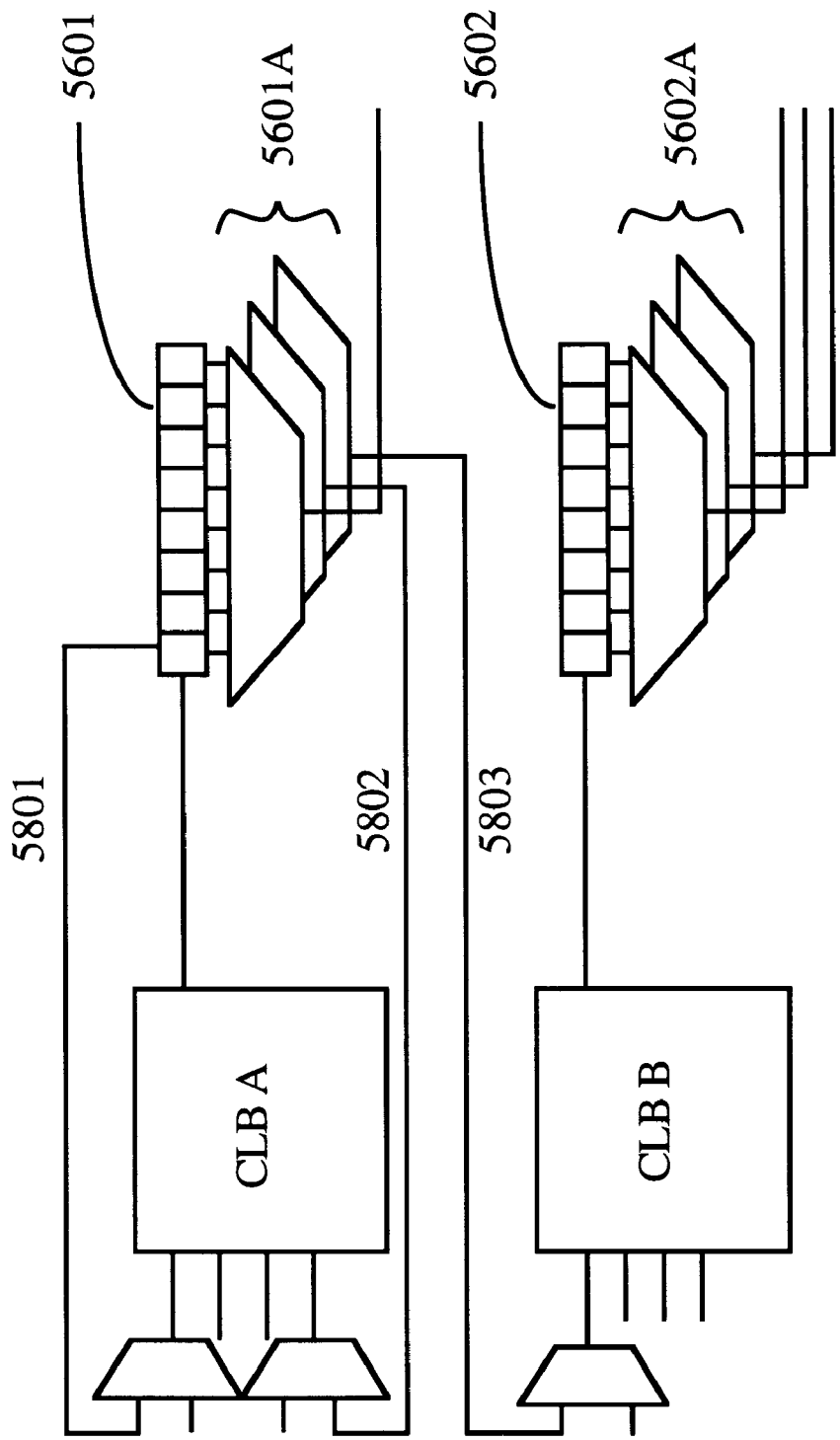
FIG. 58 illustrates two CLBs sharing multiplexers and having feedback paths.

The circuit of FIG. 58 eliminates some of the buffers (on the output lines of FIG. 4) normally associated with multiplexers 5601A and 5602A. For example, if some signals are used in the next configuration by CLB A, multiplexers 5601A are bypassed entirely by using path 5801. If the signals from multiplexers 5601A are to be placed in CLB A, the signals are provided on feedback path 5802. Moreover, if the signals from multiplexers 5601A are to be placed in adjacent CLB B, the signals are provided on a direct-connect path 5803.

9.7 Low Power Interconnect Circuitry

In accordance with the present invention, signal voltage swings are limited, thereby increasing speed and significantly reducing power in the interconnect circuitry of a PLD. FIG. 59 illustrates a portion of PLD 5900 which includes source configurable logic block (CLB) output circuitry 5901, destination CLB input circuitry 5903, and interconnect structure 5902. The output line 5901A of source CLB output circuitry 5901 is coupled to the input line 5903A of destination CLB input circuitry 5903 via interconnect structure 5902.

Interconnect structure 5902 is effectively an RC network implemented by n-channel transistors 5908A–5908N. Specifically, each transistor 5908A–5908N provides an associated resistance Q, whereas each transistor 5908A–5908N and associated line segment 5910A–5910N, respectively, provide a capacitance 5909A–5909N (shown as capacitors).

As is well known to those in the art, the capacitance of any transistor 5908 is increased by increasing the area of its channel region. Thus, lowering resistance Q by increasing the width of any transistor 5908 has diminishing effect because the associated capacitance 5909 also increases.

In accordance with the present invention, limiting the source/drain voltage of transistors 5908A–5908N while keeping a high voltage on the gates of these transistors effectively decreases resistance Q without increasing capacitance 5909, thereby improving the speed of the signal transfer through interconnect structure 5902 and significantly reducing power consumption in CLA 5900. Thus, in accordance with the present invention, source CLB output circuitry 5901 includes a conventional inverter 5904 with a low voltage trigger point and two n-channel transistors.

A logic zero signal provided to source CLB output circuitry 5901 is provided to the gate of transistor 5906, thereby turning off that transistor. The logic zero signal is inverted by inverter 5904, thereby providing a high signal to transistor 5905 that fully turns on that transistor. Transistor 5905, in its on state, transfers approximately 2.0 volts to interconnect line 5901A.

On the other hand, a logic one signal provided to source CLB output circuitry 5901 turns off transistor 5905 and turns on transistor 5906, thereby pulling the voltage on interconnect line 5901A to ground. In this manner, source CLB output circuitry 5901 provides a high gate voltage drive (via inverter 5904) while ensuring a maximum of 2 volts to interconnect structure 5902 (via transistors 5905 and 5906). Limiting the voltage swing on output line 5901A to 2 volts rather than approximately 3.6 volts dramatically reduces the power requirement of interconnect structure 5902 (explained below in reference to Equation 1).

Inverters 5907A–5907N invert the control signals which are in turn provided to the gates of pass transistors 5908A–5908N, respectively. Assuming inverters 5907A–5907N receive logic low signals, transistors 5908A–5908N turn on, thereby transferring the signal on output line 5901A to input line 5903A.

Destination CLB input circuitry 5903 must be able to handle a low one level (i.e. 2 volts) in, and provide a high one level (i.e. 5 volts) out, with low power at a noise margin of approximately 0.8 volts. Typically, a high threshold is used on the p-channel device(s) of circuitry 5903 in the 1.6 volt range in those gates driven by a signal which is one 0.8 volt threshold down from Vcc. For circuitry 5903, the input "one" level is about 3 volts below Vcc. In one embodiment, shown in FIG. 60, three stages bring the "one" level up to Vcc, with each stage bringing it up one volt. The gate to source voltage (Vgs) of the native p-channel device of each stage, when p device 6001 is off, is 0.6 volts below the threshold voltage of 1.6 volts, thereby providing good margin. Note that the intermediate state supplies of 3 and 4 volts can be obtained with n device diodes which are well know in the art and therefore not explained in detail herein.

As is well known in the art, power consumption in a CMOS circuit is equivalent to:

$$P = \frac{CL \times V1 \times V2 \times f}{2} \quad \text{(Eq. 1)}$$

wherein CL is the capacitive load on the output, V1 is the supply voltage, V2 is the voltage swing of interconnect structure 5902, and f is the operating frequency. Assuming that the capacitive load CL, the number of transitions per second f, and the supply voltage V1 remain constant between applications, the present invention significantly reduces power consumption in PLD 5900. Specifically, by providing a signal level of 2 volts instead of a 3.6 volt signal level the present invention reduces power consumption by 44% since voltage V1 does not change, only voltage V2.

9.8 Multiple Access For Configuration

Because memory access is much faster than interconnect and LUT access, the memory can be pipelined, i.e., reading a plurality of configuration words during each micro cycle. Assuming the micro registers are coupled to the CLB output lines (see, for example, FIG. 3), a micro cycle in the logic engine mode includes the following steps (typical associated times are in parentheses following each step).

1. Read a configuration word and update the pipeline latch value (5 ns).
2. Propagate signals through the interconnect to logic input lines (15 ns).
3. Propagate signals through the LUTs to pipeline the latch inputs (5 ns).

The LUT configuration is not needed until the signals have reached their respective LUT input lines (in the above example, 15 ns after the interconnect becomes valid). Therefore, the LUT configuration may be read from memory after the interconnect configuration. In fact, there is time to cycle the memory a second time for the LUT configuration.

Figure 62:
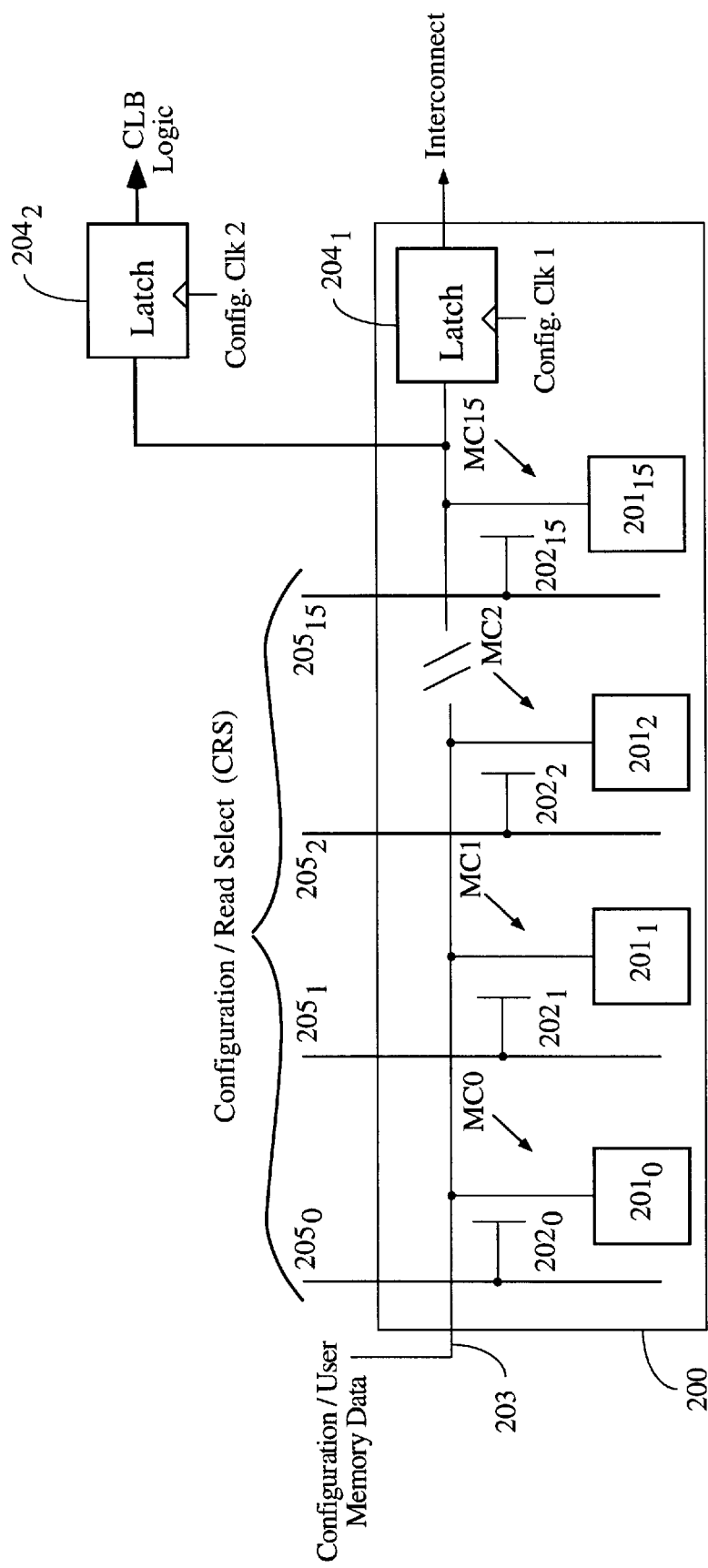
FIG. 62 illustrates an embodiment of the present invention in which the configuration data is read in two memory accesses.

Thus, instead of putting eight bits "behind" (supporting) every prior art configuration memory cell, in one embodiment shown in FIG. 62, 16 bits (i.e. bits stored in memory cells MC1–MC15) are provided for each pair of prior art configuration memory cells (i.e. one for interconnect and another for logic). In this embodiment, the configuration data is read in two memory accesses, thereby gaining the advantage of memory efficiency due to greater depth. Although a bit line 203 is shared in this embodiment, an additional latch 204 is provided for each memory access, each latch 204 having a separate clock line. Therefore, latch $204_1$, (which provides signals to the interconnect) and latch $204_2$ (which provides signals to the CLB logic) are driven by configuration clocks 1 and 2, respectively. Unlike the above-described process in which subsequent micro cycles are overlapped, in this embodiment multiple memory accesses are required to configure the FPGA.

9.9 Pipelining Features

After flash re-configuration of the FPGA in the logic engine mode, the FPGA calculations are performed in a conventional manner. Typically, these calculations take more time than memory access. Therefore, after the initial configuration data is read, the configuration memory is idle for a period of time.

If the configuration data is latched as described above, in reference to FIG. 2, a memory operation may be "inserted" into the memory idle time in the same micro cycle as the configuration while logic and interconnect are evaluated, thereby effectively pipelining the memory access. The timing of user memory access, configuration, user logic, and interconnect is shown in Table B.

TABLE B

| TIME | T0 | T1 | T2 | T3 | T4 |
|---|---|---|---|---|---|
| (Memory) (Logic & Interconnect) | C0 | C1 LIP0 | M0/C2 LIP1 | M1/C3 LIP2 | M2/C4 LIP3 | wherein C is Configuration Access, LIP is Logic Interconnect Propagation, and M is Memory Access.

Configuration C0 is read from configuration memory at time T0. At time T1, the configuration is latched to control logic and interconnect in the FPGA (LIP0), including generating a READ memory operation. The memory access (M0) is done in time T2, with the data available as a CLB input signal at time T3. After memory access, the memory is cycled again to retain the configuration information for the next micro cycle. Although configuration C1 cannot use the results of the memory access by configuration C0, configuration C1 generates the next memory address. Thus, after a latency period of one cycle (for configuration C1), the memory transfers flow at the rate of one transfer per cycle.

Although memory access (M) and configuration access (C) for a single configuration cannot occur at the same time T, the duration of a time (T) is usually determined by the logic interconnect propagation (LIP) step. Therefore, the memory (M) can be cycled multiple times while the logic of a configuration is evaluated. In fact, depending on the duration of the FPGA calculation, several memory cycles (such as a read followed by a write) may be inserted without increasing the duration of the micro cycles. In other embodiments of the present invention, pipelining schedules with less latency are provided.

TABLE C

| TIME | T0 | T1 | T2 | T3 | T4 |
|---|---|---|---|---|---|
| (Memory) | C0 | M0/C1 | M1/C2 | M2/C3 | M3/C4 |
| (Logic & Interconnect) | | LIP0 | LIP1 | LIP2 | LIP3 |

In Table C, the address for M0 is calculated in conjunction with LIP0. The memory access is delayed until the calculation of the address is complete, which may be less than the total LIP delay. The result of the memory operation M0 may be available within time T1 if M0 is short enough or if T1 is long enough.

Because the memory access occurs after the FPGA configuration, memory is accessible in the same cycle that the address is calculated assuming the address calculation is fast enough. Such fast calculations include:

1. An address calculation provided in the configuration data (i.e., immediate).
2. If the address values reach the address registers well in advance of the latest arriving signal (i.e., quick route path). In the latter calculation, memory is accessible in the later part of the FPGA cycle in which the addresses are generated. In one embodiment, the reconfiguration is delayed until results are returned from a memory operation. The amount of delay can be determined from the worst-case address generation delay plus memory access delay.

9.10 Incorporation of ROM Cells

In the above-described embodiments, all memory slices comprise RAM cells. In other embodiments, additional memory slices include ROM cells which occupy sites on local bus 203 (FIG. 2), use the same latch 204 as the RAM cells, and have their own control lines 205. ROM cells are much smaller than RAM cells, but have less flexibility. Therefore, the decrease in flexibility of using ROM cells compared to RAM cells is counterbalanced with the lower cost associated with the ROM cells. In those embodiments, ROM cells are used for functions such as self test to assist the end-user in testing the product, or to provide certain fixed functions such as direct memory access or particular bus interfaces (for example, PCI).

The end-user invokes these functions by jumping to the slice containing the function. The self test function capability is simpler to provide than the fixed function capability because the self test is typically independent of any user configuration. In contrast, the fixed function capability is more restrictive because a provision must be made to pass parameters between the calling end-user slice and the ROM slice. Parameter passing could be via a fixed subset of a RAM slice set up as user memory. The parameters passed, and even parameter area in memory, would be function-specific such as starting addresses, return plane address, etc.

The fixed functions typically vary for different products. In accordance with the present invention, new products are then developed by merely changing the mask layer that defines the ROM technology. Alternatively, the ROM can be implemented in one-time-programmable devices such as antifuses. In one embodiment, the mixed ROM and RAM device is used as a hybrid part between two existing industry standard parts, i.e. a RAM-based FPGA and its hardwired equivalent (for example, the Xilinx HardWire™ devices). In this manner, a customer pays the fixed costs of customer specific ROM masks to gain the unit cost advantage of the ROM density, while still having some slices available for variable configuration and user memory.

This disclosure is illustrative and not limiting. Further modifications will be apparent to one skilled in the art, and are intended to fall within the scope of the appended claims.

We claim:

1. A programmable logic device that is programmable in a plurality of configurations, the programmable logic device comprising:

a plurality of micro-registers, each micro-register being configured to simultaneously store a plurality of intermediate state values associated with different configurations of the programmable logic device;

a plurality of output selectors, each of the output selectors being configured to receive the intermediate state values from a corresponding micro-register; and a plurality of storage elements, each of the storage elements being configured to provide read select signals to a corresponding output selector, wherein the read select signals are selectable independent of the configuration of the programmable logic device, whereby the intermediate state values stored in a micro-register can be used in any of the configurations.

2. A programmable logic device that is programmable in a plurality of configurations, the programmable logic device comprising:

a plurality of micro-registers, each micro-register being configured to simultaneously store a plurality of intermediate state values associated with different configurations of the programmable logic device; and a memory controller configured to provide write select signals to the micro-registers, wherein intermediate state values associated with a current configuration are loaded into the micro-registers in response to the write select signals, the memory controller being configured to provide the write select signals prior to each change of configuration.

3. A programmable logic device that is programmable in a plurality of configurations, the programmable logic device comprising:

a plurality of micro-registers, each micro-register being configured to simultaneously store a plurality of intermediate logic states associated with different configurations of the programmable logic device;

a plurality of output selectors, each of the output selectors being configured to selectively route intermediate logic states from a corresponding micro-register; and a plurality of pipeline latches, each of the pipeline latches being configured to store intermediate logic states routed by a corresponding output selector.

4. A programmable logic device comprising:

a configurable logic block having a sequential logic element;

an interconnect structure for interconnecting said configurable logic block;

a plurality of programmable logic elements for configuring said configurable logic block and said interconnect structure;

a storage device configured to simultaneously store a plurality of intermediate logic states associated with different configurations of said configurable logic block;

a latch coupled to an input terminal of the storage device; and a selector element having input terminals coupled to the sequential logic element and the storage device, and an output terminal coupled to the latch.

5. A programmable logic device comprising:

a configurable logic block;

an interconnect structure for interconnecting said configurable logic block;

a plurality of programmable logic elements for configuring said configurable logic block and said interconnect structure;

a storage device for storing a plurality of intermediate logic states of said configurable logic block;

a latch coupled to an input terminal of the storage device; and a multiplexer which is programmable to couple an output terminal of the storage device to an input terminal of the latch, thereby re-circulating contents of the storage device.

6. The programmable logic device of claim 5, wherein the multiplexer is programmable to isolate the output terminal of the storage device from the input terminal of the latch, thereby preventing re-circulating contents of the storage device during a static mode.

7. The programmable logic device of claim 5, wherein the multiplexer is further programmable to couple an input terminal or an output terminal of the sequential logic element to the input terminal of the latch.

8. The programmable logic device of claim 5, further including a sequential logic element, wherein the multiplexer is further programmable to couple an initial value of the sequential logic element to the input terminal of the latch.

9. A programmable logic device comprising:

a configurable logic block;

an interconnect structure for interconnecting said configurable logic block;

a plurality of programmable logic elements for configuring said configurable logic block and said interconnect structure; and a storage device configured to simultaneously store a plurality of intermediate logic states associated with different configurations of said configurable logic block, wherein the storage device is located in the interconnect structure.

10. A programmable logic device comprising:

a configurable logic block;

an interconnect structure for interconnecting said configurable logic block;

a plurality of programmable logic elements for configuring said configurable logic block and said interconnect structure; and a storage device configured to simultaneously store a plurality of intermediate logic states associated with different configurations of said configurable logic block, wherein the storage device is located in a location independent of the configurable logic block.

11. A method of operating a programmable logic device comprising a plurality of programmable logic elements for configuring said programmable logic device, the method comprising the steps of:

providing a plurality of sets of N memory cells, wherein each set of N memory cells is associated with one of said programmable logic elements, and wherein the sets of memory cells form N memory slices, each of the N memory slices including one memory cell from each set of N memory cells;

storing configuration data in at least one of the N memory slices prior to configuring the programmable logic device;

configuring the programmable logic device in response to the configuration data; and then storing user data in all of the N memory slices.

12. A method of operating a programmable logic device comprising a plurality of programmable logic elements for configuring said programmable logic device, the method comprising the steps of:

providing a plurality of sets of N memory cells, wherein each set of N memory cells is associated with one of said programmable logic elements, and wherein the sets of memory cells form N memory slices, each of the N memory slices including one memory cell from each set of N memory cells; and storing configuration data and user data in the N memory slices, wherein each memory slice contains only configuration data or only user data.

13. A programmable logic device comprising:

a plurality of programming points for controlling the configuration of the programmable logic device;

a plurality of memory bit sets, wherein each memory bit set is coupled to a corresponding one of the programming points, each memory bit set having a plurality of configuration memory cells; and a select circuit coupled between each memory bit set and corresponding programming point, wherein each select circuit is controlled to couple one of the configuration memory cells to a programming point, and wherein the configuration memory cells in at least one of the memory bit sets store the same configuration data value, thereby configuring the associated programming point in a static mode.

14. A programmable logic device comprising:

a plurality of programmable logic elements for configuring said programmable logic device;

a plurality of sets of N memory cells, wherein each set of N memory cells is associated with one of said programmable logic elements, and wherein the sets of memory cells form N memory slices, each of the N memory slices including one memory cell from each set of N memory cells; and means for burst accessing the N memory slices.

15. The programmable logic device of claim 14, wherein the means for burst accessing perform a burst read access of the memory slices.

16. The programmable logic device of claim 14, wherein the means for burst accessing perform a burst write access of the memory slices.

17. A programmable logic device comprising:

a first sequencer for managing a sequence of configurations of a first part of the programmable logic device; and a second sequencer for managing a sequence of configurations of a second part of the programmable logic device.

18. The programmable logic device of claim 17, wherein the first and second sequencers operate in lock step.

19. The programmable logic device of claim 17, wherein the first and second sequencers operate independently.

20. A method of configuring a programmable logic device from a configuration memory comprising the steps of:

configuring the programmable logic device in a first configuration using a first set of configuration data stored in a slice of the configuration memory;

detecting an interrupt signal while the programmable logic device is configured in the first configuration; and configuring the programmable logic device in a second configuration using a second set of configuration data stored in a slice of the configuration memory, wherein the programmable logic is configured in the second configuration in response to the interrupt signal.

21. The method of claim 20, wherein the interrupt signal is generated by the programmable logic device.

22. The method of claim 20, wherein the interrupt signal is generated external to the programmable logic device.

23. The method of claim 20, wherein the interrupt signal is generated a pre-determined number of cycles after the programmable logic device is configured in the first configuration.

24. A method of operating a programmable logic device comprising the steps of:

configuring the programmable logic device in a first configuration;

generating one or more internal signals with the programmable logic device in the first configuration;

and then configuring the programmable logic device in a second configuration or a third configuration, wherein the second or third configuration is selected in response to the one or more internal signals.

25. A method of operating a programmable logic device comprising the steps of:

providing a plurality of memory slices on the programmable logic device, wherein each of the memory slices is programmable to store a set of configuration data values for configuring said programmable logic device; and sequentially accessing only a subset of the memory slices to configure said programmable logic device.

26. A method of operating a programmable logic device comprising the steps of:

providing a plurality N of memory slices, wherein each of the memory slices is programmable to store a set of configuration data values for configuring said programmable logic device;

providing a plurality M of storage devices for storing a plurality of intermediate states of the programmable logic device, wherein M is greater than N;

sequentially configuring the programmable logic device in a number of configurations greater than N and less than or equal to M, wherein intermediate states associated with the configurations are stored in the storage devices.

27. The method of claim 26, further comprising the steps of:

loading X of the memory slices with configuration data, wherein X is less than or equal to N;

configuring the programmable logic device in X configurations in response to the configuration data stored by the X memory slices;

storing X sets of intermediate states associated with the X configurations in the storage devices;

loading Y of the memory slices with configuration data, wherein X is less than or equal to N, and wherein X plus Y is greater than N and less than or equal to M;

configuring the programmable logic device in Y configurations in response to the configuration data stored by the Y memory slices; and storing Y sets of intermediate states associated with the Y configurations in the storage device, wherein the X and Y sets of intermediate states are simultaneously stored in the storage device.

28. A method of operating a programmable logic device comprising the steps of:

storing a plurality of slices of configuration data in a configuration memory on the programmable logic device, wherein each slice of configuration data provides a configuration for the programmable logic device; and sequentially configuring the programmable logic device in an iterative manner using a subset of the slices of configuration data.

29. The method of claim 28, wherein the step of sequentially configuring the programmable logic device in an iterative manner is performed for a fixed number of cycles.

30. The method of claim 28, wherein the step of sequentially configuring the programmable logic device in an iterative manner is performed until a pre-determined condition is met.

31. A method of operating a programmable logic device in a logic engine mode, the method comprising the steps of:

configuring the programmable logic device in a first configuration by reading configuration data values from a first memory slice;

performing logic operations with the programmable logic device in the first configuration;

configuring the programmable logic device in a second configuration by reading configuration data values from a second memory slice; and pipelining the read access time for the second memory slice such that the configuration data values from the second memory slice are read in parallel with the logic operations of the programmable logic device in the first configuration.

32. The method of claim 31, further comprising the step of accessing a third memory slice while the programmable logic device is performing logic operations in the first configuration.

33. The method of claim 32, wherein the third memory slice contains user data.

34. The method of claim 33, wherein the third memory slice contains configuration data.

35. The method of claim 32, wherein the step of accessing the third memory slice further comprises the step of reading data from the third memory slice.

36. The method of claim 32, wherein the step of accessing the third memory slice further comprises the step of writing data to the third memory slice.

37. The method of claim 32, further comprising the step of accessing a fourth memory slice while the programmable logic device is performing logic operations in the first configuration.

38. A programmable logic device comprising:
a first programming point for controlling the configuration of an interconnect of the programmable logic device;
a second programming point for controlling the configuration of a logic of the programmable logic device;
a first latch having an output terminal coupled to the first programming point, an input terminal coupled to a bit line, and a clock terminal coupled to receive a first clock signal;
a second latch having an output terminal coupled to the second programming point, an input terminal coupled to the bit line, and a clock terminal coupled to receive a second clock signal;
a first plurality of configuration memory cells coupled to the bit line and storing configuration data values for controlling the configuration of the interconnect;
a second plurality of configuration memory cells coupled to the bit line and storing configuration data values for controlling the configuration of the logic;
a first select circuit coupled between the bit line and the first plurality of configuration memory cells, wherein the first select circuit is controlled to couple one of the first plurality of configuration memory cells to the first latch during a first memory cycle; and
a second select circuit coupled between the bit line and the second plurality of configuration memory cells,
wherein the second select circuit is controlled to couple one of the second plurality of configuration memory cells to the second latch during a second memory cycle.

39. A method of configuring a programmable logic device comprising the steps of:
providing a first set of configuration memory cells for storing a first plurality of configuration data values for configuring an interconnect of the programmable logic device;
providing a second set of configuration memory cells for storing a second plurality of configuration data values for configuring an interconnect of the programmable logic device;
selectively coupling one of the configuration memory cells in the first set to a bit line during a first memory cycle;
latching a configuration data value from the bit line during the first memory cycle and providing this configuration data value to a first programming point to configure the interconnect of the programmable logic device;
selectively coupling one of the configuration memory cells in the second set to the bit line during a second memory cycle; and
latching a configuration data value from the bit line during the second memory cycle and providing this configuration data value to a second programming point to configure the logic of the programmable logic device.

40. A low voltage interconnect structure for an integrated circuit that operates in response to a supply voltage, the interconnect structure comprising:
an output circuit providing an output signal that swings between zero volts and a first voltage that is greater than zero volts and less than the supply voltage;
an interconnect circuit coupled to receive the output signal, the interconnect circuit comprising at least one turned on pass transistor; and
a destination circuit coupled to receive the output signal from the interconnect circuit.

41. The low voltage interconnect structure of claim 40, wherein the destination circuit comprises:
a first inverter circuit coupled to receive the output signal from the interconnect circuit, the first inverter circuit providing an output voltage that swings between zero volts and a second voltage that is greater than the first voltage and less than the supply voltage; and
a second inverter circuit coupled to the first inverter circuit, wherein the second inverter circuit provides an output voltage that swings between zero volts and the supply voltage.

42. A method for coupling an output circuit to a destination circuit on an integrated circuit, the method comprising the steps of:
providing an output signal with the output circuit that swings between zero volts and a first voltage that is greater than zero volts and less than the supply voltage;
routing the output signal through an interconnect circuit that comprises at least one turned on pass transistor; and
receiving the output signal with the destination circuit.

43. The method of claim 42, wherein the step of receiving the output signal comprises the step of receiving the output signal with a plurality of series-connected inverters, each inverter increasing the voltage of the output signal if the output signal has a logic high value.

44. The method of claim 43, wherein the inverters provide an output voltage equal to the supply voltage if the output signal has a logic high value.

45. A method of operating a programmable logic device, the method comprising the steps of:
configuring the programmable logic device into a plurality of sub-networks; and
operating at least two of the sub-networks in response to asynchronous clock signals.

46. The method of claim 44, wherein at least two of the sub-networks overlap.

47. The method of claim 46, further comprising the step of re-timing the input signals to a block in a first sub-network if the input signals do not all derive from the same clock signal.

48. The method of claim 47, wherein the re-timing is implemented by one or more flip-flops.

49. The method of claim 45, wherein the sub-networks are controlled by processes that are triggered by the asynchronous clock signals.

50. The method of claim 45, further comprising the steps of:
evaluating a first sub-network;
receiving a triggering signal for a second sub-network; and
placing the second sub-network in a waiting state until evaluation of the first sub-network is complete.

51. The method of claim 50, further comprising the step of implementing process scheduling in response to the asynchronous clock signals.

52. The method of claim 51, further comprising the step of implementing process scheduling in response to a high frequency clock signal generated by a phase locked loop.

53. The method of claim 50, wherein the triggering signal is derived from one or more of the asynchronous clock signals.

54. The method of claim 45, further comprising the steps of:
evaluating a first sub-network;

receiving a triggering signal for a second sub-network;

pre-empting the evaluation of the first sub-network and placing the first sub-network in a waiting state;

evaluating the second sub-network while the first sub-network is in the waiting state; and then completing the evaluation of the first sub-network.

55. The method of claim 45, further comprising the steps of:

storing intermediate states of each sub-network in a plurality of micro-registers; and communicating between a first sub-network and a second sub-network by accessing micro-registers of the second sub-network with the first sub-network.

56. The method of claim 45, further comprising the steps of minimizing the number of sub-networks.

* * * * *